(12) United States Patent
Yamamoto et al.

(10) Patent No.: US 6,424,131 B1
(45) Date of Patent: Jul. 23, 2002

(54) OUTPUT CONTROLLER

(75) Inventors: Yasunori Yamamoto, Hirakata; Shinji Tanaka, Ibaraki; Minoru Miyake, Kyoto, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/762,890

(22) PCT Filed: Jun. 15, 2000

(86) PCT No.: PCT/JP00/03931
§ 371 (c)(1),
(2), (4) Date: Feb. 13, 2001

(87) PCT Pub. No.: WO00/79682
PCT Pub. Date: Dec. 28, 2000

(30) Foreign Application Priority Data

Jun. 18, 1999 (JP) .......................................... 11-172071

(51) Int. Cl.[7] .................................................. G05F 1/40
(52) U.S. Cl. ...................................... 323/282; 323/316
(58) Field of Search ................................ 323/282, 284, 323/351, 285, 273, 312, 316, 277; 327/538, 540

(56) References Cited

U.S. PATENT DOCUMENTS

| | | | | |
|---|---|---|---|---|
| 4,327,320 A | * | 4/1982 | Oguey et al. ................ 323/313 |
| 5,077,595 A | | 12/1991 | Fukunaga | |
| 5,296,735 A | | 3/1994 | Fukunaga | |
| 5,532,918 A | * | 7/1996 | Mayrand et al. ............... 363/89 |
| 5,550,462 A | * | 8/1996 | Nakajima .................... 323/277 |
| 5,786,970 A | * | 7/1998 | Nao et al. .................... 361/18 |
| 5,831,471 A | * | 11/1998 | Nakajima et al. ............ 327/540 |
| 5,894,236 A | * | 4/1999 | Mizoguchi et al. .......... 327/108 |

FOREIGN PATENT DOCUMENTS

| | | |
|---|---|---|
| JP | 01227520 | 9/1989 |
| JP | 03262209 | 11/1991 |
| JP | 04134271 | 5/1992 |
| JP | 04211200 | 8/1992 |
| JP | 05291918 | 11/1993 |
| JP | 08111524 | 4/1996 |

OTHER PUBLICATIONS

WO 96/12346, A Protected Switch, Published Apr. 1996.

* cited by examiner

*Primary Examiner*—Adolf Deneke Berhane
(74) *Attorney, Agent, or Firm*—Pearne & Gordon LLP

(57) ABSTRACT

The object of the present invention is, in a power control device including an auxiliary circuit that is connected in parallel to an output circuit and controls an adjusting current smaller by a substantially constant ratio than an output current, to control the ratio of the output current to the adjusting current at a constant level by controlling the output circuit and the auxiliary circuit so that the potentials of the corresponding terminals agree with each other. As a means for attaining the object, the power control device comprises a bridge of four branches including an output circuit, an auxiliary circuit, a load, and either of a current detector or a current setting circuit. The power control device detects the potential difference between the terminals of the output circuit and the corresponding terminals of the auxiliary circuit and feeds back the potential difference to one of the four branches of the bridge and changes the equivalent impedance of the branch, thereby controlling the bridge to keep the balance.

22 Claims, 27 Drawing Sheets

OUTPUT CONTROLLER

TECHNICAL FIELD

The present invention relates to a power control device utilized in a power semiconductor device.

BACKGROUND ART

An output circuit in a driver of such as motor or actuator, a power source circuit, or the like, includes a circuit breaker for cutting off an output current in order to protect circuit elements from excess current or control the output current so as to avoid exceeding a predetermined value.

FIG. 13 shows one conventional example of the circuit breaker. An output transistor 1 is a transistor for driving a load 3. A register 101 for detecting current is connected in series with the output transistor 1. The potential difference across the resistor 101, namely the voltage drop due to the current flowing through the output transistor 1 (hereinafter referred to as output current) is compared with a reference voltage 102 through a differential amplifier 103. The reference voltage 102 is set to be equal to the voltage drop due to a control target amount of the output current. The comparison result of the differential amplifier 103 is outputted to a control circuit. The control circuit cuts off the output transistor 1 when the output current is larger than the control target amount, that is to say, when the output of the differential amplifier 16 is negative. The output transistor 1 which has been once cut off is held under the cutoff condition by the control circuit. The control circuit allows the output transistor 1 to conduct the current again in the case of receiving a signal indicating the directions to conduct the current from the outside or when the output of the differential amplifier 103 becomes positive after a predetermined time has passed. Thus, the output current avoids substantially exceeding the control target amount.

In the above-described conventional example of FIG. 13, however, the resistor 101 is connected in series with the output transistor 1. Therefore, there is the problem of narrowing the range of the output voltage or spending the wasted power.

FIG. 14 shows another conventional example of the circuit breaker. In the conventional example, the above-described problem with the conventional example is solved as follows.

In the second conventional example, an auxiliary transistor 2 is connected in parallel to the output transistor 1 and the current-detecting resistor 101 is connected in series with the auxiliary transistor 2. The current I2 outputted by the auxiliary transistor 2 (hereinafter referred to as adjusting current) is smaller by a predetermined ratio than the output current I1 outputted by the output transistor 1 applied with the common input. For example, in the case where the output transistor 1 and the auxiliary transistor 2 are monolithically formed such as an integrated circuit or the like, the structure of the auxiliary transistor 2 is substantially the same as the output transistor 1 but the size thereof is smaller than the output transistor 1. In that case, the ratio of the currents outputted by the respective transistors applied with the common input voltage substantially equals to the ratio of the sizes of the transistors.

By utilizing the current-detecting resistor 101, the adjusting current I2 is controlled so as not to exceed the control target value in the same way as the first conventional example. When the voltage drop across the resistor 101 is sufficiently small to be ignorable in comparison with the voltage inputted to the output transistor 1, the current ratio I1/I2 is substantially equal to the size ratio of the transistors. After all, the current I1 is proportional to the current I2, and the proportional coefficient is substantially determined by the size ratio of the transistors and substantially independent of the input voltage, the temperature of the environment and the like. Accordingly, the output current I1 can be controlled so as not to exceed an amount larger than the above-described control target amount by the inverse of the above-described ratio. In the second conventional example, since the resistor 101 is not connected in series with the output transistor 1, the range of the output voltage can be widened in comparison with the first conventional example and, at the same time, the wasted power can be reduced.

When the voltage drop across the resistor 101 is large and not ignorable in comparison with the voltage inputted to the output transistor 1, the voltage between gate and source (hereinafter referred to as gate voltage) of the output transistor 1 is larger than the auxiliary transistor 2 by the voltage drop across the resistor 101. Thus, the ratio I1/I2 of the output current I1 to the adjusting current I2 depends on not only the size ratio of transistors but also either of the voltage between source and drain or the gate voltage, and parameters such as the threshold value of the gate voltage. Accordingly, the relation between the output current I1 and the adjusting current I2 is, in general, non-linear. In particular, the output current I1 tends to increase more largely than the adjusting current I2 beyond the ratio determined by the size ratio of the transistors, and the current ratio I1/I2 in the region of the large gate voltage is several times or more larger than the size ratio of the transistors.

FIG. 16A is a diagram showing a graph representing the changes of the output current I1 and the adjusting current I2 with respect to the gate voltage of the output transistor 1 in the second conventional example. Here, the vertical axis of the figure is normalized in order that the difference from the proportionality may be easily seen. In fact, if the curve corresponding to the output current I1 and the curve corresponding to the adjusting current I2 agree with each other, the relation between the output current I1 and the adjusting current I2 is proportional. As shown in FIG. 16A, in the second conventional example, the output current I1 and the adjusting current I2 do not agree particularly in the region of the large gate voltage. In addition, the difference between the above-described two curves changes greatly owing to a change of the threshold value of the gate voltage caused by the temperature. Since the current ratio I1/I2 changes depending on the gate voltage and the temperature in that manner, the output current I1 varies from a predetermined value even if the adjusting current I2 is controlled so as to be set at a predetermined control target value. Therefore, the second conventional example cannot make the control precision of the output current I1 sufficiently high and secure sufficient reliability.

FIG. 15 shows the third conventional example of the circuit breaker. This conventional example has an output transistor 1 and a parallel-connected auxiliary transistor 2 in the same way as the second conventional example. In the third conventional example, the voltages between drain and source are different from each other between the output transistor 1 and the auxiliary transistor 2 in contrast with the second conventional example, though the gate voltages of the transistors are the same. In the output transistor 1 in particular, the voltage between drain and source tends to reduce remarkably owing to a voltage drop across the load 3.

FIG. 16B is a diagram showing a graph representing the changes of the output current I1 and the adjusting current I2 with respect to the gate voltage in the third conventional example. The vertical axis of FIG. 16B is normalized in the same way as FIG. 16A. As shown in FIG. 16B, in the third conventional example, the output current I1 and the adjusting current I2 do not agree when the gate voltage is raised to a certain level. In particular, the output current I1 shows a change to become saturated together with the increase of the gate voltage. Accordingly, the control precision of the output current I1 cannot be made high sufficiently in the third conventional example similar to the second conventional example since the current ratio I1/I2 changes depending on the gate voltage.

The cause of dependence of the ratio I1/I2 of the output current I1 to the adjusting current I2 on a variety of fluctuation factors is the difference between the gate voltages of the output transistor 1 and the auxiliary transistor 2 in the second conventional example, and the difference between the voltages between drain and source thereof in the third conventional example, respectively. Therefore, the present invention provides a power control device for controlling the potentials of the three terminals (gate, source and drain) of the output transistor 1and the auxiliary transistor 2 so as to equalize the potentials of the corresponding terminals, thereby adjusting the ratio I1/I2 of the output current I1 to the adjusting current I2 to a constant level. Thus, the output control precision is independent of operational conditions, temperature change, or unevenness of the size ratio and the like owing to the varied conditions in the production, thereby improving reliability of the power control device in comparison with the conventional examples.

DISCLOSURE OF INVENTION

A power control device according to the present invention comprises:

a bridge circuit consisting of a first branch, a second branch, a third branch and a fourth branch, wherein
    each of said first to fourth branches includes a first terminal and a second terminal,
    the first terminal of said first branch and the first terminal of said third branch are connected to a first power-source-connecting terminal at a substantially constant potential, the second terminal of said second branch and the second terminal of said fourth branch are connected to a second power-source-connecting terminal at a substantially constant potential,
    the second terminal of said first branch and the first terminal of said second branch are mutually connected at a first node, the second terminal of said third branch and the first terminal of said fourth branch are mutually connected at a second node,
    said second branch includes a load,
    said first branch includes an output circuit for driving said load, and
    said third branch includes an auxiliary circuit for outputting an adjusting current adjusted to an amount smaller substantially by a predetermined ratio than an output current outputted from said output circuit in the case of applying substantially the same input voltage as that of said output circuit;
  a potential difference detector for detecting a potential difference between said first node and said second node; and
  a control circuit for making said output circuit interlock with said auxiliary circuit, controlling said output circuit and cutting off said output circuit and said auxiliary circuit based on said potential difference detected by said potential difference detector.

Thereby, the output circuit and the auxiliary circuit can be cut off by the control circuit based on the potential difference detected by the potential difference detector, for example, when the difference between the voltages inputted to the output circuit and to the auxiliary circuit exceed a predetermined range. Accordingly, the cutoff level with respect to the difference between the above-described input voltages is set at a corresponding level to the state wherein the ratio of the output current to the adjusting current agrees with the limit of a predetermined tolerance range. As a result, if the above-described ratio exceeds the tolerance range, the power control device can cut off the output.

A power control device according to an aspect, other than the above, of the present invention comprises:

a bridge circuit consisting of a first branch, a second branch, a third branch and a fourth branch, wherein
    each of said first to fourth branches includes a first terminal and a second terminal,
    the first terminal of said first branch and the first terminal of said third branch are connected to a first power-source-connecting terminal at a substantially constant potential, the second terminal of said second branch and the second terminal of said fourth branch are connected to a second power-source-connecting terminal at a substantially constant potential,
    the second terminal of said first branch and the first terminal of said second branch are mutually connected at a first node, the second terminal of said third branch and the first terminal of said fourth branch are mutually connected at a second node,
    said second branch includes a load,
    said first branch includes an output circuit for driving said load, and
    said third branch includes an auxiliary circuit for outputting an adjusting current adjusted to an amount smaller substantially by a predetermined ratio than an output current outputted from said output circuit in the case of applying substantially the same input voltage as that of said output circuit;
  a potential difference detector for detecting a potential difference between said first node and said second node;
  a control circuit for making said output circuit interlock with said auxiliary circuit and controlling said output circuit; and
  a current ratio compensator for feeding back said detected potential difference detected by said potential difference detector and controlling the equivalent impedance across said first terminal and said second terminal of one of said first to fourth branches so that said bridge circuit keep the balance, thereby holding said ratio at a substantially constant level.

Thereby, the bridge circuit can keep the balance so that the potential difference detected by the potential difference detector, that is to say, the input voltage to the output circuit and the input voltage to the auxiliary circuit become substantially equal. Accordingly, the ratio of the output current to the adjusting current is substantially constant, that is to say, substantially independent of the applied input voltage and the environmental temperature change. Therefore, the control circuit can control the adjusting current with a high precision through the auxiliary circuit, thereby controlling the output current with a high precision in the same way through the interlocking output circuit with the auxiliary transistor. Here, the current ratio compensator controls the equivalent impedance of one element in the bridge circuit, thereby making the bridge circuit keep the balance. Accordingly, "the current ratio compensator" may be referred to as "equivalent impedance control circuit."

The above-described power control device according to a preferred mode from one aspect has a current detector in said fourth branch for detecting said adjusting current, wherein said control circuit controls said auxiliary circuit based on the detected result of said current detector. When the bridge circuit keeps the balance by the current ratio compensator, the ratio of the output current to the adjusting current is held at a constant level. Accordingly, if the adjusting current is detected with the current detector, the output current can be detected from that result. In that way, the output current can be fed back to the control circuit. In that case, there is no risk in the detecting operation to narrow the possible output range of the output voltage, since the output current need not be measured direct.

According to a preferred mode of the above-described power control device from another aspect, said fourth branch includes a current setting circuit for holding at a substantially constant level or changing quasistatically said adjusting current. If the adjusting current is held constant with the current setting circuit, then the output current is also constant, since the ratio of the output current to the adjusting current is held constant by the current ratio compensator. Alternatively, if the adjusting current changes quasistatically by the current setting circuit, then the output current changes quasistatically in the same manner. Here, quasistatic change means a sufficiently slow change in comparison with the change of the output current and the adjusting current through the output control of the control circuit and the control of the equivalent impedance of the current ratio compensator.

According to a preferred mode of the above-described power control device from still another aspect, said second branch includes a switch circuit connected in series between said load and the second power-source-connecting terminal and for conducting or cutting off said output current based on said potential difference. If the output current changes greatly to lose the balance of the bridge circuit, the switch circuit cuts off the output current in order to prevent an excessive large amount of current of the output current from destroying the elements included in the device and the like. Thereby, the elements of the device and the like are protected from a destructive excess current.

In addition, in that case, the control of said equivalent impedance by said current ratio compensator may be provided over said switch circuit. Thereby, the single switch circuit can be used in order to perform the above-described function as a protective circuit against excess current and the function as a compensator for making the bridge circuit keep the balance.

According to a preferred mode of the above-described power control device from yet another aspect, said current ratio compensator may provide the control of said equivalent impedance over said output circuit. Thereby, the single output circuit can be used in order to perform the original function as a driver for the load, the function as a protective circuit against the above-described excess current and the function as a compensator for making the bridge circuit keep the balance.

A power control device according to one aspect of the present invention, as one of the developments of the above-described power control device, comprises:

an output network consisting of a first branch, a second branch, a third branch, a fourth branch, a fifth branch, a sixth branch and a seventh branch, wherein each of said first to seventh branches includes a first terminal and a second terminal, the first terminals of said first, said third and said fifth branches are connected to a first power-source-connecting terminal at a substantially constant potential, the second terminals of said second, said fourth and said sixth branches are connected to a second power-source-connecting terminal at a substantially constant potential, the second terminal of said first branch and the first terminal of said second branch are mutually connected at a first node, the second terminal of said third branch and the first terminal of said fourth branch are mutually connected at a second node, the second terminal of said fifth branch and the first terminal of said sixth branch are mutually connected at a third node, the first terminal and the second terminal of said seventh branch are connected to said first node and said second node, respectively, said seventh branch includes a load, said first branch includes a first output circuit for driving said load, said third branch includes a second output circuit for driving said load, each of said second and said fourth branches includes a switch circuit, and said fifth branch includes an auxiliary circuit for interlocking with either of said first or said second output circuits and outputting adjusting current adjusted to an amount smaller substantially by a predetermined ratio than an output current outputted from the interlocking output circuit in the case of applying substantially the same input voltage as that of the interlocking output circuit;

a potential difference detector for detecting the potential of said first node or said second node with respect to said third node;

a control circuit for making said first and said second output circuits interlock with said auxiliary circuit in a substantially alternate order and controlling said first or said second output circuit;

a switch control circuit for turning on or off said switch circuits in a substantially alternate order in a manner synchronized with the operation of said control circuit; and a current ratio compensator for feeding back said potential difference detected by said potential difference detector and controlling the equivalent impedance across said first terminal and said second terminal of one of said first to said sixth branches, so that a bridge consisting of said first branch, a composite of said seventh branch and said fourth branch, said fifth branch, and said sixth branch, keeps the balance when an output current from said first output circuit flows through said first branch, said seventh branch and said fourth branch, and a bridge consisting of said third branch, a composite of said seventh branch and said second branch, said fifth branch, and said sixth branch, keeps the balance when an output current from said second output circuit flows through said third branch, said seventh branch and said second branch, thereby holding said ratio at a substantially constant level.

The output control device can reverse the output current flowing through the load by turning on or off the two output circuits and the switch circuits in substantially alternate order. The arrangement of only the conducting branches of the output network is substantially the same as the bridge circuit of the above-described power control device and, therefore, the effects thereof are equivalent to the above-described effects.

According to a preferred mode of the power control device from one aspect, said sixth branch includes a current setting circuit for holding at a substantially constant level or changing quasistatically said adjusting current. If the adjusting current is held constant with the current setting circuit, then the output current is constant, since the ratio of the output current to the adjusting current is held constant by the current ratio compensator. Alternatively, if the adjusting current changes quasistatically by the current setting circuit, then the output current changes quasistatically in the same manner.

In the above-described power control device, preferably from another aspect, said current ratio compensator provides the control of said equivalent impedance over said switch circuit. Thereby, the switch circuit for reversing the current flowing through the load can also be used as a compensator for making the bridge circuit keep the balance.

According to a preferred mode of the above-described power control device from still another aspect, said current ratio compensator may provide the control of said equivalent impedance over said first or said second output circuits. Thereby, the same output circuit can be used in order to perform the original function as a driver for the load, the above-described function as a protective circuit against excess current and the function as a compensator for making the bridge circuit keep the balance.

A power control device developed into another mode from the secondarily mentioned power control device according to the present invention comprises:

an output network consisting of a first branch, a second branch, a third branch, a fourth branch, a fifth branch, a sixth branch, a seventh branch, an eighth branch and a ninth branch, wherein
each of said first to ninth branches includes a first terminal and a second terminal,
the first terminals of said first, said third, said fifth and said seventh branches are connected to a first power-source-connecting terminal at a substantially constant potential,
the second terminals of said second, said fourth, said sixth and said eighth branches are connected to a second power-source-connecting terminal at a substantially constant potential,
the second terminal of said first branch and the first terminal of said second branch are mutually connected at a first node, the second terminal of said third branch and the first terminal of said fourth branch are mutually connected at a second node, the second terminal of said fifth branch and the first terminal of said sixth branch are mutually connected at a third node, the second terminal of said seventh branch and the first terminal of said eighth branch are mutually connected at a fourth node,
the first terminal and the second terminal of said ninth branch are connected to said first node and said second node, respectively,
said ninth branch includes a load,
said first branch includes a first output circuit for driving said load,
said third branch includes a second output circuit for driving said load,
each of said second and said fourth branches includes a switch circuit,
said fifth branch includes a first auxiliary circuit for interlocking with said first output circuit and outputting a first adjusting current adjusted to an amount smaller substantially by a predetermined first ratio than a first output current outputted from said first output circuit in the case of applying substantially the same input voltage as that of said first output circuit, and
said seventh branch includes a second auxiliary circuit for interlocking with said second output circuit and outputting a second adjusting current adjusted to an amount smaller substantially by a predetermined second ratio than a second output current outputted from said second output circuit in the case of applying substantially the same input voltage as that of said second output circuit;

a potential difference detector for detecting the potential of said first node with respect to said third node as a first potential difference and the potential of said second node with respect to said fourth node as a second potential difference;

a control circuit for operating in a substantially alternate order and controlling a pair of said first output circuit and said first auxiliary circuit and a pair of the second output circuit and said second auxiliary circuit;

a switch control circuit for turning on or off one of said switch circuits in a substantially alternate order in a manner synchronized with the operation of said control circuit; and a current ratio compensator for feeding back said first or said second potential difference detected by said potential difference detector and for controlling the equivalent impedance across said first terminal and said second terminal of one of said first to said eighth branches, so that a bridge consisting of said first branch, a composite of said seventh branch and said fourth branch, said fifth branch, and said sixth branch, keeps the balance, thereby holding said first ratio at a substantially constant level when said first output current flows through said first branch, said seventh branch and said fourth branch, and a bridge consisting of said third branch, a composite of said seventh branch and said second branch, said seventh branch, and said eighth branch, keeps the balance, thereby holding said second ratio at a substantially constant level when said second output current flows through said third branch, said seventh branch and said second branch.

The power control device can reverse the output current flowing through the load by turning on or off the two output circuits and the two switch circuits in substantially alternate order in the same manner as described above. The arrangement of only the conducting branches of the output network are substantially the same as the bridge circuit of the secondarily described power control device according to the present invention and, therefore, the effects thereof are equivalent to that secondarily described one.

That power control device, in contrast with the above-described power control device, has two auxiliary circuits one-to-one corresponding to the two output circuits. Thereby, the circuit scale is larger than the above-described power control device. On the contrary, if the ratio of the adjusting current to the output current is set at a predetermined value with a high precision, the above-described power control device requires minimizing the structural difference between the two output circuits since the auxiliary circuit is used in common, but that power control device does not.

In addition, in the case of monolithically forming the power control device according to the present invention as an integrated circuit, the two output circuits must be put apart to a certain extent on the chip in the above-described power control device. Therefore, non-uniformity in position of the temperature or the wafer structure on the chip can easily appear as the difference between the operations of the two output circuits and, as a result, the precision of the output control tends to drop. On the contrary, in that power control device, the output circuit and the auxiliary circuit, both of which correspond to each other, can be formed immediately next to each other and, therefore, the above-described non-uniformity of the temperature or the wafer structure can be substantially ignored for the pair of the circuits.

The above-described power control device according to a preferred mode from one aspect has a current setting circuit for holding at a substantially constant level or changing quasistatically said first adjusting current and said second adjusting current in said sixth branch and said eight branch, respectively. If the adjusting current is held constant with the current setting circuit, then the output current is also constant, since the ratio of the output current to the adjusting current is held constant by the current ratio compensator. Alternatively, if the adjusting current changes quasistatically by the current setting circuit, then the output current changes quasistatically in the same manner.

In the above-described power control device preferably from yet another aspect, said current ratio compensator provides the control of said equivalent impedance over said switch circuits. Thereby, the switch circuit for reversing the current flowing through the load can also be used as the compensator for making the bridge circuit keep the balance.

According to a preferred mode of the above-described power control device from still another aspect, said current ratio compensator may provide the control of said equivalent impedance over said first or said second output circuits. Thereby, the same output circuit can be used in order to perform the original function as a driver for the load, the above-described function as a protective circuit against excess current and the function as a compensator for making the bridge circuit keep the balance.

A power control device according to the present invention, as a development of the secondarily described power control device of the present invention from still another aspect, comprises:

an output network consisting of a first branch, a second branch, a third branch, a fourth branch, a fifth branch, a sixth branch, a seventh branch and an eighth branch, wherein
each of said first to eighth branches includes a first terminal and a second terminal,
the first terminals of said first, said third, said fifth and said seventh branches are connected to a first power-source-connecting terminal at a substantially constant potential,
the second terminals of said second, said fourth, said sixth and said eighth branches are connected to a second power-source-connecting terminal at a substantially constant potential,
the second terminal of said first branch and the first terminal of said second branch are mutually connected at a first node, the second terminal of said third branch and the first terminal of said fourth branch are mutually connected at a second node, the second terminal of said fifth branch and the first terminal of said sixth branch are mutually connected at a third node, the second terminal of said seventh branch and the first terminal of said eighth branch are mutually connected at a fourth node,
three terminals of three loads in Y connection or Δ connection are connected to said first to third nodes, respectively,
said first branch includes a first output circuit for driving said loads,
said third branch includes a second output circuit for driving said loads,
said fifth branch includes a third output circuit for driving said loads,
each of said second, said fourth and said sixth branches includes a switch circuit, and
said seventh branch includes an auxiliary circuit for interlocking with one of said first to third output circuits and outputting an adjusting current adjusted to an amount smaller substantially by a predetermined ratio than an output current outputted from the interlocking output circuit in the case of applying substantially the same input voltage as that of the interlocking output circuit;

a potential difference detector for detecting the potential of said first node, said second node or said third node with respect to said fourth node;

a control circuit for making said first to third output circuits interlock with said auxiliary circuit in a predetermined order and controlling said first to third output circuits;

a switch control circuit for turning on or off one or two of said switch circuits in a predetermined order and combination in a manner synchronized with the operation of said control circuit; and a current ratio compensator for feeding back said potential difference detected by said potential difference detector and for controlling the equivalent impedance across said first terminal and said second terminal of one of said first to said eighth branches, so that a bridge consisting of said first branch, a composite of said loads and either or both of said fourth and said sixth branches, said seventh branch, and said eighth branch, keeps the balance when an output current from said first output circuit flows through said first branch, said loads, either or both of said fourth and said sixth branches, a bridge consisting of said third branch, a composite of said loads and either or both of said second and said sixth branches, said seventh branch, and said eighth branch, keeps the balance when an output current from said second output circuit flows through said third branch, said loads, either or both of said second and said sixth branches, and a bridge consisting of said fifth branch, a composite of said loads and either or both of said second and said fourth branches, said seventh branch, and said eighth branch, keeps the balance when an output current from said third output circuit flows through said fifth branch, said loads, either or both of said second and said fourth branches, thereby holding said ratio at a substantially constant level.

The power control device can reverse the output currents flowing through the respective loads by turning on and off the respective output circuits and the switch circuits in a predetermined order and combination. That power control device is, for example, used as a driver for stator wire of three-phase synchronous motor or inductive motor. The arrangement of only the conducting branches of the output network is substantially the same as the bridge circuit of the above-described power control device and, therefore, the effects thereof are equivalent to the above-described one.

According to a preferred mode of the power control device from one aspect, said eighth branch includes a current setting circuit for holding at a substantially constant level or changing quasistatically said adjusting current. If the adjusting current is held constant with the current setting circuit, then the output current is constant, since the ratio of the output current to the adjusting current is held constant by the current ratio compensator. Alternatively, if the adjusting current changes quasistatically by the current setting circuit, then the output current also changes quasistatically in the same manner.

In the above-described power control device, preferably from yet another aspect, said current ratio compensator provides the control of said equivalent impedance over said switch circuits. Thereby, the switch circuit for reversing the current flowing through the load can also be used as a compensator for making the bridge circuit keep the balance.

According to a preferred mode of the above-described power control device from yet another aspect, said current ratio compensator may provide the control of said equivalent impedance over one of said first to third output circuits. Thereby, the same output circuit can be used in order to perform the original function as a driver for the load, the above-described function as a protective circuit against excess current and the function as the compensator for making the bridge circuit keep the balance.

A power control device according to the present invention developed into still another mode from the secondarily mentioned power control device according to the present invention, comprises:

an output network consisting of a first branch, a second branch, a third branch, a fourth branch, a fifth branch, a sixth branch, a seventh branch, an eighth branch, a ninth branch, a tenth branch, an eleventh branch and a twelfth branch, wherein each of said first to twelfth branches includes a first terminal and a second terminal, the first terminals of said first, said third, said fifth, said seventh, said ninth and said eleventh branches are connected to a first power-source-connecting terminal at a substantially constant potential, the second terminals of said second, said fourth, said sixth, said eighth, said tenth and said twelfth branches are connected to a second power-source-connecting terminal at a substantially constant potential, the second terminal of said first branch and the first terminal of said second branch are mutually connected at a first node, the second terminal of said third branch and the first terminal of said fourth branch are mutually connected at a second node, the second terminal of said fifth branch and the first terminal of said sixth branch are mutually connected at a third node, the second terminal of said seventh branch and the first terminal of said eighth branch are mutually connected at a fourth node, the second terminal of said ninth branch and the first terminal of said tenth branch are mutually connected at a fifth node, the second terminal of said eleventh branch, the second terminal of said eleventh branch and the first terminal of said twelfth branch are mutually connected at a sixth node, three terminals of three loads in Y connection or Δ connection are connected to said first to third nodes, respectively, said first branch includes a first output circuit for driving said loads, said third branch includes a second output circuit for driving said loads, said fifth branch includes a third output circuit for driving said loads, each of said second, said fourth and said sixth branches includes a switch circuit, said seventh branch includes a first auxiliary circuit for interlocking with said first output circuit and outputting a first adjusting current adjusted to an amount smaller substantially by a predetermined first ratio than a first output current outputted from said first output circuit in the case of applying substantially the same input voltage as that of said first output circuit, said ninth branch includes a second auxiliary circuit for interlocking with said second output circuit and outputting a second adjusting current adjusted to an amount smaller substantially by a predetermined second ratio than a second output current outputted from said second output circuit in the case of applying substantially the same input voltage as that of said second output circuit, and said eleventh branch includes a third auxiliary circuit for interlocking with said third output circuit and outputting a third adjusting current adjusted to an amount smaller substantially by a predetermined third ratio than a third output current outputted from said third output circuit in the case of applying substantially the same input voltage as that of said third output circuit;

a potential difference detector for detecting the potential of said first node with respect to said fourth node as a first potential difference, the potential of said second node with respect to said fifth node as a second potential difference and the potential of said third node with respect to said sixth node as a third potential difference;

a control circuit for operating in a predetermined order and controlling a pair of said first output circuit and said first auxiliary circuit, a pair of the second output circuit and said second auxiliary circuit and a pair of the third output circuit and said third auxiliary circuit;

a switch control circuit for turning on or off one or two of said switch circuits in a predetermined order and combination in a manner synchronized with the operation of said control circuit; and a current ratio compensator for controlling the equivalent impedance across said first terminal and said second terminal of one of said first to twelfth branches, for feeding back said first potential difference detected by said potential difference detector so that a bridge consisting of said first branch, a composite of said loads and either or both of said fourth and said sixth branches, said seventh branch, and said eighth branch, keeps the balance, thereby holding said first ratio at a substantially constant level when said first output current flows through said first branch, said loads, either or both of said fourth and said sixth branches, for feeding back said second potential difference detected by said potential difference detector so that a bridge consisting of said third branch, a composite of said loads and either or both of said second and said sixth branches, said ninth branch, and said tenth branch, keeps the balance, thereby holding said second ratio at a substantially constant level when said second output current flows through said third branch, said loads, either or both of said second and said sixth branches, and for feeding back said third potential difference detected by said potential difference detector so that a bridge consisting of said fifth branch, a composite of said loads and either or both of said second and said fourth branches, said eleventh branch, and said twelfth branch, keeps the balance, thereby holding said third ratio at a substantially constant level when said third output current flows through said fifth branch, said loads, either or both of said second and said fourth branches.

The power control device can reverse the output currents flowing through the respective loads by turning on or off the respective output circuits and the switch circuits in a predetermined order and combination in the same way as described above. Therefore, the power control device can be used, for example, as a driver for stator wire of three-phase synchronous motor or inductive motor. The arrangement of only the conducting branches of the output network is substantially the same as the bridge circuit of the secondarily mentioned power control device according to the present invention and, therefore, the effects thereof are equivalent to the secondarily mentioned power control device.

The power control device, in contrast with the above-described power control device, has a plurality of the auxiliary circuits one-to-one corresponding to a plurality of the output circuits. Thereby, the circuit scale is larger than the above-described one. On the contrary, if the ratio of the adjusting current to the output current is set at a predetermined value with a high precision, the above-described power control device requires minimizing the structural difference among a plurality of the output circuits since the auxiliary circuit is used in common, but that power control device does not.

In addition, in the case of monolithically forming the power control device according to the present invention as an integrated circuit, the output circuits must be put apart from each other to a certain extent on the chip in the above-described power control device. Therefore, non-uniformity in position of the temperature or the wafer structure on the chip can easily appear as the difference between the operations of the plural output circuits and, as a result, the precision of the output control tends to drop. On the contrary, in that power control device, the output circuit and the auxiliary circuit, both of which correspond to each other, can be formed immediately next to each other and, therefore, the above-described non-uniformity of the temperature or the wafer structure can be substantially ignored for the pair of the circuits.

The power control device in a preferred mode according to one aspect has a current setting circuit in said eighth branch, said tenth branch and said twelfth branch each, for holding at a substantially constant level or changing quasistatically said first adjusting current, said second adjusting current and said third adjusting current, respectively. If the adjusting current is held constant with the current setting circuit, then the output current is also constant, since the ratio of the output current to the adjusting current is held constant by the current ratio compensator. Alternatively, if the adjusting current changes quasistatically with the current setting circuit, then the output current changes quasistatically in the same manner.

In the above-described power control device preferably from still another aspect, said current ratio compensator provides the control of said equivalent impedance over said switch circuit. Thereby, the switch circuit for reversing the current flowing through the load can also be used as the compensator for making the bridge circuit keep the balance.

In a preferred mode of the above-described power control device from yet another aspect, said current ratio compensator may provide the control of said equivalent impedance over one of said first to third output circuits. Thereby, the same output circuit can be used in order to perform the original function as a driver for the load, the above-described function as a protective circuit against excess current and the function as the compensator for making the bridge circuit keep the balance.

The above-described power control device according to the present invention is formed so as to include in the output network, two or three of substantially the same circuit parts as the bridge circuit of the secondarily mentioned power control device according to the present invention at the time of conducting the current during a predetermined period of the operation time. It would be easy for ordinary engineers who belong to a field related to the present invention (hereinafter referred to as those skilled in the art) to extend the power control device according to the present invention so as to make it include four or more of the same circuit parts, thereby use it as, for example, a four or more phase driver.

In addition, a power control device according to still another aspect of the present invention has at least two output control parts, each of which is the above-described power control device according to the present invention being able to reverse the current flowing through a load, and a micro-step control circuit for controlling said adjusting currents of said output control parts, thereby controlling the currents flowing through said respective loads.

That power control circuit can independently control the currents flowing through the respective loads included in the respective output control parts. That power control circuit is used as, for example, a driver such as in a stepping motor. Each of the output control parts has the same structure as the above-described power control device being able to reverse a current of a load and, therefore, the effects thereof are the same as the above-described power control device.

Each of the output control parts may have a current setting circuit for holding at a substantially constant level or changing quasistatically said adjusting current in the same way as the above-described power control device. The current setting circuit is included in a branch through which adjusting current from the auxiliary circuit flows. In addition, said current ratio compensator may provide the control of said equivalent impedance over said switch circuit or said output circuit. Owing to the above-described structure and effects, the output control with a high precision can be provided in the same way as the above-described power control device.

In the above-described power control device according to the present invention, preferably from one aspect, a main resistance in the periphery of said output circuit and an auxiliary resistance in the periphery of said auxiliary circuit interlocking with said output circuit are adapted to satisfy a substantial proportionality between said output current from said output circuit and said adjusting current from said auxiliary circuit. The main resistance is preferably connected in series with the output circuit and includes a parasitic resistance of the output circuit and a resistance which cannot be structurally removed. The auxiliary resistance is preferably connected in series with the auxiliary circuit. For example, as described above, in the case where the power control device according to the present invention has a bridge circuit consisting of four branches from the first to the fourth branches, the main resistance in the first branch is connected in series to the output circuit between the first and the second terminals of the first branch. An auxiliary resistance in the third branch is connected in series to the auxiliary circuit between the first and the second terminals of the third branch. Here, "being adapted" means, concretely, that said auxiliary resistance has a resistance value substantially equal to the resistance value of said main resistance multiplied by the inverse of the proportional coefficient of said proportionality.

For example, in the case where the output circuit is formed as a semiconductor element, a resistance which cannot be structurally removed always exists in the periphery of the output circuit. Then, the auxiliary resistance having the above-described resistance value is arranged in the periphery of the auxiliary circuit. Thus, an error given by the main resistance to the ratio of the output circuit to the adjusting current can be reduced. Therefore, the precision of the output control can avoid reducing in spite of the existence of the main resistance.

While the novel features of the invention are set forth particularly in the appended claims, the invention, both as to organization and content, will be better under stood and appreciated, along with other objects and features thereof, from the following detailed description taken in conjunction with the drawings.

It will be recognized that some or all of the Figures are schematic representations for purposes of illustration and do not necessarily depict the actual relative sizes or locations of the elements shown.

BEST MODE FOR CARRYING OUT THE INVENTION

The best mode of the present invention is explained through the following description of some preferred embodiments with reference to the drawings.

<<First Embodiment>>

Figure 1:
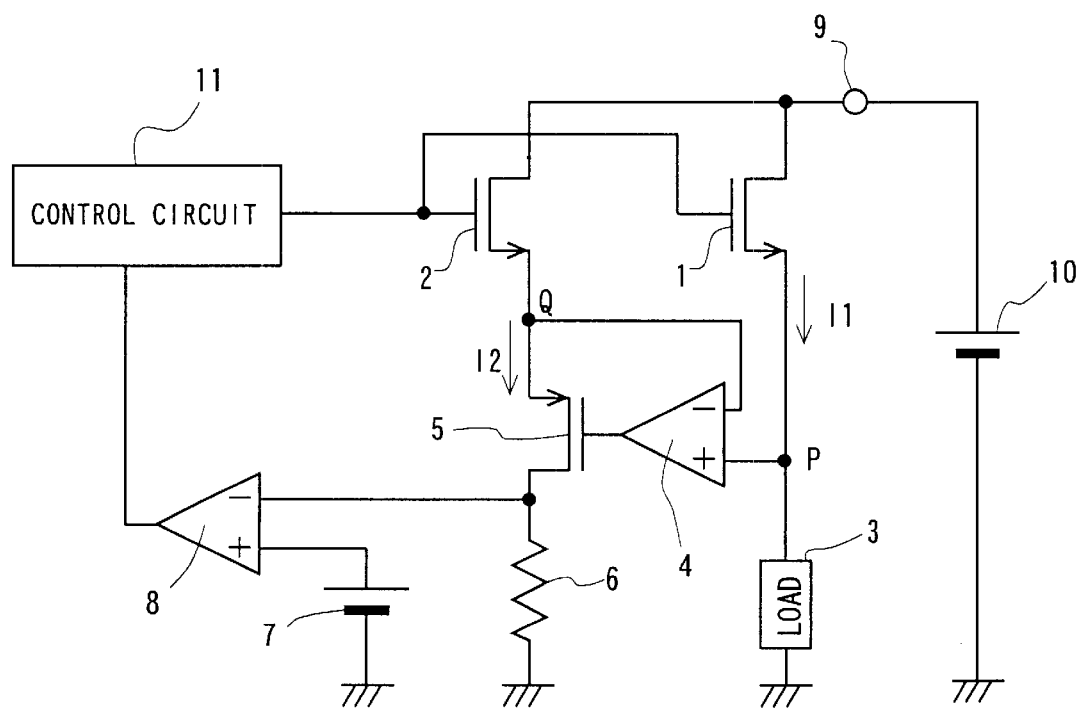
FIG. 1 is a circuit diagram of a power control device according to the first embodiment of the present invention.

FIG. 1 is a circuit diagram of the power control device according to the first embodiment of the present invention.

An electrode 9 is connected to a direct voltage source 10 at a substantially constant potential.

An output transistor 1 is preferably an n-channel metal oxide film field effect transistor (MOSFET) and has the drain connected to the electrode 9 and the source connected to a load 3.

The load 3 is grounded through the terminal different from that connected to the output transistor 1.

An auxiliary transistor 2 is preferably an n-channel MOSFET and has the drain connected to the electrode 9 and the source connected to the source of a compensating transistor 5. The ratio I1/I2 of the source current I1 of the output transistor 1 to the source current I2 of the auxiliary transistor 2 is designed at a substantially constant level (hereinafter assumed to be as follows: I1/I2=n) independent of the potentials of the three terminals of drain, source and gate when each potential of the three terminals is common between both of the transistors. That design is practicable, for example, in the case of monolithically manufacturing the first embodiment as an integrated circuit, by setting a size ratio of the output transistor 1 to the auxiliary transistor 2 at n:1 since the transistors are the same n-channel MOSFET.

The compensating transistor 5 is preferably a p-channel MOSFET and has the drain connected to a current-detecting resistance 6.

The current-detecting resistance 6 is grounded through the terminal different from that connected to the compensating transistor 5.

A first differential amplifier 4 detects the potential of the junction point between the output transistor 1 and the load 3, namely the node P, with respect to the junction point between the auxiliary transistor 2 and the compensating transistor 5, namely the node Q, and outputs the voltage proportional to the potential difference to the gate of the compensating transistor 5.

A second differential amplifier 8 compares the potential of the junction point between the compensating transistor 5 and the current-detecting resistance 6, namely the node R, with a reference voltage 7, and outputs the voltage proportional to the potential difference to a control circuit 11.

The control circuit 11 outputs a common control signal to the gates of the output transistor 1 and the auxiliary transistor 2 based on the output voltage of the second differential amplifier 8, and changes the voltages between drain and source at substantially the same time and in substantially the same manner. Hereinafter, such operations of the output transistor 1 and the auxiliary transistor 2 are referred to as "interlocking."

With the above-described configuration, the first embodiment controls the output current I1 outputted to the load 3 as follows:

First, by the first differential amplifier 4 and the compensating transistor 5, the potential of the node Q is raised and drops when the potential of the node P with respect to the node Q is increased positively and negatively, respectively. Thus, the source potential of the output transistor 1 (the potential of the node P) and the source potential of the auxiliary transistor 2 (the potential of the node Q) become substantially equal. That is to say, the output transistor 1, the load 3, the auxiliary transistor 2, the compensating transistor 5 and the current-detecting resistance 6 are considered as a bridge. According to that consideration, the compensating transistor 5 changes the equivalent impedance between the drain and the source based on the potential difference between the node P and the node Q fed back by the first differential amplifier 4, thereby adjusting the potential difference between the node P and the node Q to 0 and making the bridge keep the balance.

The drain potentials of the output transistor 1 and the auxiliary transistor 2 are substantially equal and the gate potentials thereof are substantially equal as clearly shown in FIG. 1. Therefore, when the bridge is balanced as described above, each of the three terminals of the one transistor is at substantially the same potential as the corresponding terminal of the other transistor. Then, the ratio I1/I2 between the source currents of both transistors is held at a constant value n. Accordingly, if the source current of the auxiliary transistor 2, namely the adjusting current I2 is controlled so as to agree with a predetermined target value with the bridge balanced, the source current of the output transistor 1, namely the output current I1 can be controlled so as to agree with n times as large as the target value.

The adjusting current I2 is controlled as follows: The second differential amplifier 8 compares the potential of the node R, namely the voltage drop developed across the current-detecting resistance 6 by the adjusting current I2, with the reference voltage 7. The value of the reference voltage 7 is equal to the voltage drop developed across the current-detecting resistance 6 by the adjusting current I2 equal to the control target value It. The comparison result, including the sign, of the second differential amplifier 8 is outputted to the control circuit 11. The control circuit 11 raises and reduces the gate potential of the auxiliary transistor 2 based on the comparison result, when the adjusting current I2 is smaller and larger than the control target value It, respectively. At the same time, the gate potential of the output transistor 1 changes in exactly the same manner. Thus, the adjusting current I2 agrees with the control target value It and, at the same time, the output current I1 agrees with n times as large as the control target value It.

In the control of the output current I1 as described above, the current-detecting resistance 6 is not included in the main branch including the output transistor 1 and the load 3. Accordingly, the range of the output voltage (the dynamic range) is wider than the first conventional example. In addition, in contrast with the second conventional example, the output transistor 1 and the auxiliary transistor 2 are controlled so as to hold each potential of the three terminals in common. Therefore, the ratio I1/I2 of the source currents is constant substantially independent of the temperature and the potentials of the three terminals. Accordingly, changes of the temperature and the potentials of the three terminals are prevented from reducing the output control precision in contrast with the second conventional example.

In the above description, the control circuit 11 controls the output current I1 based on the output of the second differential amplifier 8. However, the control circuit 1 is not limited to provide only that control and may provide the control of the output current 1 with another known means and, on the other hand, use the output of the second differential amplifier 8 for the conditional judgment on cutting off the output transistor 1 and the auxiliary transistor 2 in order to protect the circuit elements from excess current. In that case, the reference voltage 7 is set at the potential of the node R, when the adjusting current I2 is equal to 1/n of the maximum tolerance value for the output current I1.

In the first embodiment, the control circuit 11 may be a circuit which can output a predetermined voltage based on the input voltage. Such a circuit could be easily designed by those skilled in the art.

<<Second Embodiment>>

Figure 2:
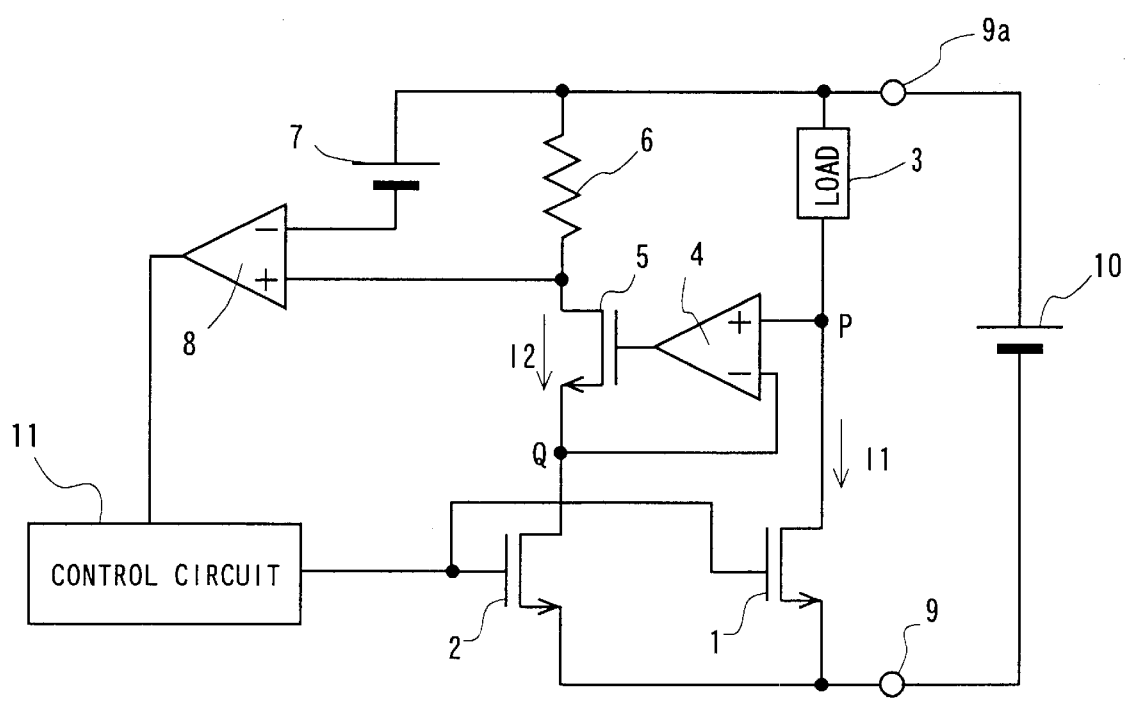
FIG. 2 is a circuit diagram of a power control device according to the second embodiment of the present invention.

FIG. 2 shows a circuit diagram according to the second embodiment of the present invention. In FIG. 2, the same reference signs as FIG. 1 represent the same components as FIG. 1, and the descriptions of the first embodiment are cited to the description of the same components as FIG. 1. In contrast with the first embodiment, the second embodiment corresponds to that wherein the output transistor 1 and the auxiliary transistor 2 each are inversely connected between the drains and the sources and the reference voltage 7 and the second differential amplifier 8 each have the opposite polarities. In the second embodiment, as shown in FIG. 2, the high potential side of the direct voltage source 10 is connected to the first electrode 9a corresponding to the ground side in the first embodiment, and the second electrode 9 is grounded. As could be easily understood by those skilled in the art, the second embodiment is essentially equivalent to the first embodiment except for the output current I1 inversely flowing through the load 3.

<<Third Embodiment>>

Figure 3A:
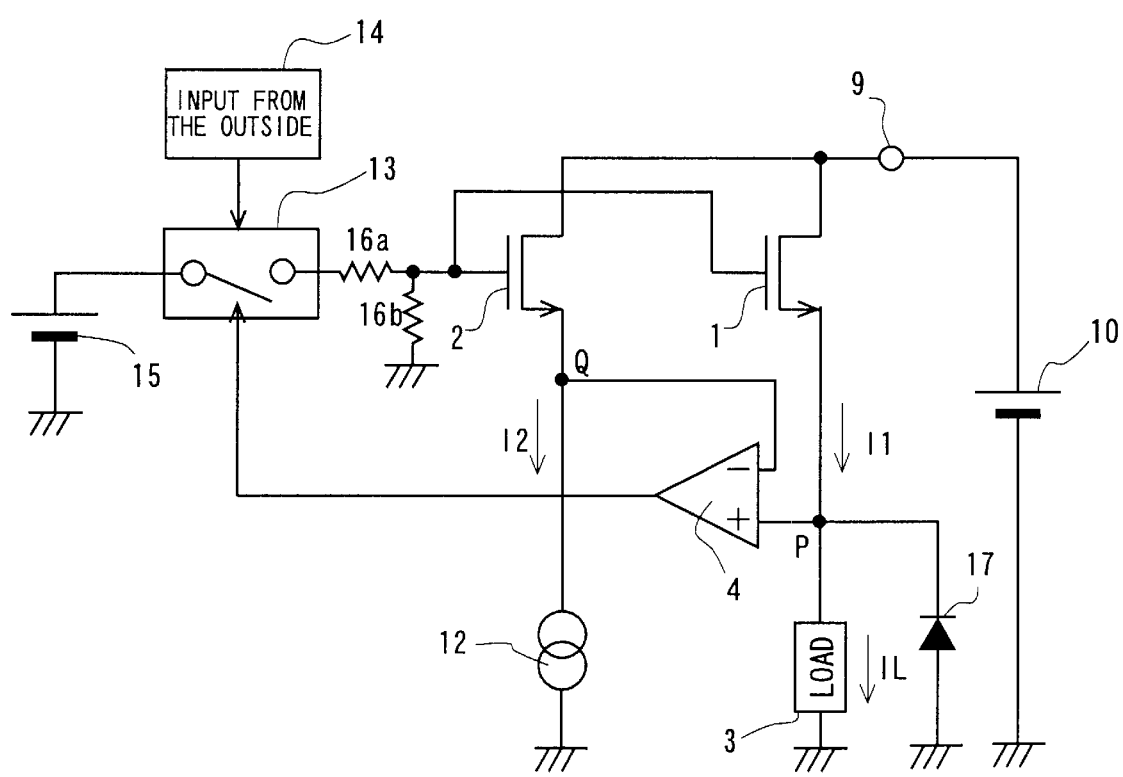
FIG. 3A is a circuit diagram of a power control device according to the third embodiment of the present invention.

FIG. 3A shows a circuit diagram according to the third embodiment of the present invention. In FIG. 3A, the same reference signs as FIG. 1 represent the same components as FIG. 1, and the descriptions of the first embodiment are cited to the description of the same components as FIG. 1.

Figure 3B:
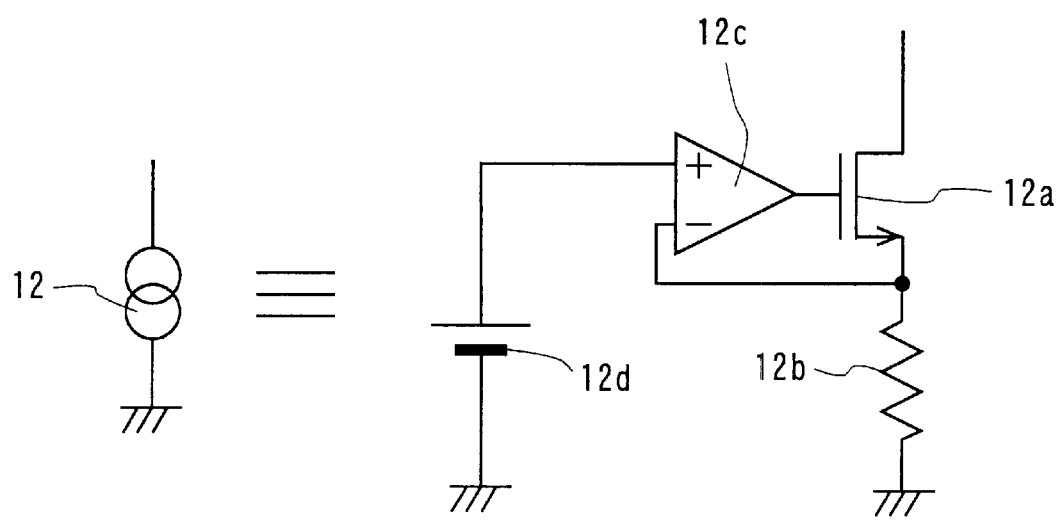
FIG. 3B is a diagram representing a circuit forming a current source 12.

The third embodiment has a current source 12 in place of the current-detecting resistance 6 of the first embodiment (FIG. 1). FIG. 3B is a diagram representing a circuit forming a current source 12. The current source 12 represents a circuit comprising a plurality of elements as shown in FIG. 3B and includes a transistor 12a, a resistance 12b, a differential amplifier 12c and a reference voltage 12d.

The transistor 12a is an n-channel MOSFET, and inputs an adjusting current I2 through the drain. The resistance 12b is connected between the source of the transistor 12a and the grounded terminal. The differential amplifier 12c compares the amount of voltage drop developed across the resistance 12b by the source current of the transistor 12a, with the reference voltage 12d and controls the source current so that the amount of voltage drop becomes substantially lower than the reference voltage. The reference voltage 12d is set to correspond to the voltage drop developed across the resistance 12b when the source current is equal to the control target value It. Thus, the current source 12 holds the adjusting current I2 substantially at a control target value It.

In FIG. 3A, the control circuit 13 is a switch circuit for applying or removing the voltage of the power source for control 15 to or from the gates of the output transistor 1 and the auxiliary transistor 2 by being turned on or off in accordance with the input from the differential amplifier 4 or the outside 14. The voltage of the power source for control 15 is divided with the resistance 16a and the resistance 16b, thereby being a gate voltage sufficient to turn on the output transistor 1 and the auxiliary transistor 2.

The anode of the diode 17 is grounded and the cathode thereof is connected to the node P.

According to the above-described configuration, the third embodiment operates as follows: the larger the potential of the node P drops, the more the output transistor 1 at a constant gate potential outputs the output current I1. When the output of the differential amplifier 4 is a predetermined threshold value or more, that is to say, the potential of the node P with respect to the node Q is higher than a predetermined tolerance lower limit value (preferably a negative value), the control circuit 13 turns on or off the output transistor 1 and the auxiliary transistor 2 in accordance with the input from the outside 14. Then the output current I1 is substantially smaller than a value n×It corresponding to zero potential difference between the node P and the node Q since the adjusting current I2 is held at the control target value It by the current source 12 and the potential of the node P with respect to the node Q is higher than the above-described tolerance lower limit value.

On the other hand, when the output of the differential amplifier 4 is less than the above-described threshold value, that is to say, the potential of the node P with respect to the node Q does not reach the above-described tolerance lower limit value, the control circuit 13 is turned off irrespective of the input from the outside 14. Thereby, the output transistor 1 and the auxiliary transistor 2 are cut off since the respective gate potentials drops. Accordingly, if the tolerance lower limit value for the potential difference between the node P and the node Q is set at a value corresponding to a tolerance upper limit value of the output current I1, circuit elements can be protected from excess current.

In addition, if the load 3 has an inductive reactance, the load current IL flowing through the load 3 can be controlled in the following manner to avoid exceeding the control target value n×It substantially beyond a predetermined control range Δ I1.

First, the tolerance lower limit value for the potential difference between the node P and the node Q is set at a slightly negative value corresponding to the output current I1 larger than the control target value n×It by Δ I1.

When the output current I1 exceeds the control target value n×It beyond Δ I1, the control circuit 13 is turned off since the potential difference between the node P and the node Q drops beyond the tolerance lower limit value, thereby turning off the output transistor 1 and the auxiliary transistor 2. Then, though the output current I1 drops abruptly to 0, the load current IL slowly decreases owing to the inductance of the load 3 during the time when it flows through the diode 17. Then, before the load current IL becomes too small, the input from the outside 14 turns on the control circuit 13, thereby turning on the output transistor 1 and the auxiliary transistor 2. Here, instead of being turned on by the input from the outside 14, the control circuit 13 may be set being turned on by itself after a predetermined period since it was turned off. When a voltage from the direct voltage source 10 is again applied to the load 3 and the potential of the node P is raised to a high level, the output current I1, namely the load current IL will slowly increase owing to the inductance of the load 3 and then the potential of the node P will again decrease together.

As the result of the repeat of the above-described operation, the load current IL does not exceed the control target value n×It substantially beyond Δ I1. In addition, adjusting the timing of turning on the control circuit 13 owing to the input from the outside 14 can make the time mean value of the load current IL agree with the control target value n×It.

In the above description, the current source 12 holds the adjusting current I2 at a constant level during the interval when the auxiliary transistor 2 is on. The time when the adjusting current is held at a constant level in such away, however, maybe longer than the switching period when the output transistor 1 is turned on and off as described above. In other words, changing the reference voltage 12d of the current source 12 more slowly than the above-described switching can slowly change the control target value It of the adjusting current I2, thereby changing the control target value n×It of the output current I1 in the same manner. In the present specification, such a change slower than the switching of the output transistor 1 is referred to as "quasistatic change."

According to the third embodiment, in the same way as the first embodiment, since insertion of a current-detecting resistance is not required in the main branch including the output transistor 1 and the load 3 and, therefore, the range of the output voltage (dynamic range) can be wider than the case of inserting a current-detecting resistance in the main branch.

In addition, shifts of the output current I1 or the load current IL from the control target value caused by temperature change or the potentials of the three terminals of the output transistor 1 can be reduced to a smaller amount than the conventional examples, since the potential difference between the node P and the node Q can be kept under a predetermined tolerance level.

Here, when the output transistor 1 and the auxiliary transistor 2 are off, the energy stored in the load 3 may be outputted to the outside through the diode 17. In that case, the third embodiment functions as a power source device for the outside. The function as the power source device may be also practicable in the case of adding a diode corresponding to the diode 17 to the structure of the first embodiment or the second embodiment.

<<Fourth Embodiment>>

Figure 4:
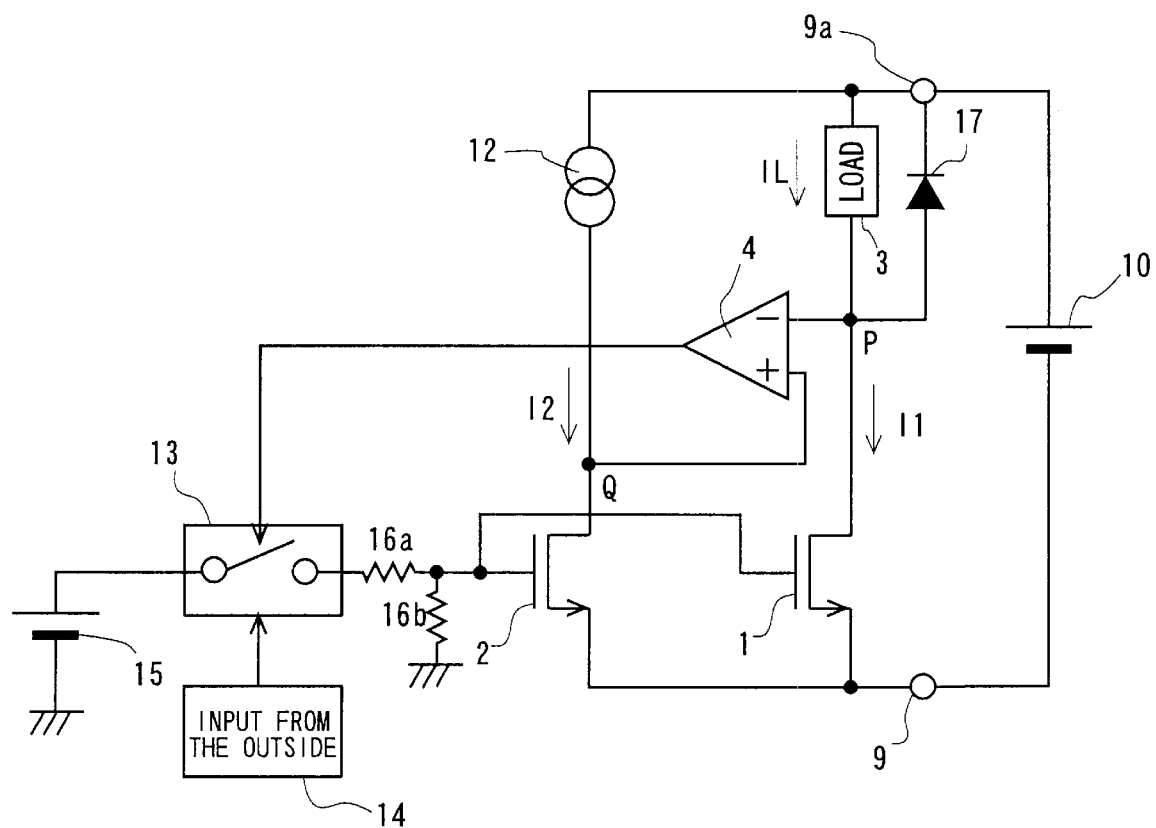
FIG. 4 is a circuit diagram of a power control device according to the fourth embodiment of the present invention.

FIG. 4 shows a circuit diagram according to the fourth embodiment of the present invention. In FIG. 4, the same reference signs as FIG. 3 represent the same components as FIG. 3A, and the descriptions of the third embodiment are cited to the description of the same components as FIG. 3A. In contrast with the third embodiment, the fourth embodiment corresponds to that wherein the output transistor 1 and the auxiliary transistor 2 each are inversely connected between the drains and the sources and the differential amplifier 4 and the diode 17 each have the opposite polarities. In the fourth embodiment, as shown in FIG. 4, the high potential side of the direct voltage source 10 is connected to the first electrode 9a corresponding to the ground side in the third embodiment and the second electrode 9 is grounded. As could be easily understood by those skilled in the art, the fourth embodiment is essentially equivalent to the third embodiment except for the point where the output current IL flowing through the load 3 is reversed.

<<Fifth Embodiment>>

Figure 5A:
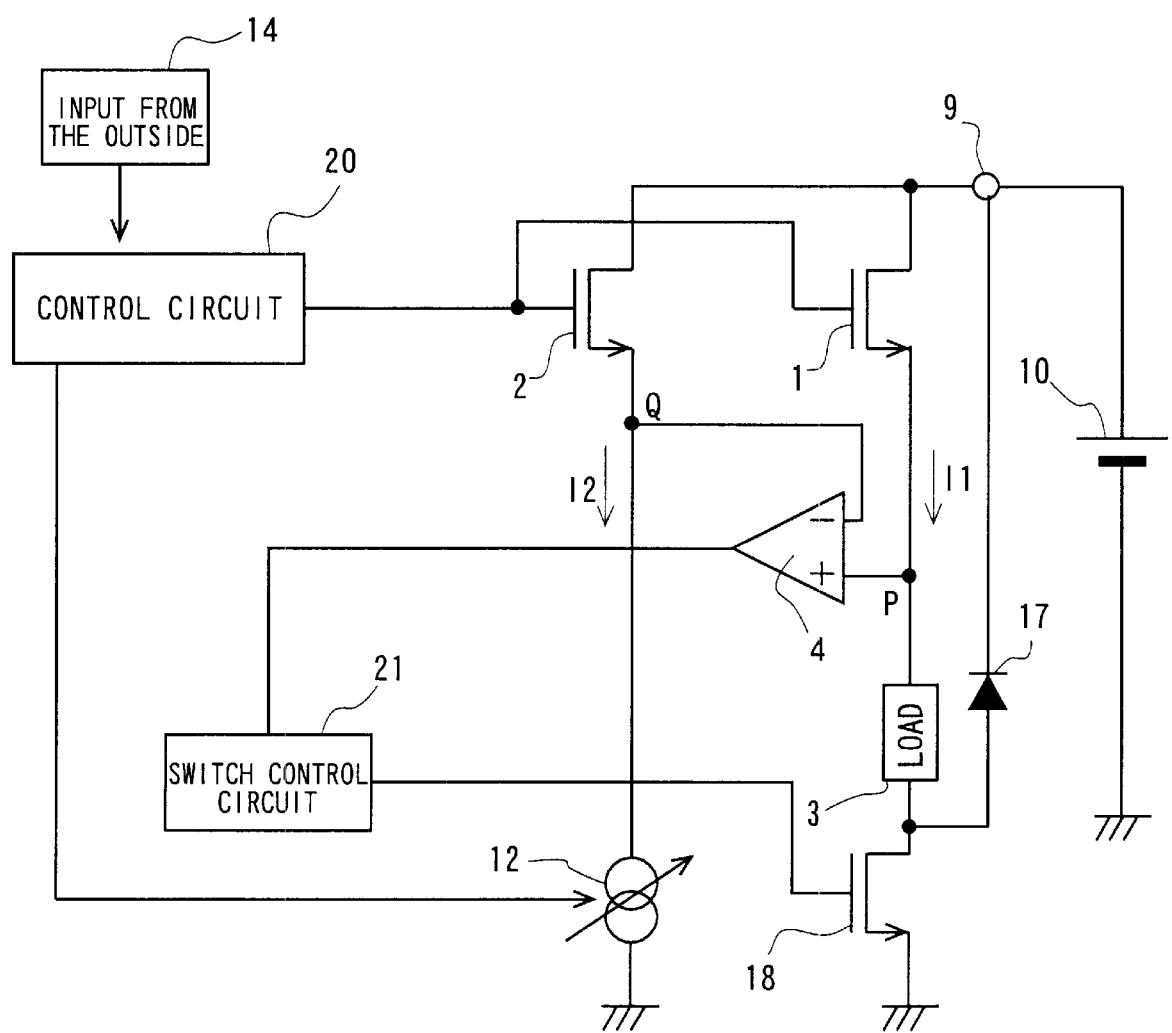
FIG. 5A is a circuit diagram of a power control device according to the fifth embodiment of the present invention.

FIG. 5A shows a circuit diagram according to the fifth embodiment of the present invention. In FIG. 5A, the same reference signs as FIG. 3 represent the same components as FIG. 3A, and the descriptions of the third embodiment are cited to the description of the same components as FIG. 3A.

The current source 12v is the same circuit as the current source 12 as shown in FIG. 3B but able to be set a reference voltage corresponding to the reference voltage 12d at a predetermined value by the input from the outside. Accordingly, the current source 12v holds the adjusting current I2 at the control target value It, and the control target value It is set by the input from the outside.

In FIG. 5A, the switching transistor 18 is an n-channel MOSFET and has the drain connected to the load 3 and the source grounded.

The anode of the diode 19 is connected between the load 3 and the drain of the switching transistor 18 and the cathode is connected to the electrode 9.

The control circuit 20 controls the gate potentials of the output transistor 1 and the auxiliary transistor 2 in accordance with the input from the outside 14, thereby controlling the output current I1 and the adjusting current I2. In addition, the current source 12v is controlled, thereby changing the control target value It of the adjusting current I2.

A switch control circuit 21 controls the gate potential of the switching transistor 18 in accordance with the input from the differential amplifier 4, thereby controlling the output current I1. Concretely, when the potential of the node P with respect to the node Q is positively increased, the switch control circuit 21 raises the gate potential of the switching transistor 18, thereby increasing the output current I1. On the other hand, when the potential of the node P with respect to the node Q is negatively increased, the switch control circuit 21 lowers the gate potential of the switching transistor 18, thereby reducing the output current I1.

According to the above-described configuration, the fifth embodiment operates as follows:

First, when the potential of the node P with respect to the node Q is positively increased, the output current I1 will increase by the differential amplifier 4, the switch control circuit 21 and the switching transistor 18, and then the potential of the node P will drop together. Contrarily, when the potential of the node P with respect to the node Q is negatively increased, the output current 1 will be reduced, and then the potential of the node P will be raised together. Thus, the source potential of the output transistor 1 (the potential of the node P) and the source potential of the auxiliary transistor 2 (the potential of the node Q) become substantially equal. In other words, if the output transistor 1, the load 3 and the switching transistor 18, the auxiliary transistor 2, and the current source 12v are considered as a bridge, the switching transistor 18 changes the equivalent impedance between the drain and the source based on the potential difference between the node P and the node Q fed back by the differential amplifier 4, thereby adjusting the potential difference between the node P and the node Q to 0, that is to say, making the bridge keep the balance.

The drain potentials of the output transistor 1 and the auxiliary transistor 2 are substantially equal, and the gate potentials thereof are substantially equal, as clearly shown in FIG. 5A. Therefore, when the bridge is balanced as described above, each potential of the three terminals of both transistors is substantially equal. Then, the ratio I1/I2 of the output current to the adjusting current I2 is held at a constant value n.

Since the adjusting current I2 is controlled by the current source 12v with the bridge balanced so as to agree with the control target value It, the output current I1 is controlled so as to agree with n times as large as the control target value It. Thus, the ratio I1/I2 of the output current I1 to the adjusting current I2 is held at a constant value n with a higher precision than the conventional examples. As a result, the control circuit 20 can control the output current I1 with a higher precision than the conventional examples in the case of changing the output current I1 to a predetermined value by changing the control target value It of the current source 12v, or in the case of turning on and off the output transistor 1 and the auxiliary transistor 2 in an interlocking way, thereby making the output transistor output the output current I1 modulated in pulse width modulation (PWM).

The differential amplifier 4, the switch control circuit 21 and the switching transistor 18 can function as a protective circuit for protecting circuit elements from excess current as follows: When the output of the differential amplifier 4 is a predetermined threshold value or more, that is to say, the potential of the node P with respect to the node Q is higher than a predetermined tolerance lower limit value (preferably a negative value of the sufficiently large absolute value), the switch control circuit 21 controls the switching transistor 18 as described above. On the other hand, when the output of the differential amplifier 4 is less than the above-described threshold value, that is to say, the potential of the node P with respect to the node Q does not reach the above-described tolerance lower value, the switch control circuit 21 completely turns off the switching transistor 18. Thereby, the output current I1 is cut off. Accordingly, if the tolerance lower limit value for the potential difference between the node P and the node Q is set at a value corresponding to the tolerance upper limit value of the output current I1, the circuit elements can be protected from excess current.

The switch control circuit 21 provides the analog control over the switching transistor 18 as described above. In another way, when the load 3 has an inductive reactance, the switch control circuit 21 can make the bridge substantially keep the balance by providing a switching control over the switching transistor 18 as follows:

First, the tolerance lower limit value for the potential difference between the node P and the node Q is set at a slightly negative value corresponding the output current I1 larger than the control target value n×It by Δ I1.

When the output current I1 exceeds the control target value n×It beyond Δ I1, the switch control circuit 21 turns off the switching transistor 18 since the potential difference between the node P and the node Q drops beyond the tolerance lower limit value. Then, the output current I1 keeps flowing through the diode 19 but slowly decreases owing to the inductance of the load 3. Then, before the output current I1 becomes too small, the switch control circuit 21 again turns on the switching transistor 18. Here, the switch control circuit 21 is set turning on the switching transistor 18 after a predetermined period since it turned off the switching transistor. When a voltage from the direct voltage source 10 is again applied to the load 3 and the potential of the node P is raised to a high level, the output current I1 will slowly increase owing to the inductance of the load 3 and then the potential of the node P will again decrease together.

As the result of the repeat of the above-described operation, the output current I1 does not exceed the control target value n×It substantially beyond Δ I1. In addition, adjusting the time of the interval when the switching transistor 18 is off can make the time mean value of the output current I1 agree with the control target value n×It.

In the control of the output current I1 as described above, insertion of a current-detecting resistance is not required in the main branch including the output transistor 1 and the load 3 and therefore the range of the output voltage (dynamic range) can be wider than the first conventional example wherein the resistance is inserted. In addition, in contrast with the second conventional example, the output transistor 1 and the auxiliary transistor 2 are controlled so as to hold each potential of the three terminals in common. Therefore, the ratio I1/I2 of the output current I1 to the adjusting current I2 is constant substantially independent of the temperature and the potentials of the three terminals. Accordingly, in contrast with the conventional example, changes of the temperature and the potentials of the three terminals do not reduce the output control precision.

In the above description, the current source 12 holds the adjusting current I2 at a constant level during the interval when the auxiliary transistor 2 is on. The time when the adjusting current is held at a constant level in such a way may be about as long as the switching period when the output transistor 1 is turned on and off as described above. In other words, changing the reference voltage of the current source 12v more slowly than the above-described switching period can slowly change the control target value It of the adjusting current I2, thereby changing the control target value n×It of the output current I1 in the same manner.

Here, when the output transistor 1 and the auxiliary transistor 2 are turned off, energy stored in the load 3 may be outputted to the outside through the diode 19. In that case, the fifth embodiment functions as a power source device for the outside.

<<Sixth Embodiment>>

Figure 5B:
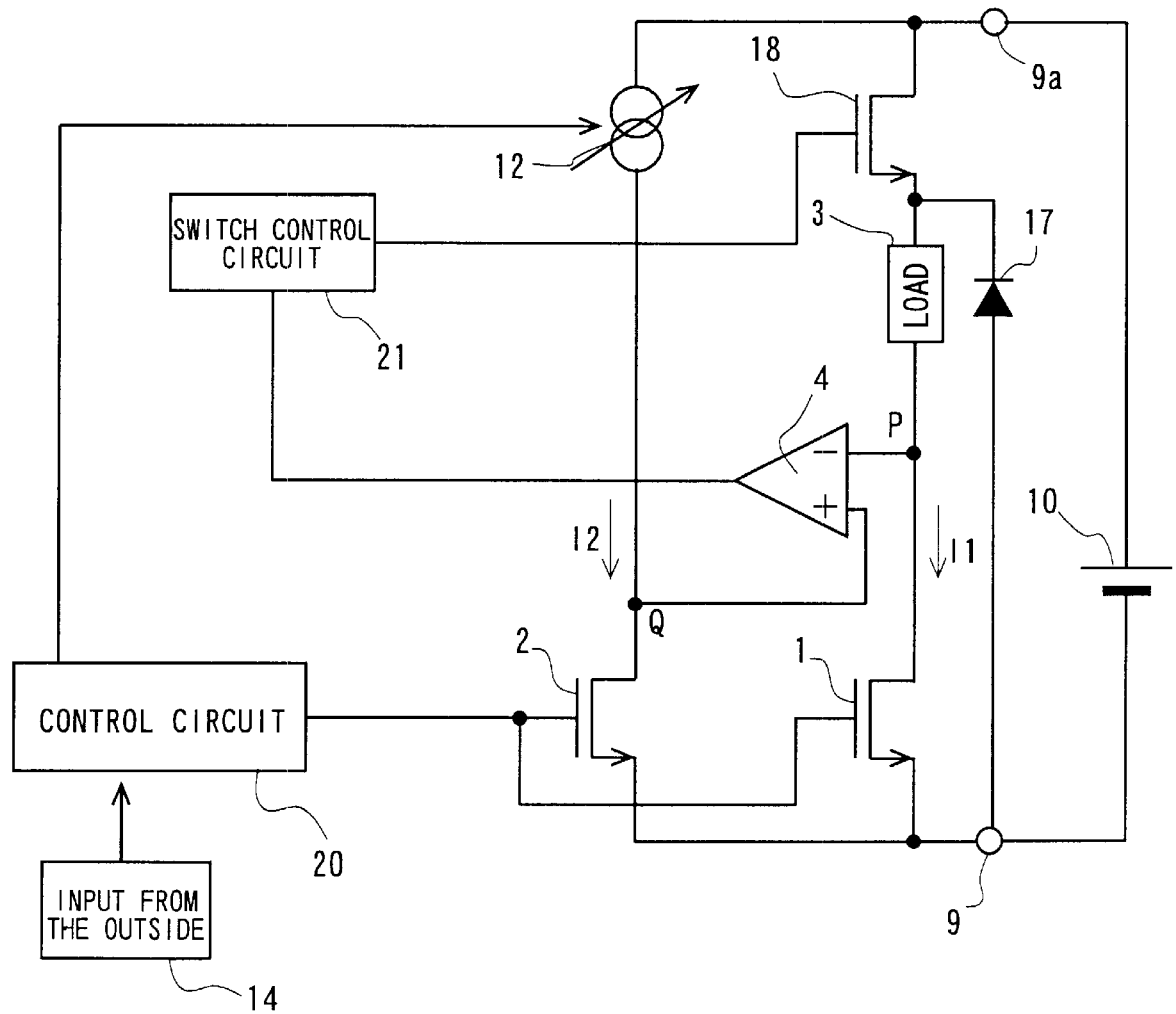
FIG. 5B is a circuit diagram of a power control device according to the sixth embodiment of the present invention.

FIG. 5B shows a circuit diagram according to the sixth embodiment of the present invention. In FIG. 5B, the same reference signs as FIG. 5A represent the same components as FIG. 5A, and the descriptions of the fifth embodiment are cited to the description of the same components as FIG. 5A. In contrast with the fifth embodiment, the sixth embodiment corresponds to that wherein the output transistor 1 and the auxiliary transistor 2 each are inversely connected between the drains and sources and the differential amplifier 4 and the diode 19 each have the opposite polarities. In the sixth embodiment, as shown in FIG. 5B, the high potential side of the direct voltage source 10 is connected to the first electrode 9a corresponding to the ground side of the fifth embodiment and the second electrode 9 is grounded. As could be easily understood by those skilled in the art, the sixth embodiment is essentially the equivalent to the fifth embodiment except for the point where the output current I1 flowing through the load 3 is reversed.

<<Seventh Embodiment>>

Figure 6:
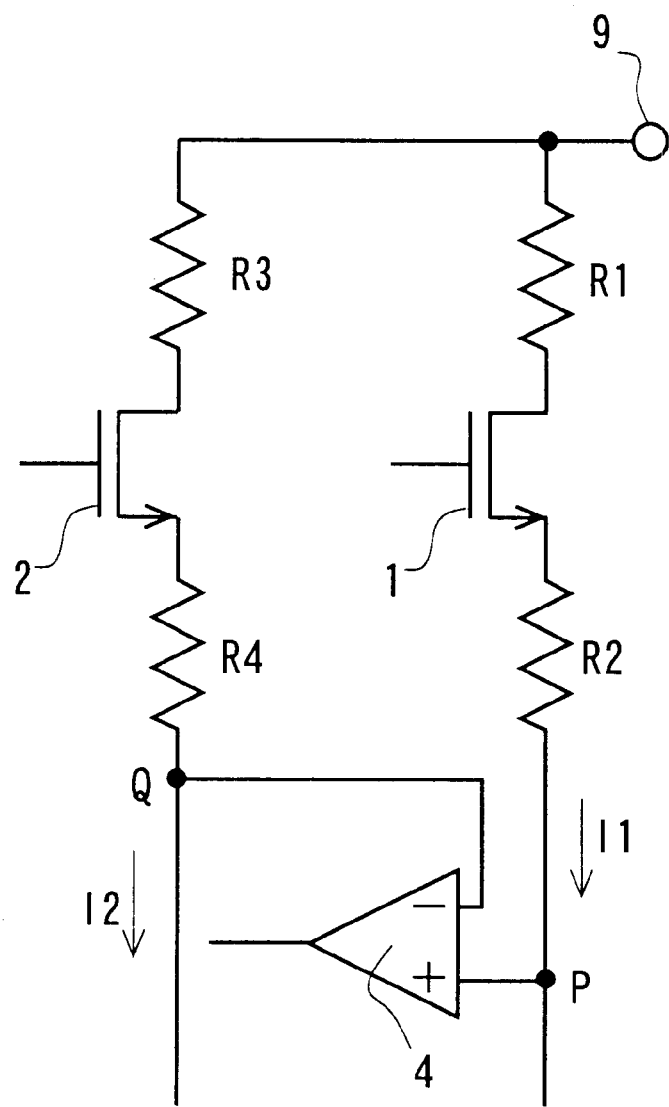
FIG. 6 is a partial circuit diagram illustrating only the vicinity of an output transistor 1 and an auxiliary transistor 2 in the seventh embodiment of the present invention.

FIG. 6 shows a partial circuit diagram illustrating only the vicinity of the output transistor 1 and the auxiliary transistor 2 in the seventh embodiment. The seventh embodiment has the same circuit as one of the above-described first to sixth embodiments and resistances R1 to R4 inserted between the drain terminal of the output transistor 1 and the electrode 9, between the source terminal of the output transistor 1 and the node P, between the drain terminal of the auxiliary transistor 2 and the electrode 9, and between the source terminal of the auxiliary transistor 2 and the node Q, respectively. Among these, the resistances R1 and R2 represent substantially parasitic resistances of the output transistor 1.

Strictly speaking, the drains and the sources of the output transistor 1 and the auxiliary transistor 2 include parasitic resistances though they are not illustrated in FIGS. 1 to 5B showing circuits according to the first to the sixth embodiments. The voltage drop developed across the above-described parasitic resistances cannot be generally ignored in comparison with the voltage applied to the output transistor 1, since the output current I1 flowing through the output transistor 1 is rather large in general. The parasitic resistances included in the output transistor 1 always exist owing to the structure of the output transistor 1, and hence cannot be completely removed. Accordingly, the above-described voltage drop causes an ignorable error in the ratio I1/I2 of the output current I1 to the adjusting current I2.

Then, the resistances R3 and R4 are connected to the drain and the source of the auxiliary transistor 2, respectively, as shown in FIG. 6. Here, the resistance R3 connected to the drain of the auxiliary transistor 2 is set at n times as large as the resistance R1 connected to the drain of the output transistor 1, and the resistance R4 connected to the source of the auxiliary transistor 2 is set at n times as large as the resistance R2 connected to the source of the output transistor 1. Thereby, the ratio I1/I2 of the output current I1 to the adjusting current I2 can be controlled at a constant value n with a higher precision than the case where the resistances R3 and R4 are not inserted.

In the following embodiments, an output control error due to a parasitic resistance of the output transistor can be reduced by adding the same resistance as the seventh embodiment to the auxiliary transistor.

<<Eighth Embodiment>>

Figure 7A:
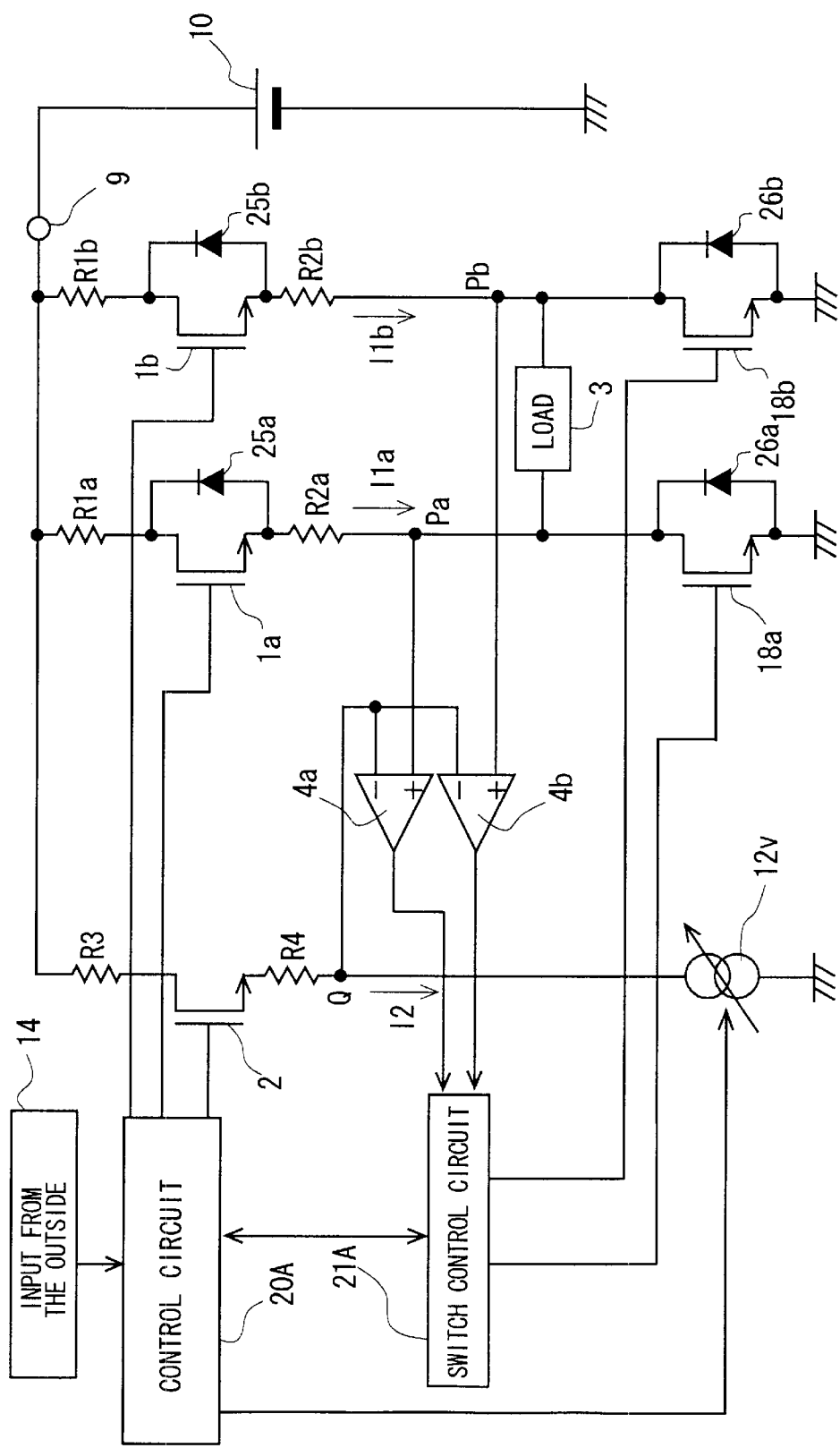
FIG. 7A is a circuit diagram of a power control device according to the eighth embodiment of the present invention.

FIG. 7A shows a circuit diagram according to the eighth embodiment of the present invention. In FIG. 7A, the same reference signs as FIG. 5A represent the same components as FIG. 5A, and the descriptions of the fifth embodiment are cited to the description of the same components as FIG. 5A.

The eighth embodiment has two pairs each of which comprises the elements corresponding to the output transistor 1, the switching transistor 18 and the differential amplifier 4 in the fifth embodiment, and the pairs are arranged as follows:

The first output transistor 1a and the second output transistor 1b both correspond to the output transistor 1 according to the fifth embodiment, and are for adjusting the output to the load 3. The first output transistor 1a and the second output transistor 1b are preferably n-channel metal oxide film field effect transistors (MOSFET), and have the drains connected to the electrode 9 and the sources connected to the load 3. At the same time, the terminals of the load 3 are connected to the first output transistor 1a and the second output transistor 1b, respectively. In addition, the anodes of the first flywheel diode 25a and the second flywheel diode 25b are connected to the sources of the first output transistor 1a and the second output transistor 1b, respectively, and the cathodes of the flywheel diodes are connected to the drains of the output transistors. The first flywheel diode 25a and the second flywheel diode 25b are preferably body diodes of the first output transistor 1a and the second output transistor 1b, respectively. Alternatively, the diodes may be independent diode elements.

The ratio I1a/I2 of the source current I1a of the first output transistor 1a to the source current I2 of the auxiliary transistor 2, and the ratio I1b/I2 of the source current I1b of the second output transistor 1b to the source current I2 of the auxiliary transistor 2 are set at a substantially constant value (hereinafter the following: I1a/I2=I1b/I2=n) independent of the potentials of the three terminals of drain, source and gate when each potential of the three terminals is common between both transistors.

The first switching transistor 18a and the second switching transistor 18b each correspond to the switching transistor 18 in the fifth embodiment, and are preferably an n-channel MOSFET. The drains of the first switching transistor 18a and the second switching transistor 18b are connected to the sources of the first output transistor 1a and the second output transistor 1b, respectively, and the sources of the switch transistors are grounded. In addition, the anodes of the third flywheel diode 26a and the fourth flywheel diode 26b are connected to the sources of the first switching transistor 18a and the second switching transistor 18b, respectively, and the cathodes of the third and the fourth flywheel diodes are connected to the drains of the first and the second switching transistors, respectively. The third flywheel diode 26a and the fourth flywheel diode 26b are preferably body diodes of the first switching transistor 18a and the second switching transistor 18b, respectively. Alternatively, the flywheel diodes may be independent diode elements.

The resistances R1a and R2a connected to the drain and the source of the first output transistor 1a, respectively, the resistances R1b and R2b connected to the drain and the source to the second output transistor 1b, respectively, and the resistances R3 and R4 connected to the drain and the source of the auxiliary transistor 2, respectively, correspond to the resistances R1, R2, R3 and R4 in the seventh embodiment (FIG. 6). The resistance values of the resistance R3 and the resistance R4 are preferably set at n times as large as the resistances R1a and R1b and the resistances R2a and R2b, respectively.

The first differential amplifier 4a detects the potential of the node Pa, namely the junction point between the first output transistor 1a and the load 3 with respect to the node Q, and the second differential amplifier 4b detects the potential of the node Pb, namely the junction point between the second output transistor 1b and the load 3 with respect to the node Q.

The control circuit 20A controls either of the gate potentials of the first output transistor 1a or the second output transistor 1b so as to make it agree with the gate potential of the auxiliary transistor 2 according to the input from the outside 14, thereby controlling the first output current I1a or the second output current I1b as well as the adjusting current I2. In addition, controlling the current source 12v changes the control target value It of the adjusting current I2.

The switch control circuit 21A turns on or off the first switching transistor 18a or the switching transistor 18b in a manner synchronized with the operation of the control circuit 20A. Concretely, when the control circuit 20A turns on the first output transistor 1a and off the second output transistor 1b, the switch control circuit 21A turns off the first switching transistor 18a and on the second switching transistor 18b. Then, the first output current I1a from the first output transistor 18a flows through the load 3.

On the other hand, when the control circuit 20A turns off the first output transistor 1a and on the second output transistor 1b, the switch control circuit 21A turns on the first switching transistor 18a and off the second switching transistor 18b. Then, the second output current I1b from the second output transistor 18b flows through the load 3. In that manner, the current flowing through the load 3 is reversed.

The switch control circuit 21A selects and inputs either of the outputs of the first differential amplifier 4a or the second differential amplifier 4b in a manner synchronized with the above-described switching operation. According to the input from the differential amplifiers, the switch control circuit 21A controls each gate potential of the first switching transistor 18a and the second switching transistor 18b. Thereby, the first output current I1a or the second output current I1b is controlled.

Concretely, when the first output transistor 1a turns on, the switch control circuit 21A inputs the output of the first differential amplifier 4a. When the input indicates the positive increase of the potential of the node Pa with respect to the node Q, the switch control circuit 21A increases the gate potential of the second switching transistor 18b, thereby increasing the first output current I1a. On the other hand, when the input from the first differential amplifier 4a indicates the negative increase of the potential of the node Pa with respect to the node Q, the switch control circuit 21A lowers the gate potential of the first switching transistor 18a, thereby reducing the first output current I1a.

On the other hand, when the second output transistor 1b turns on, the switch control circuit 21A inputs the output of the second differential amplifier 4b. When the input indicates the positive increase of the potential of the node Pb with respect to the node Q, the switch control circuit 21A increases the gate potential of the first switching transistor 18a, thereby increasing the second output current I1b. On the other hand, when the input from the second differential amplifier 4b indicates the negative increase of the potential of the node Pb with respect to the node Q, the switch control circuit 21A lowers the gate voltage of the second switching transistor 18b, thereby reducing the second output current I1b.

As described above, the configuration of only the elements conducting currents by the control circuit 20A and the switch control circuit 21A is exactly the same as the fifth embodiment (FIG. 5A). Concretely, the configuration is identified as follows: When the first output transistor 1a and the second switching transistor 18b are on and the second output transistor 1b and the first switching transistor 18b are off, the first output transistor 1a, the second switching transistor 18b and the first differential amplifier 4a are regarded as the output transistor 1, the switching transistor 18 and the differential amplifier 4 of the fifth embodiment, respectively. Inversely, when the first out put transistor 1a and the second switching transistor 18b are off and the second output transistor 1b and the first switching transistor 18b are on, the second output transistor 1b, the first switching transistor 18a and the second differential amplifier 4b are regarded as the output transistor 1, the switching transistor 18 and the differential amplifier 4 of the fifth embodiment, respectively. Accordingly, the description of the fifth embodiment can be cited to the operation and the effects of the output control in the respective conducting configurations.

In the same manner as the diode 19 of the fifth embodiment, when the first switching transistor 18a or the second switching transistor 18b turn off, the first flywheel diode 25a or the second flywheel diode 25b turn on. At the same time, the fourth flywheel diode 26b or the third flywheel diode 26a also turn on, and thus, the power is regenerated in the direct voltage source 10 through the electrode 9. At the time of the regeneration, the second output transistor 1b may be turned on in a manner synchronized with turning off the second switching transistor 18b. Thereby, the power consumption at the time of output control can be reduced since the on-state voltage of the output transistor is generally lower than that of the flywheel diode.

In contrast with the configuration of the eighth embodiment, the configuration wherein each transistor is inversely connected between the drain and the source and the differential amplifiers and the flywheel diodes each have the opposite polarities, is substantially equivalent to that including the configuration of the sixth embodiment in the same manner as the eighth embodiment including the configuration of the fifth embodiment as described above.

Here, the operations of the control circuit 20A and the switch control circuit 21A need not be strictly simultaneous. For example, during the interval from the on-state of the first output transistor 1a to the on-state of the second output transistor 1b, the time when the first output transistor 1a and the second output transistor 1b both are off (dead time) may be set. Thereby, generating a surge current or the like owing to the switching of each transistor can be eliminated. In addition, in the above-described dead time, the period when the first switching transistor 18a and the second switching transistor 18b both are on may be set. During the period, energy stored in the load 3 can be taken out to the outside. However, the above-described output control is not provided during the dead time.

<<Ninth Embodiment>>

Figure 7B:
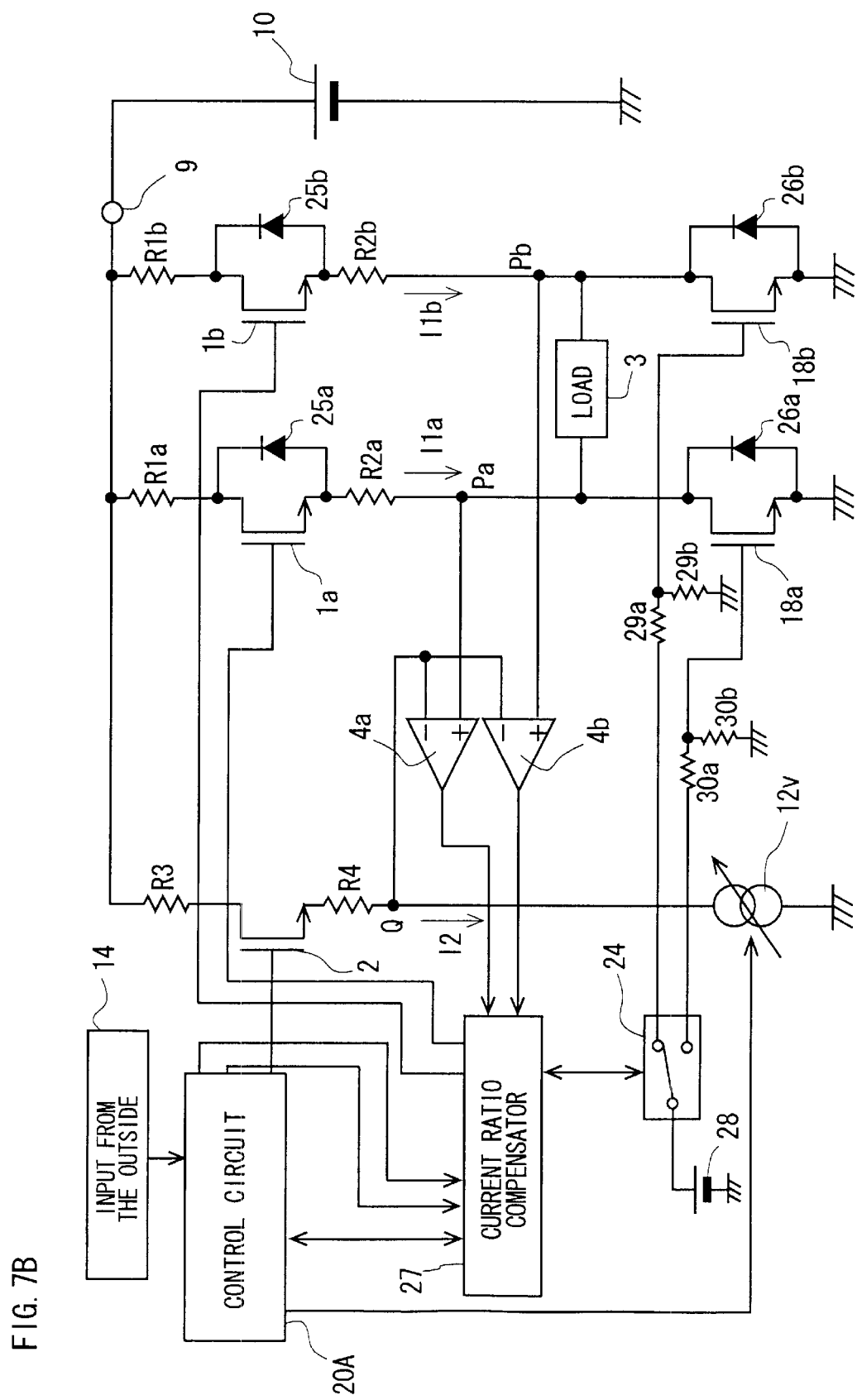
FIG. 7B is a circuit diagram of a power control device according to the ninth embodiment of the present invention.

FIG. 7B shows a circuit diagram according to the ninth embodiment of the present invention. In FIG. 7B, the same reference signs as FIG. 7A represent the same components as FIG. 7A, and the descriptions of the eighth embodiment are cited to the description of the same components as FIG. 7A.

The ninth embodiment is different from the eighth embodiment in the following configuration and operation.

The switch control circuit 24 selects either the first switching transistor 18a or the second switching transistor 18b in a manner synchronized with the control circuit 20A. A voltage is applied to the gate of the selected switching transistor, which voltage is the voltage of the power source 28 divided with the resistances 29a and 29b or the resistances 30a and 30b to a level turning on the selected switching transistor.

The current ratio compensator 27 inputs the control signal outputted to the first output transistor 1a and the second output transistor 1b from the control circuit 20A. The inputted control signal is converted in the following manner based on either output of the first differential amplifier 4a or the second differential amplifier 4b and then outputted to the first output transistor 1a and the second output transistor 1b.

When the first output transistor 1a is on, the current ratio compensator 27 inputs the output of the first differential amplifier 4a. When the input indicates a positive increase of the potential of the node Pa with respect to the node Q, the current ratio compensator 27 converts the control signal to the first output transistor 1a so as to increase the gate potential of the first output transistor 1a, thereby increasing the first output current I1a. On the other hand, when the input from the first differential amplifier 4a indicates a negative increase of the potential of the node Pa with respect to the node Q, the current ratio compensator 27 converts the control signal to the first output transistor 1a so as to lower the gate potential of the first output transistor 1a, thereby reducing the first output current I1a.

When the second output transistor 1b is on, the current ratio compensator 27 inputs the output of the second differential amplifier 4b. When the input indicates a positive increase of the potential of the node Pb with respect to the node Q, the current ratio compensator 27 coverts the control signal to the second output transistor 1b so as to increase the gate potential of the second output transistor 1b, thereby increasing the second output current I1b. On the other hand, when the input from the second differential amplifier 4b indicates a negative increase of the potential of the node Pb with respect to the node Q, the current ratio compensator 27 converts the control signal to the second output transistor 1b so as to lower the gate potential of the second output transistor 1b, thereby reducing the second output current I1b.

Though the ninth embodiment is different from the eighth embodiment in the above-described configuration and operation, the output control can be provided with a high precision in the same manner as the eighth embodiment.

If only the circuit elements conducting currents by the control circuit 20A and the switch control circuit 24 are seen, the ninth embodiment has a bridge of the same configuration as the fifth embodiment (FIG. 5A) in the same manner as the eighth embodiment. The current ratio compensator 27 changes the gate potential of the first output transistor 1a or the second output transistor 1b as described above, thereby controlling the transistors so as to adjust the potential difference between the node Pa or the node Pb and the node Q to be substantially 0. The control is exactly the same as the switch control circuit 21 over the switching transistor 18 in the fifth embodiment (FIG. 5A). When that control is a switching control such as a pulse width modulation (PWM) control in particular, the control is provided so as to hold in a time averaging manner the current value corresponding to a substantially zero value of the above-described potential difference between the node Pa or the node Pb and the node Q. By the above-described control of the current ratio compensator, the above-described bridge is balanced. Accordingly, the output control can be provide with the bridge balanced in the ninth embodiment in exactly the same manner as the fifth embodiment. Therefore, the precision of the output control in the ninth embodiment is improved in contrast with the conventional examples.

<<Tenth Embodiment>>

Figure 8A:
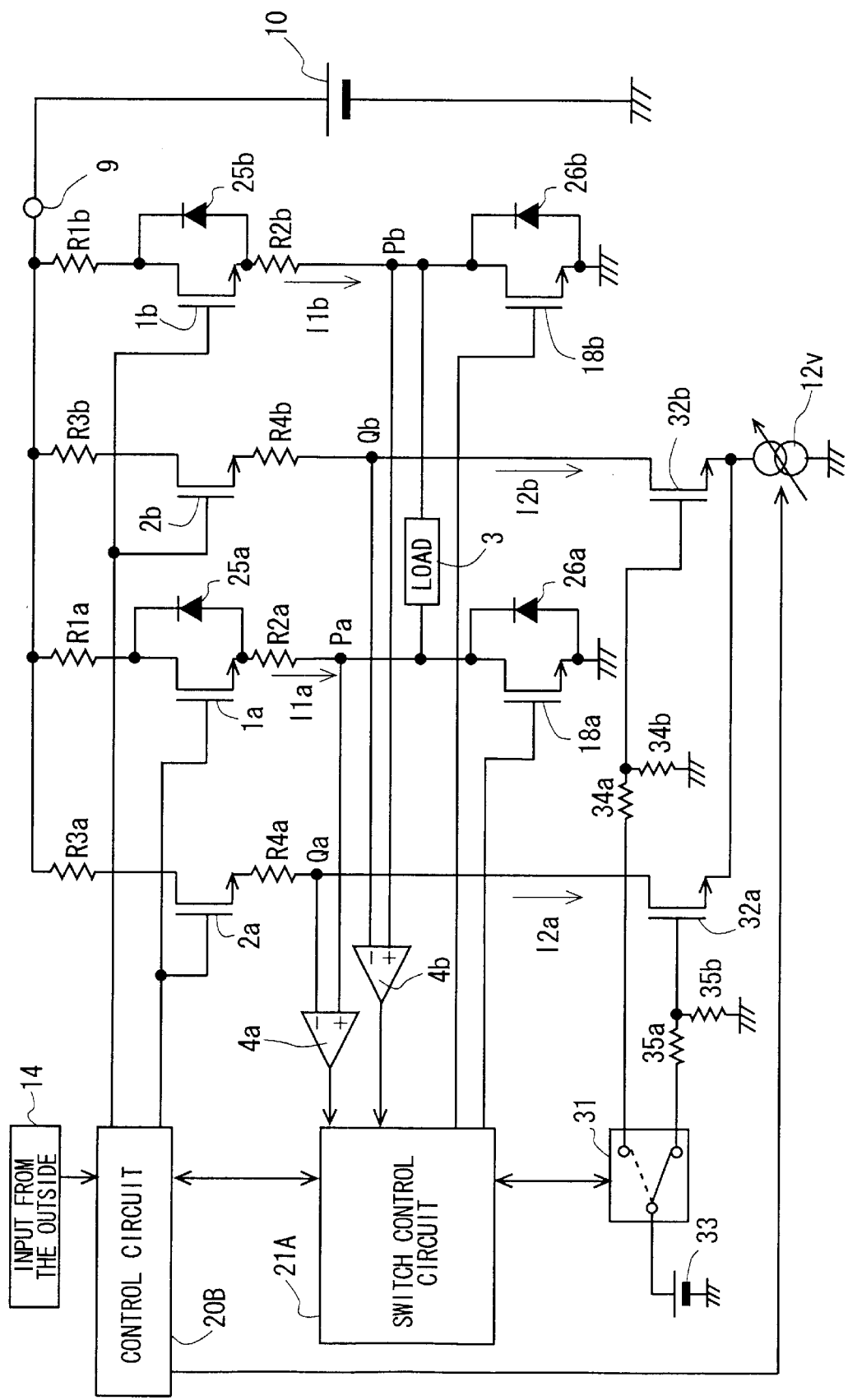
FIG. 8A is a circuit diagram of a power control device according to the tenth embodiment of the present invention.

FIG. 8A is a circuit diagram according to the tenth embodiment of the present invention. In FIG. 8A, the same reference signs as FIG. 7A represent the same components as FIG. 7A, and the descriptions of the eighth embodiment are cited to the description of the same components as FIG. 7A.

The tenth embodiment has, in addition to the configuration of the eight embodiment, the first auxiliary transistor 2a and the second auxiliary transistor 2b interlocking with the first output transistor 1a and the second output transistor 1b, respectively. In addition, the embodiment has the fourth switch 31 for switching to utilize the common current source 12v, the first auxiliary switching transistor 32a and the second auxiliary switching transistor 32b.

The first auxiliary transistor 2a and the second auxiliary transistor 2b are preferably n-channel MOSFETs, and have the drains connected to the electrode 9 and the sources connected to the drains of the first auxiliary switching transistor 32a and the second auxiliary switching transistor 32b, respectively. The first auxiliary switching transistor 32a and the second auxiliary switching transistor 32b are preferably n-channel MOSFETs.

The ratio I1a/I2a of the source current I1a of the first output transistor 1a to the source current I2a of the first auxiliary transistor 2a and the ratio I1b/I2b of the source current I1b of the second output transistor 1b to the source current I2b of the second auxiliary transistor 2b are set at a substantially constant value (hereinafter as follows: I1a/I2a=I1b/I2b=n) independent of the potentials of the three terminals of drain, source and gate when each potential of the three terminals is common between both transistors.

The control circuit 20A of the eighth embodiment controls the auxiliary transistor 2, the first output transistor 1a and the second output transistor 1b under the condition that the gate potential of the common auxiliary transistor 2 agrees with the gate potential of the first output transistor 1a or the second output transistor 1b. In contrast with the eighth embodiment, in the tenth embodiment, the gates of the first output transistor 1a and the second output transistor 1b are connected to the gates of the first auxiliary transistor 2a and the second auxiliary transistor 2b, respectively. Accordingly, the control circuit 20B is not required a function of making the gate potential of the auxiliary transistor agree with the respective gate potentials of the output transistors in contrast to the control circuit 20A of the eighth embodiment.

The switch 31 outputs the voltage of the power source 33 in a manner synchronized with the operation of the control circuit 20B to the first auxiliary switching transistor 32a when the first output transistor 1a is on, and to the second auxiliary switching transistor 32b when the second output transistor 1b is on, respectively. The output voltage of the power source 33 is divided with the resistances 34a and 34b or the resistances 35a and 35b to be the respective voltages sufficient to turn on the first auxiliary switching transistor 32a and the second auxiliary switching transistor 32b and then applied to the auxiliary switching transistors. Thus, the current source 12v controls the adjusting current I2a from the first auxiliary transistor 2a when the first output transistor 1a is on and the adjusting current I2b from the second auxiliary transistor 2b when the second output transistor 1b is on, so as to hold the respective adjusting currents at the control target value It. The control target value It changes according to a control signal from the control circuit 20.

The resistances R1a and R2b connected to the drain and the source of the first output transistor 1a, respectively, the resistances R1b and R2b connected to the drain and the source of the second output transistor 1b, respectively, the resistance R3a and R4a connected to the drain and the source of the first auxiliary transistor 2a, respectively, and the resistances R3b and R4b connected to the drain and the source of the second auxiliary transistor 2b, respectively, correspond to the resistances R1, R2, R3 and R4 in the seventh embodiment (FIG. 6). The resistance values of the resistance R3a, the resistance R3b, the resistance R4a and the resistance R4b are preferably set at n times as large as that of the resistance R1a, the resistance R1b, the resistance R2a and the resistance R2b, respectively.

In the eighth embodiment, the output transistors are controlled by, for example, the PWM control so that the output currents are maintained at the values corresponding to the case where each potential of the sources of the two different output transistors (the potential of the node Pa or the node Pb) substantially agrees with the potential of the source of the common auxiliary transistors (the potential of the node Q). On the other hand, in the tenth embodiment, the output transistors are controlled by, for example, the PWM control so that the output currents are maintained at the respective values corresponding to the cases where the potentials of the sources of the two different output transistors (the potentials of the node Pa and the node Pb) substantially agree with the potentials of the sources of the respective auxiliary transistors (the potentials of the node Qa and the node Qb).

The configuration including only the elements conducting currents by the control circuit 20B and the switch control circuit 21A is completely the same as the fifth embodiment (FIG. 5A). For example, when the first output transistor 1a, the first auxiliary transistor 2a and the second switching transistor 18b are on and the second output transistor 1b, the second auxiliary transistor 2b and the first switching transistor 18b are off, the first output transistor 1a, the first auxiliary transistor 1a and the second switching transistor 18b are regarded as the output transistor 1, the auxiliary transistor 2 and the switching transistor 18 of the fifth embodiment, respectively. Accordingly, the description of the fifth embodiment can be cited to the operation and the effects of the output control under the condition s elected with the above-described switches. The tenth embodiment has a considerably larger circuit scale than the eighth embodiment because of including more auxiliary transistors. In the tenth embodiment, however, the output transistor and the auxiliary transistor can be easily manufactured on the wafer very close to each other in the case of monolithically manufacturing as an integrated circuit. After all, as for a so-called matching of the elements, the tenth embodiment is superior to the eighth embodiment. In effect, in the output control, we can ignore errors due to non-uniformity of the temperature and the structure depending on the positions on the wafer.

<<Eleventh Embodiment>>

Figure 8B:
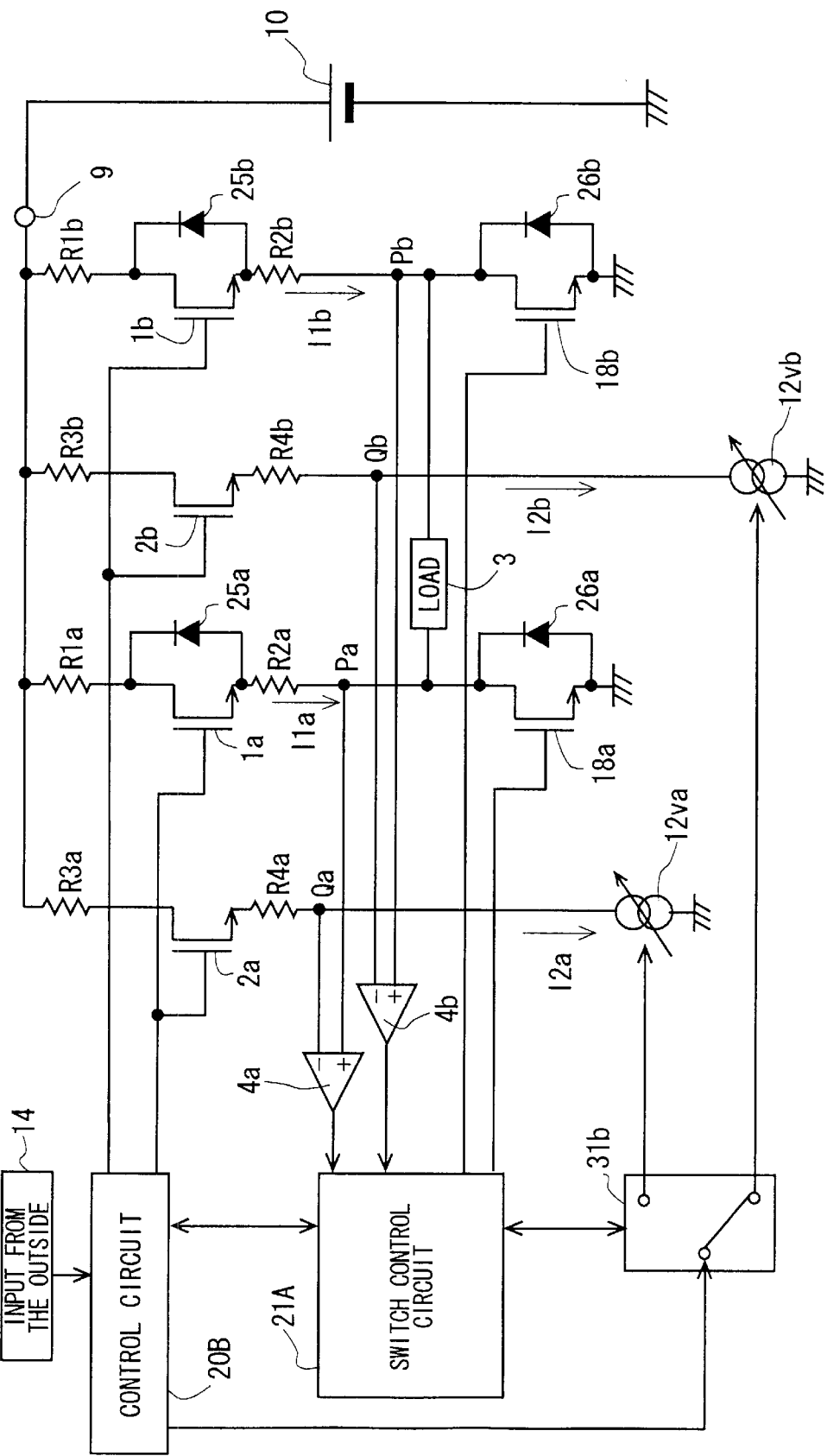
FIG. 8B is a circuit diagram of a power control device according to the eleventh embodiment of the present invention.

FIG. 8B is a circuit diagram according to the eleventh embodiment of the present invention. In FIG. 8B, the same reference signs as FIG. 8A represent the same components as FIG. 8A, and the descriptions of the tenth embodiment are cited to the description of the same components as FIG. 8A.

In the eleventh embodiment, current sources 12va and 12vb are used for the respective auxiliary transistors in contrast with the tenth embodiment wherein the single current source 12v is used in common. Switching those two current sources with the switch 31b is synchronized with the operation of the control circuit 20B. The operations other than that described above and the effects are exactly the same as the tenth embodiment.

<<Twelfth Embodiment>>

Figure 8C:
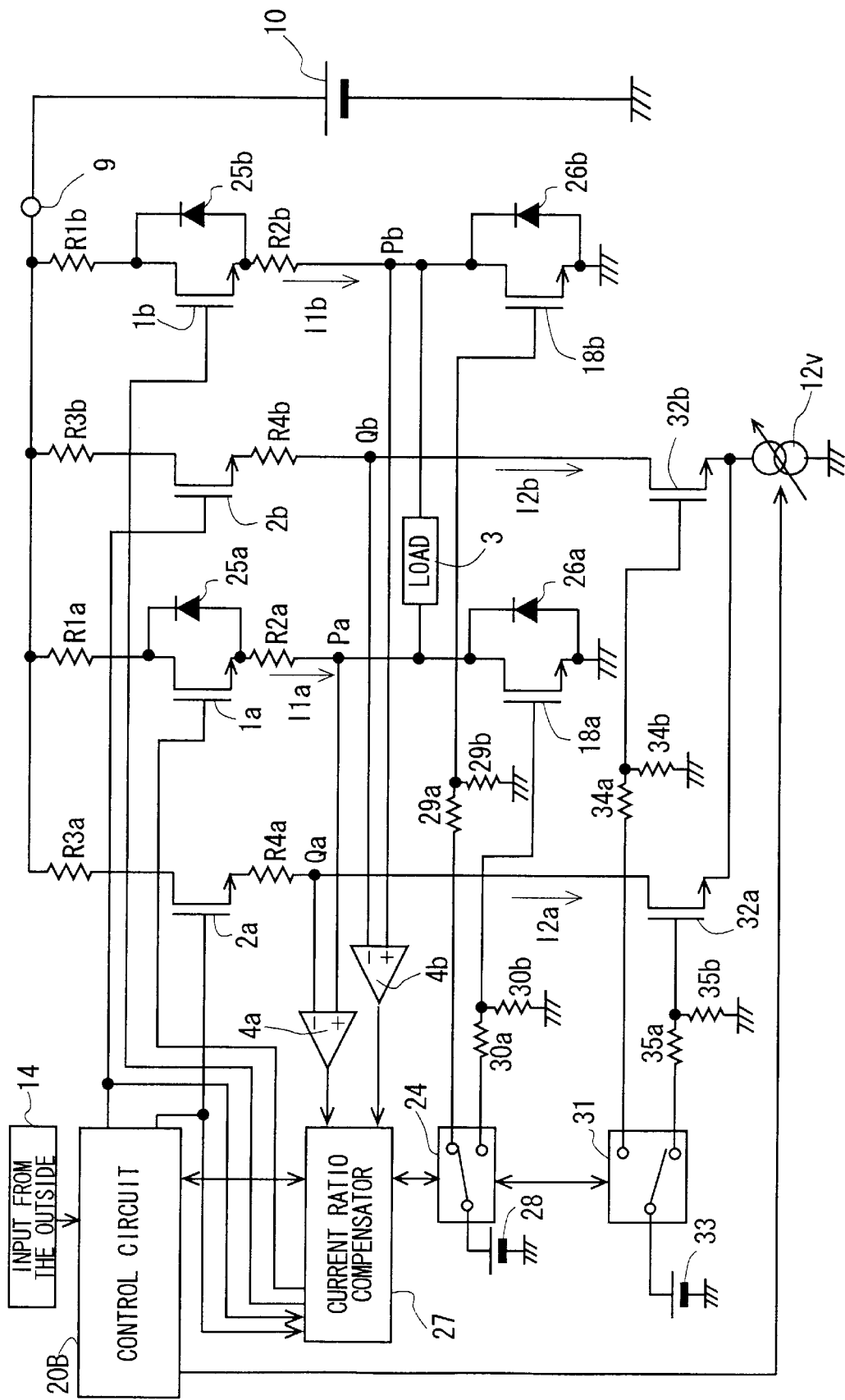
FIG. 8C is a circuit diagram of a power control device according to the twelfth embodiment of the present invention.

FIG. 8C is a circuit diagram according to the twelfth embodiment of the present invention. In FIG. 8C, the same reference signs as FIG. 7B or 8A represent the same components as FIG. 7B or 8A, and the descriptions of the ninth embodiment or the tenth embodiment are cited to the description of the same components as FIG. 7B or 8A.

In the twelfth embodiment, the gate potentials of the output transistors are controlled in the same manner as the ninth embodiment by the current ratio compensator 27 so that the bridge of the same configuration as the tenth embodiment is balanced. The operations other than that described above and the effects of the output control are exactly the same as the tenth embodiment.

<<Thirteenth Embodiment>>

Figure 8D:
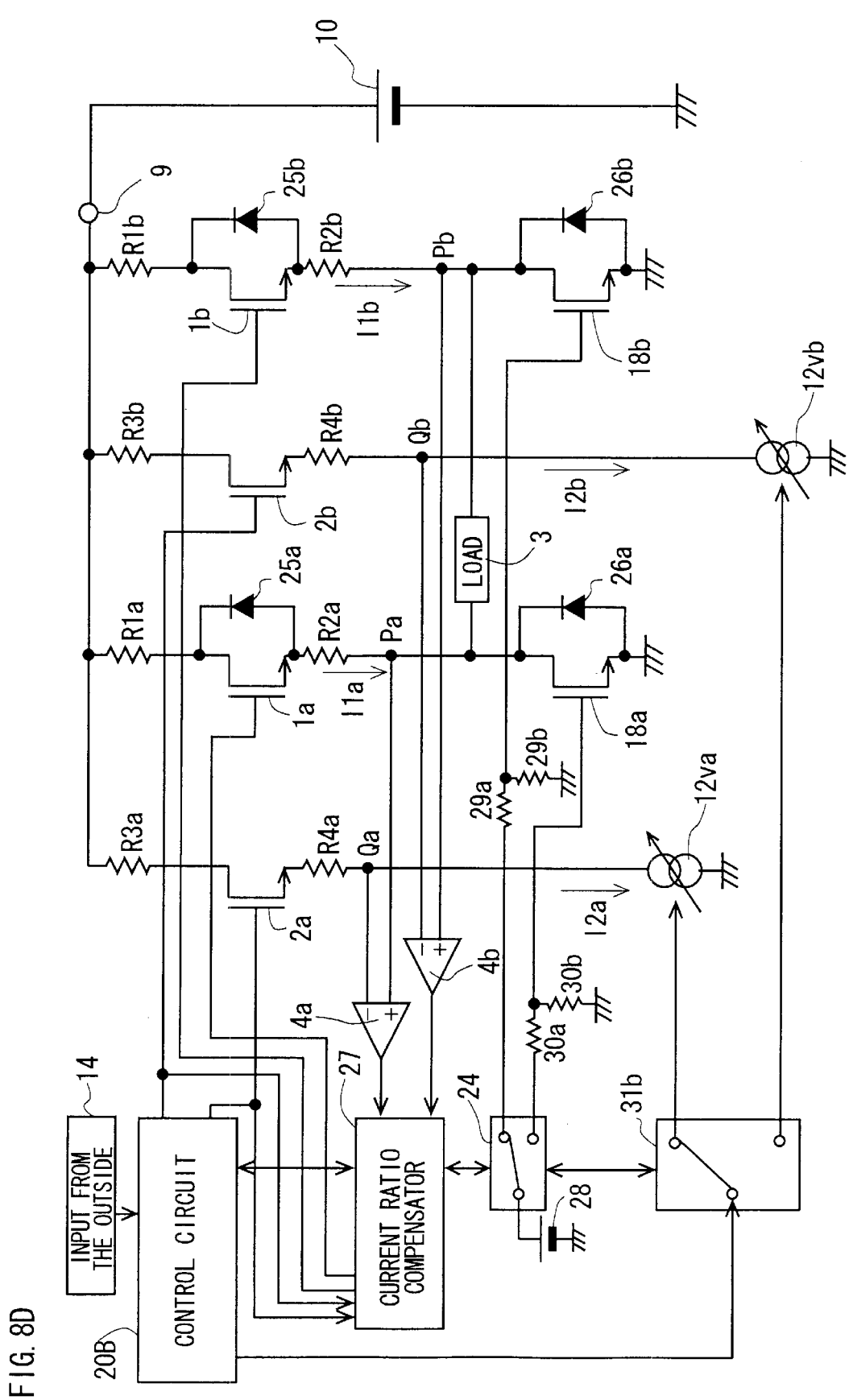
FIG. 8D is a circuit diagram of a power control device according to the thirteenth embodiment of the present invention.

FIG. 8D is a circuit diagram according to the thirteenth embodiment of the present invention. In FIG. 8D, the same reference signs as FIG. 7B or 8B represent the same components as FIG. 7B or 8B, and the descriptions of the ninth embodiment or the eleventh embodiment are cited to the description of the same components as FIG. 7B or 8B.

In the thirteenth embodiment, the current ratio compensator 27 controls the gate potentials of the output transistors in the same manner as the ninth embodiment, thereby making the bridge of the same configuration as the eleventh embodiment keep the balance. The operations other than that described above and the effects of the output control are exactly the same as the eleventh embodiment.

<<Fourteenth Embodiment>>

Figure 9A:
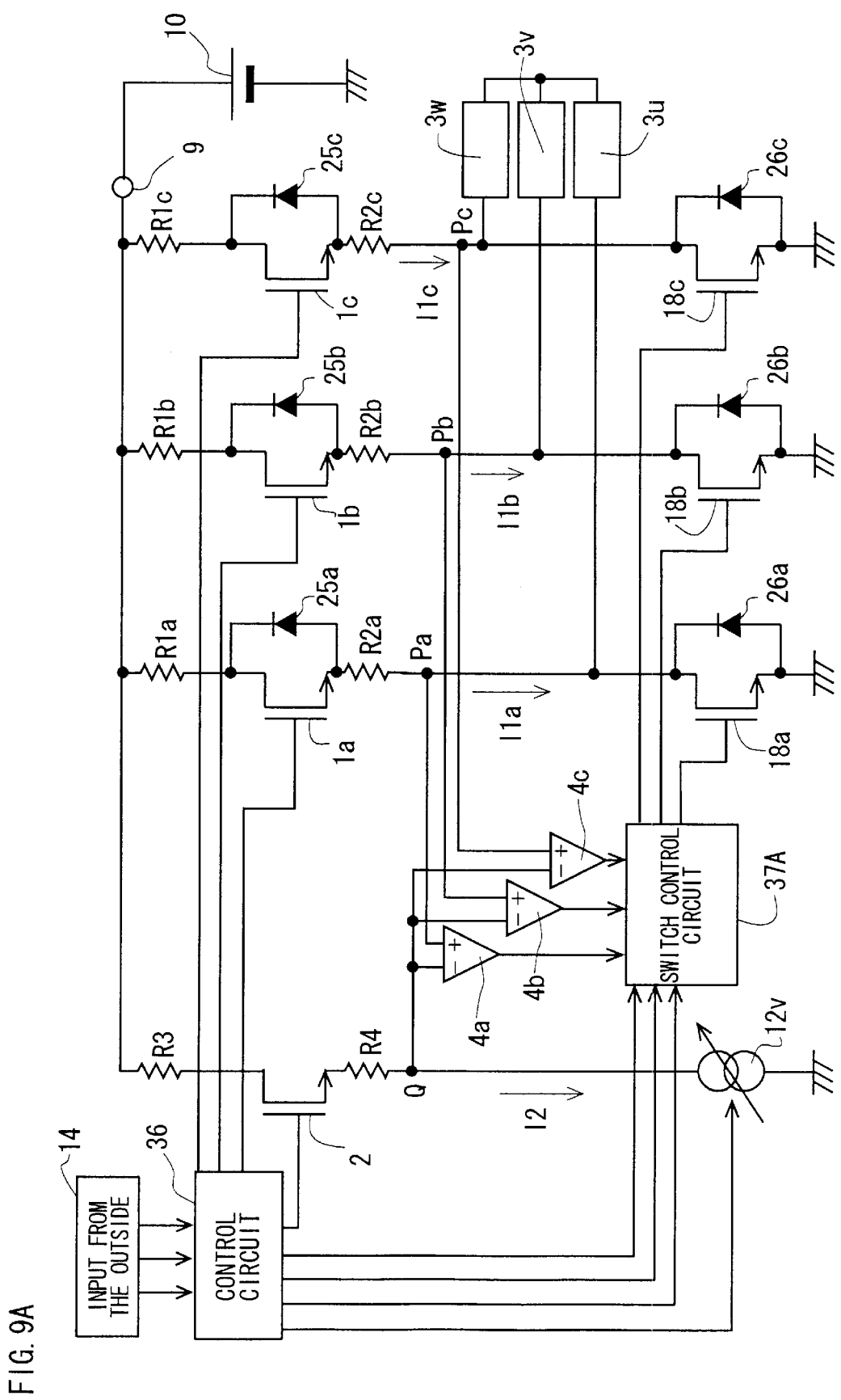
FIG. 9A is a circuit diagram of a power control device according to the fourteenth embodiment of the present invention.

FIG. 9A is a circuit diagram according to the fourteenth embodiment of the present invention. In FIG. 9A, the same reference signs as FIG. 7A represent the same components as FIG. 7A, and the descriptions of the eighth embodiment are cited to the description of the same components as FIG. 7A.

The fourteenth embodiment has three pairs each of which comprises the elements corresponding to the output transistor 1, the switching transistor 18 and the differential amplifier 4 in the fifth embodiment (FIG. 5A) and is used, for example, as a driver of three-phase motor. The pairs are arranged as follows:

A u-phase load $3u$, a v-phase load $3v$ and a w-phase load $3w$ share one end so as to form a so-called Y connection. Those loads Correspond to, for example, a stator winding of three-phase motor.

The first output transistor $1a$, the second output transistor $1b$ and the third output transistor $1c$ each correspond to the output transistor 1 of the fifth embodiment, are preferably n-channel MOSFETs, and have the drains connected to the electrode 9 and the sources each connected to the u-phase load $3u$, the v-phase load $3v$ and the w-phase load $3w$, respectively. In addition, the anodes of the first flywheel diode $25a$, the second flywheel diode $25b$ and the third flywheel diode $25c$ are connected to the sources of the first output transistor $1a$, the second output transistor $1b$ and the third output transistor $1c$, respectively, and the cathode of the flywheel diodes are connected to the drains of the respective output transistors. The flywheel diodes are preferably body diodes of the respective output transistors connected in parallel. Alternatively, the flywheel diodes each may be an independent diode element.

The ratio $I1a/I2$ of the source current $I1a$ of the first output transistor $1a$ to the source current $I2$ of the auxiliary transistor 2, the ratio $I1b/I2$ of the source current $I1b$ of the second output transistor $1b$ to the source current $I2$ of the auxiliary transistor 2 and the ratio $I1c/I2$ of the source current $I1c$ of the third output transistor $1c$ to the source current $I2$ of the auxiliary transistor 2 are designed so as to be substantially constant (hereinafter as follows: $I1a/I2=I1b/I2=I1c/I2=n$) independently of the potentials of the three terminals of drain, source and gate when each potential of the three terminals is common between both transistors.

The first switching transistor $18a$, the second switching transistor $18b$ and the third switching transistor $18c$ each correspond to the switching transistor 18 of the fifth embodiment, and are preferably n-channel MOSFETs. The drains of first switching transistor $18a$, the second switching transistor $18b$ and the third switching transistor $18c$ are connected to the sources of the first output transistor $1a$, the second output transistor $1b$ and the third output transistor $1c$, respectively, and the sources of the output transistors are grounded. In addition, the anodes of the fourth flywheel diode $26a$, the fifth flywheel diode $26b$ and the sixth flywheel diode $26c$ are connected to the sources of the first switching transistor $18a$, the second switching transistor $18b$ and the third switching transistor $18c$, respectively, and the cathode of the flywheel diodes are connected to the drains of the switching transistors. The flywheel diodes are preferably body diodes of the respective switching transistors connected in parallel. Alternatively, the flywheel diodes each may be an independent diode element.

The resistances $R1a$ and $R2a$ connected to the drain and the source of the first output transistor $1a$, respectively, the resistances $R1b$ and $R2b$ connected to the drain and the source of the second output transistor $1b$, respectively, the resistances $R1c$ and $R2c$ connected to the drain and the source of the third output transistor $1c$, respectively, and the resistances R3 and R4 connected to the drain and the source of the auxiliary transistor 2, respectively, correspond to the resistances R1, R2, R3 and R4 in the seventh embodiment (FIG. 6). The resistance values of the resistance R3 and the resistance R4 are preferably set at n times as large as that of the resistances $R1a$, $R1b$ and $R1c$ and the resistances $R2a$, $R2b$ and $R2c$, respectively.

The first differential amplifier $4a$ detects the potential of the node Pa, namely the junction point between the first output transistor $1a$ and the u-phase load $3u$ with respect to the node Q, the second differential amplifier $4b$ detects the potential of the node Pb, namely the junction point between the second output transistor $1b$ and the v-phase load $3v$ with respect to the node Q, and the third differential amplifier $4c$ detects the potential of the node Pc, namely the junction point between the third output transistor $1c$ and the w-phase load $3w$ with respect to the node Q and the differential amplifiers output voltages proportional to the respective potential differences including the signs. Here, the outputted voltages may be binary merely based on positive or negative of the above-described potential differences.

The control circuit 36 outputs a control signal to each gate of the output transistors so as to turn on only one of the three output transistors and off the others based on the phase information of u-phase, v-phase and w-phase inputted from the outside 14.

The control circuit 36 controls the current source $12v$ based on the input from the outside 14 and sets the control target value of the adjusting current I2.

In addition, the control circuit 36 outputs to the switch control circuit 37A respective control signals indicating the directions for the three switching transistors to turn on or off. Here, for example, in the case of operating as a driver of three-phase motor, the on-off control over the three switching transistors is provided so that two of the three switching transistors are on at the current-carrying angle of 120° or more and only one of them is on at the current-carrying angle of 120° or less. In addition, for example, in the case of u-phase drive with the first output transistor $1a$ on, the distribution of the currents flowing substantially through the second switching transistor $18b$ and the third switching transistor $18c$ is set depending on the current-carrying angle and the rotation direction and the phase of rotor.

The switch control circuit 37A converts the control signals from the control circuit 36 and outputs the converted control signals to the respective switching transistors so as to turn off the on-state switching transistor when the source potential of the on-state output transistor is lower than the source potential of the auxiliary transistor 2. Here, the above-described conversion of the control signal can be the same as the fifth embodiment as follows: For example, during the u-phase drive with only the first output transistor 1a on, the output current flows through either or both of the paths, the load 3u—the load 3v—the second switching transistor 18b and the load 3u—the load 3w—the third switching transistor 18c. Then, the first output transistor 1a is regarded as the output transistor 1 of the fifth embodiment (FIG. 5A), the composite of the load 3u, the load 3v and the load 3w is regarded as the load 3 of the fifth embodiment and the composite of the second switching transistor 18b and the third switching transistor 18c is regarded as the switching transistor 18 of the fifth embodiment. Accordingly, the bridge consisting of the four branches of the first output transistor 1a, the auxiliary transistor 2, the current source 12v and the composite of the three loads and the two switching transistors has exactly the same configuration as the bridge of the fifth embodiment. Then, in the same manner as the fifth embodiment, the on-off control over the two switching transistors changes the substantially equivalent impedance of the composite of the switching transistors. Thereby, in the same manner as the fifth embodiment, the output current can be maintained at the value corresponding to a substantial zero value of the potential difference between the node Pa and the node Q in a time-averaging manner so that the above-described bridge can be balanced. In addition, the output control with the bridge circuit balanced is the same as the fifth embodiment and therefore, the description of the fifth embodiment can be cited to the operation and the effects of the fourteenth embodiment.

Here, in the same manner as the eighth embodiment, for example, when both of the second switching transistor 18b and the third switching transistor 18c are off in the u-phase drive, the fourth flywheel diode 26a, the second flywheel diode 25b and the third flywheel diode 25c turn on. Then, power is regenerated in the direct voltage source 10 through the electrode 9. During the regeneration, the second output transistor 1b or the third output transistor 1c may be turned on in a manner synchronized with turning off the second switching transistor 18b or the third switching transistor 18c. Thereby, the power consumption during the output control can be reduced since the on-state voltage of the output transistor is generally lower than that of the flywheel diode.

The output current flows through either or both of the paths, the load 3v—the load 3u—the first switching transistor 18a and the load 3v—the load 3w—the third switching transistor 18c during the v-phase drive with only the second output transistor 1b on. Then, the second output transistor 1b is regarded as the output transistor 1 of the fifth embodiment (FIG. 5A), the composite of the load 3u, the load 3v and load 3w is regarded as the load 3 of the fifth embodiment and the composite of the first switching transistor 18a and the third switching transistor 18c is regarded as the switching transistor 18 of the fifth embodiment. Accordingly, the bridge consisting of the four branches of the second output transistor 1b, the auxiliary transistor 2, the current source 12v and the composite of the three loads and the two switching transistors has exactly the same configuration as that of the bridge in the fifth embodiment. The bridge is balanced by controlling the first switching transistor 18a or the third switching transistor 18c so as to adjust the potential difference between the node Pb and the node Q to zero based on the output of the second differential amplifier 4b.

The output current flows through either or both of the paths, the load 3w—the load 3u—the first switching transistor 18a and the load 3w—the load 3v—the second switching transistor 18b during the w-phase drive with only the third output transistor 1c on. Then, the third output transistor 1c is regarded as the output transistor 1 of the fifth embodiment (FIG. 5A), the composite of the load 3u, the load 3v and the load 3w is regarded as the load 3 of the fifth embodiment and the composite of the first switching transistor 18a and the second switching transistor 18b is regarded as the switching transistor 18 of the fifth embodiment. Accordingly, the bridge consisting of the four branches of the third output transistor 1c, the auxiliary transistor 2, the current source 12v and the composite of the three loads and the two switching transistors has exactly the same configuration as the bridge of the fifth embodiment.

The bridge is balanced by controlling the first switching transistor 18a or the second switching transistor 18b so as to adjust the potential difference between the node Pc and the node Q to zero based on the output of the third differential amplifier 4c.

As described above, the same output control as the fifth embodiment is possible during the u-phase, v-phase and w-phase drive.

<<Fifteenth Embodiment>>

Figure 9B:
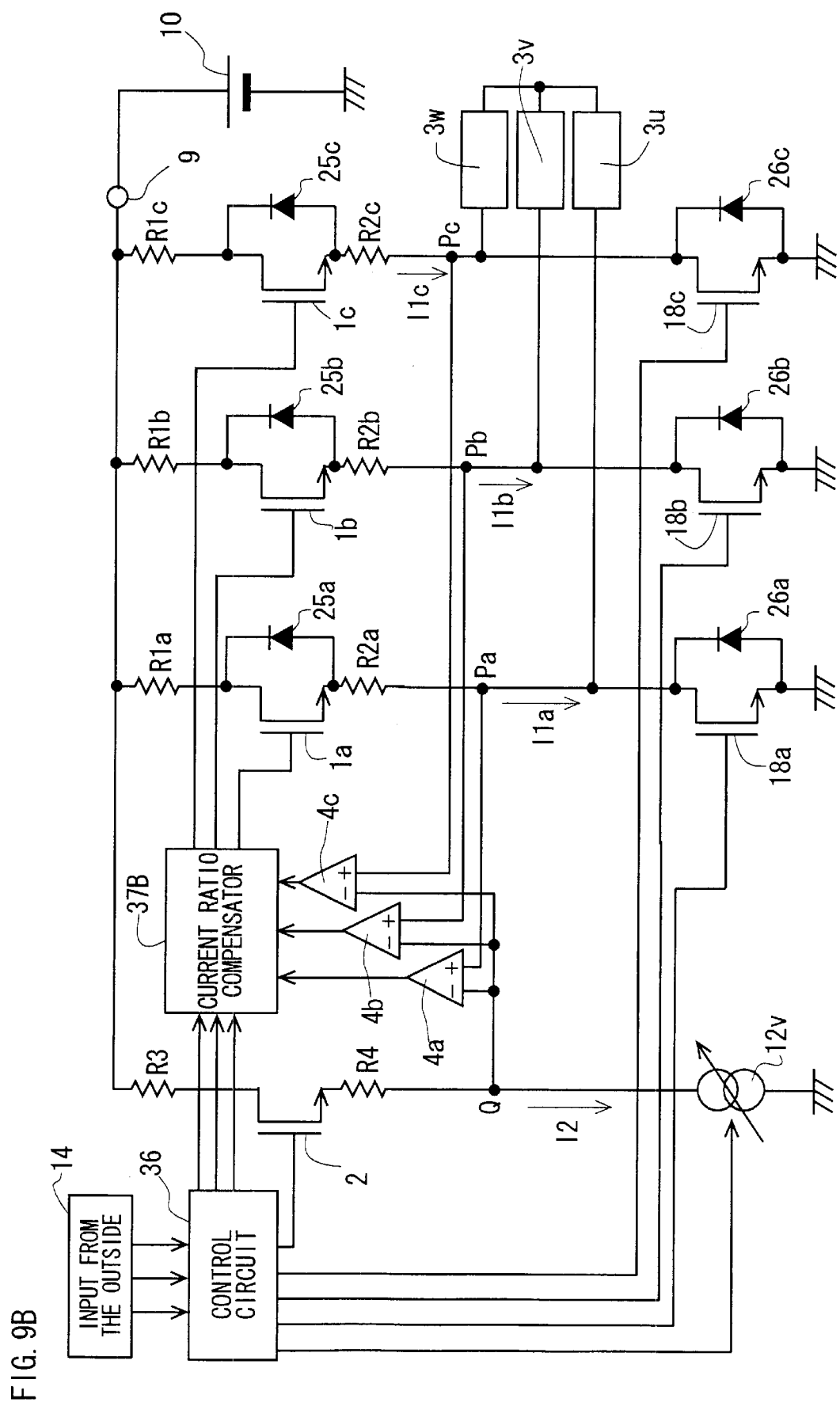
FIG. 9B is a circuit diagram of a power control device according to the fifteenth embodiment of the present invention.

FIG. 9B is a circuit diagram according to the fifteenth embodiment of the present invention. In FIG. 9B, the same reference signs as FIG. 9A represent the same components as FIG. 9A, and the descriptions of the fourteenth embodiment are cited to the description of the same components as FIG. 9A.

The fifteenth embodiment is different from the fourteenth embodiment only in the point that the switch control circuit 37A of the fourteenth embodiment is replaced with the switch control circuit 37B for converting the outputs to the respective output transistors from the control circuit 36.

The current ratio compensator 37B converts control signals from the control circuit 36 and outputs the converted control signals to the respective output transistors so as to turn off the on-state switching transistors based on the inputs from the three differential amplifiers 4a, 4b and 4c when the source potentials of the on-state output transistors are lower than the source potential of the auxiliary transistor 2. Here, the control signals are conversed as follows: For example, during the u-phase drive with only the first output transistor 1a on, the output current flows through either or both of the paths, the load 3u—the load 3v—the second switching transistor 18b and the load 3u—the load 3w—the third switching transistor 18c. At that time, the four branches of the first output transistor 1a, the auxiliary transistor 2, the current source 12v, the composite of the three loads and the two switching transistors form a bridge. Then, the on-off control over the first output transistor 1a by the current ratio compensator 37B changes the equivalent impedance of the composite of the output transistors. Thereby, the output current is maintained in a time-averaging manner at the value corresponding to a substantial zero value of the potential difference between the node Pa and the node Q so that the above-described bridge can be balanced. When the bridge is balanced in such a manner, the ratio I1a/I2 of the first output current I1a outputted from the first output transistor 1a to the adjusting current I2 outputted from the auxiliary circuit 2 is constant substantially independent of temperature change and the potentials of the three terminals of the first output transistor 1a and the like. Accordingly, when the control circuit 36 controls the adjusting current I2 with a high precision with the auxiliary transistor 2, the first output current I1a can also be controlled with a high precision.

In the same way as the eighth embodiment, for example, when both of the second switching transistor 18b and the third switching transistor 18*c* are off during the u-phase drive, the fourth flywheel diode 26*a*, the second flywheel diode 25*b* and the third flywheel diode 25 turn on. Then, power is regenerated in the direct voltage source 10 through the electrode 9. During the regeneration, the second output transistor 1*b* or the third output transistor 1*c* may be turned on in a manner synchronized with turning off the second switching transistor 18*b* or the third switching transistor 18*c*. Thereby, the power consumption in the output control can be reduced since the on-state voltage of the output transistor is generally lower than that of the flywheel diode.

During the v-phase drive with only the second output transistor 1*b* on, the output current flows through either or both of the paths, the load 3*v*—the load 3*u*—the first switching transistor 18*a* and the load 3*v*—the load 3*w*—the third switching transistor 18*c*. Then, the bridge consisting of the four branches of the second output transistor 1*b*, the auxiliary transistor 2, the current source 12*v* and the composite of the three loads and the two switching transistors is balanced by controlling the second output transistor 1*b* so as to adjust the potential difference between the node Pb and the node Q to zero based on the output of the second differential amplifier 4*b*.

During the w-phase drive with only the third output transistor 1*c* on, the output current flows through either or both of the paths, the load 3*w*—the load 3*u*—the first switching transistor 18*a* or the load 3*w*—the load 3*v*—the second switching transistor 18*b*. Then, the bridge consisting of the four branches of the third output transistor 1*c*, the auxiliary transistor 2, the current source 12*v* and the composite of the three loads and the two switching transistors is balanced by controlling the third output transistor 1*c* so as to adjust the potential difference between node Pb and node Q to zero based on the output of the third differential amplifier 4*c*.

As described above, during the drive in the u-phase, v-phase and w-phase, the above-described bridge can be balanced independent of temperature change and the potentials of the three terminals of the output transistors. Therefore, the output control with a higher precision than a conventional example is possible since the ratio of the output current to the adjusting current is controlled to be constant.

<<Sixteenth Embodiment>>

Figure 10A:
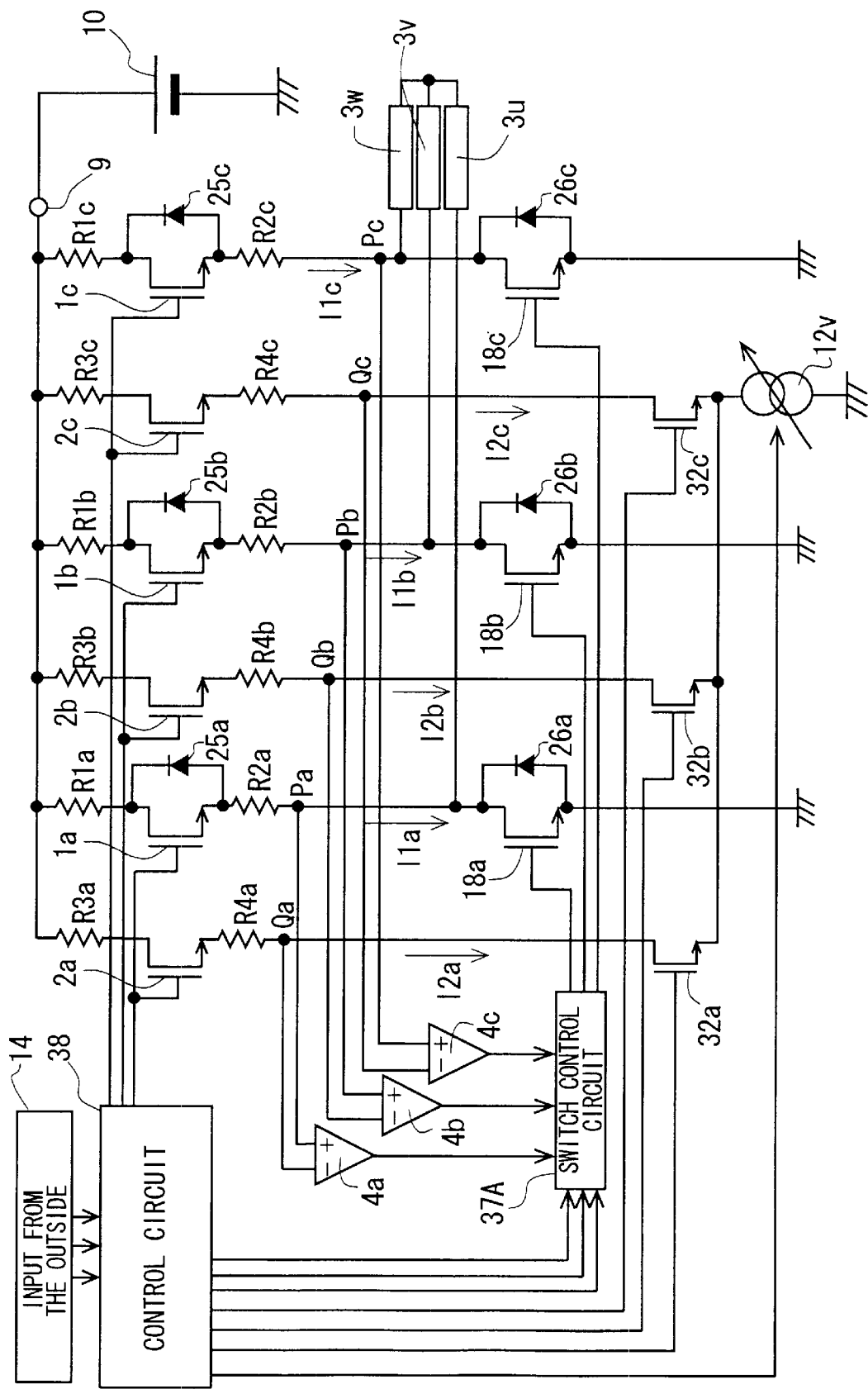
FIG. 10A is a circuit diagram of a power control device according to the sixteenth embodiment of the present invention.

FIG. 10A is a circuit diagram according to the sixteenth embodiment of the present invention. In FIG. 10A, the same reference signs as FIG. 9A represent the same components as FIG. 9A, and the descriptions of the fourteenth embodiment are cited to the description of the same components as FIG. 9A.

The sixteenth embodiment, in addition to the configuration of the fourteenth embodiment, has the first auxiliary transistor 2*a*, the second auxiliary transistor 2*b* and the third auxiliary transistor 2*c* which interlock with the first output transistor 1*a*, the second output transistor 1*b* and the third output transistor 1*c*, respectively. In addition, the embodiment has the first auxiliary switching transistor 32*a*, the second auxiliary switching transistor 32*b* and the third auxiliary switching transistor 32*c* for switching so as to utilize the common current source 12*v*.

The first auxiliary transistor 2*a*, the second auxiliary transistor 2*b* and the third auxiliary transistor 2*c* are preferably n-channel MOSFETs, and have the drains connected to the electrode 9 and the sources connected to the drains of the first auxiliary switching transistor 32*a*, the second auxiliary switching transistor 32*b* and the third auxiliary switching transistor 32*c*, respectively. The first auxiliary switching transistor 32*a*, the second auxiliary switching transistor 32*b* and the third auxiliary switching transistor 32*c* are preferably n-channel MOSFETs. The sources of the auxiliary switching transistors each are connected to the current source 12*v*.

The ratio I1$a$/I2$a$ of the source current I1$a$ of the first output transistor 1*a* to the source current I2$a$ of the first auxiliary transistor 2*a*, the ratio I1$b$/I2$b$ of the source current I1$a$ of the second output transistor 1*b* to the source current I2$b$ of the second auxiliary transistor 2*b* and the ratio I1$c$/I2$c$ of the source current I1$c$ of the third output transistor 1*c* to the source current I2$c$ of the third auxiliary transistor 2*c* are set so as to be substantially constant (herein after as follows: I1$a$/I2$a$=I1$b$/I2$b$=I1$c$/I2$c$=n) when each potential of the three terminals of drain, source and gate is common between the output transistors and the auxiliary transistors.

The auxiliary switching transistors each turn on and off in accordance with a control signal from the control circuit 38 so as to conduct the respective adjusting currents to flow through the current source 12*v*. The current source 12*v* controls the adjusting current I2$a$ through the first auxiliary transistor 2*a* when the first output transistor 1*a* is on, the adjusting current I2$b$ through the second auxiliary transistor 2*b* when the second output transistor 1*b* is on and the adjusting current I2$c$ through the third auxiliary transistor 2*c* when the third output transistor 1*c* is on, respectively, so as to hold the adjusting currents at the control target value It. The control target value It changes in accordance with a control signal from the control circuit 38.

The resistances R1$a$ and R2$a$ connected to the drain and the source of the first output transistor 1*a*, respectively, the resistances R1$b$ and R2$b$ connected to the drain and the source to the second output transistor 1*b*, respectively, the resistances R1$c$ and R2$c$ connected to the drain and the source of the third output transistor 1*c*, respectively, the resistances R3$c$ and R4$c$ connected to the drain and the source of the first auxiliary transistor 2*a*, respectively, the resistances R3$b$ are R4$b$ connected to the drain and the source of the second auxiliary transistor 2*b*, respectively, and the resistances R3$c$ and R4$c$ connected to the drain and the source of the third auxiliary transistor 2*c*, respectively, correspond to the resistances R1, R2, R3 and R4 in the seventh embodiment (FIG. 6). In addition, preferably, the resistance values of the resistance R3$a$, the resistance R3$b$, the resistance R3$c$, the resistance R4$a$, the resistance R4$b$ and the resistance R4$c$ are set at n times as large as that of the resistance R1$a$, the resistance R1$b$, the resistance R1$c$, the resistance R2$a$, the resistance R2$b$ and the resistance R2$c$, respectively.

The control circuit 38, in addition to the function of the control circuit 36 of the fourteenth embodiment, outputs control signals for directing to turn on and off the three auxiliary switching transistors. The control signals indicate the directions for the first auxiliary switching transistor 32*a* to turn on and for the other two auxiliary switching transistors to turn off during the u-phase drive, the directions for the second auxiliary switching transistor 32*b* to turn on and for the other two auxiliary switching transistors to turn off during the v-phase drive, and the directions for the third auxiliary switching transistor 32*c* to turn on and for the other two auxiliary switching transistors to turn off during the w-phase drive, respectively.

In the fourteenth embodiment, the source potentials of the three different output transistors (the potentials of the nodes Pa, Pb and Pc) each are controlled to agree with the source potential of the common auxiliary transistor (the potential of the node Q). On the other hand, in the sixteenth embodiment, the source potentials of the three different output transistors (the potentials of the nodes Pa, Pb and Pc) are controlled to agree with the source potentials of the respective auxiliary transistors (the potentials of the nodes Qa, Qb and Qc, respectively).

The configuration including only the conducting elements in the same manner as the fourteenth embodiment is exactly the same as the fifth embodiment (FIG. 5A). Accordingly, the description of the fifth embodiment can be cited to the operation and the effects of the output control under the condition selected by the above-described switches.

The sixteenth embodiment is a considerably larger-scale circuit than that of the fourteenth embodiment because of including more auxiliary transistors. In the sixteenth embodiment, however, the output transistors and the auxiliary transistors are easy to manufacture very close to each other on the wafer in the case of monolithically manufacturing as an integrated circuit. After all, the sixteenth embodiment is superior to the fourteenth embodiment in a so-called matching of the elements. In effect, in the output control, we can ignore errors due to the non-uniformity of the temperature and the structure on the wafer.

<<Seventeenth Embodiment>>

Figure 10B:
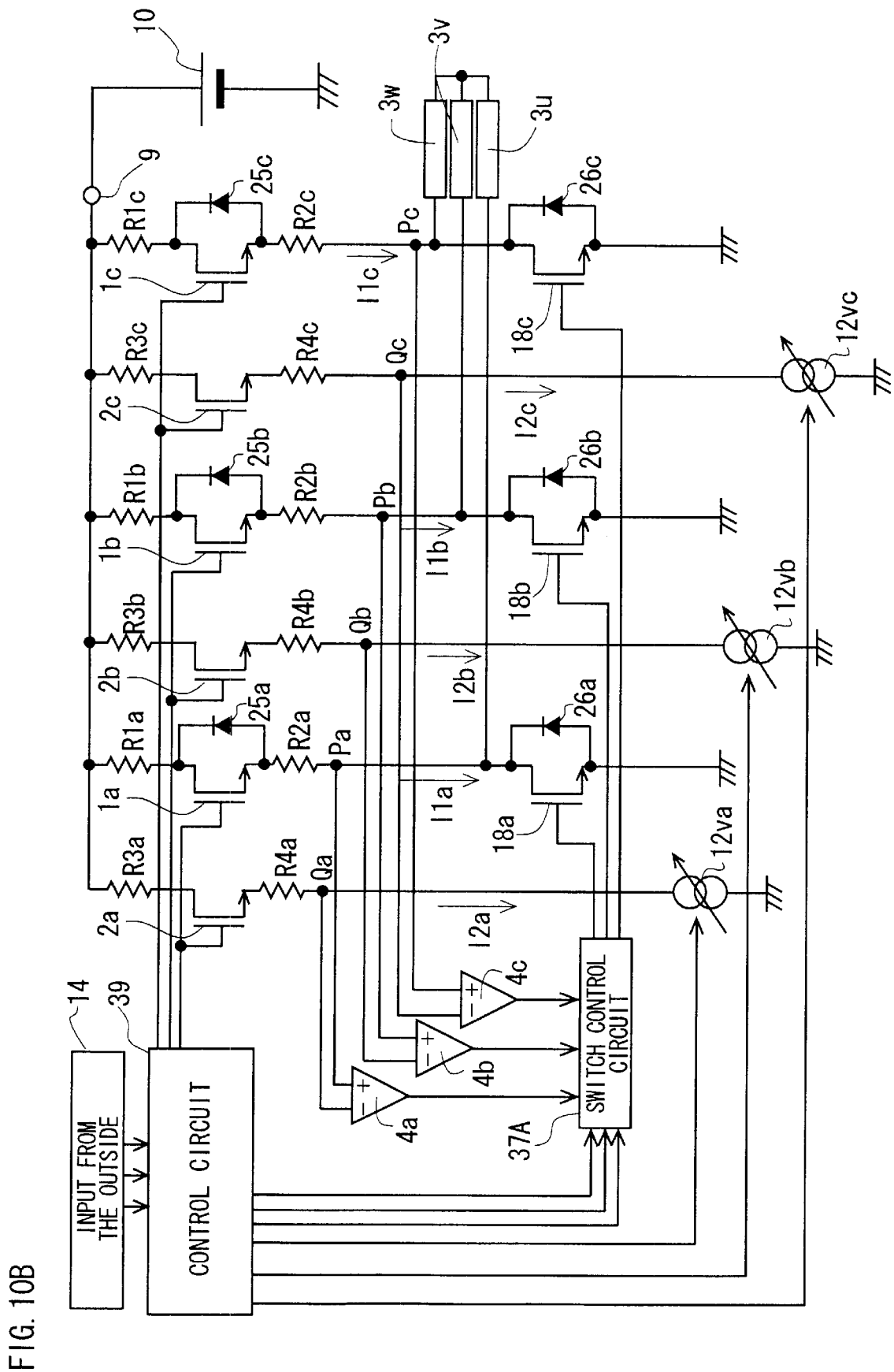
FIG. 10B is a circuit diagram of a power control device according to the seventeenth embodiment of the present invention.

FIG. 10B is a circuit diagram according to the seventeenth embodiment of the present invention. In FIG. 10B, the same reference signs as FIG. 10A represent the same components as FIG. 10A, and the descriptions of the sixteenth embodiment are cited to the description of the same components as FIG. 10A.

In the seventeenth embodiment, different current sources 12va, 12vb and 12vc are used for the respective auxiliary transistors, in contrast with the sixteenth embodiment wherein the single current source 12v is used in common. Here, the control circuit 39 outputs control signals for setting the control target values of the respective current sources. The control circuit 39 has the same configuration as that of the control circuit 38 of the sixteenth embodiment except for a point of being free from the control over the three auxiliary switching transistors and a point of outputting the control signals to the three current sources.

The operation and the effects of the seventeenth embodiment are exactly the same as the sixteenth embodiment except for the above-described points.

<<Eighteenth Embodiment>>

Figure 10C:
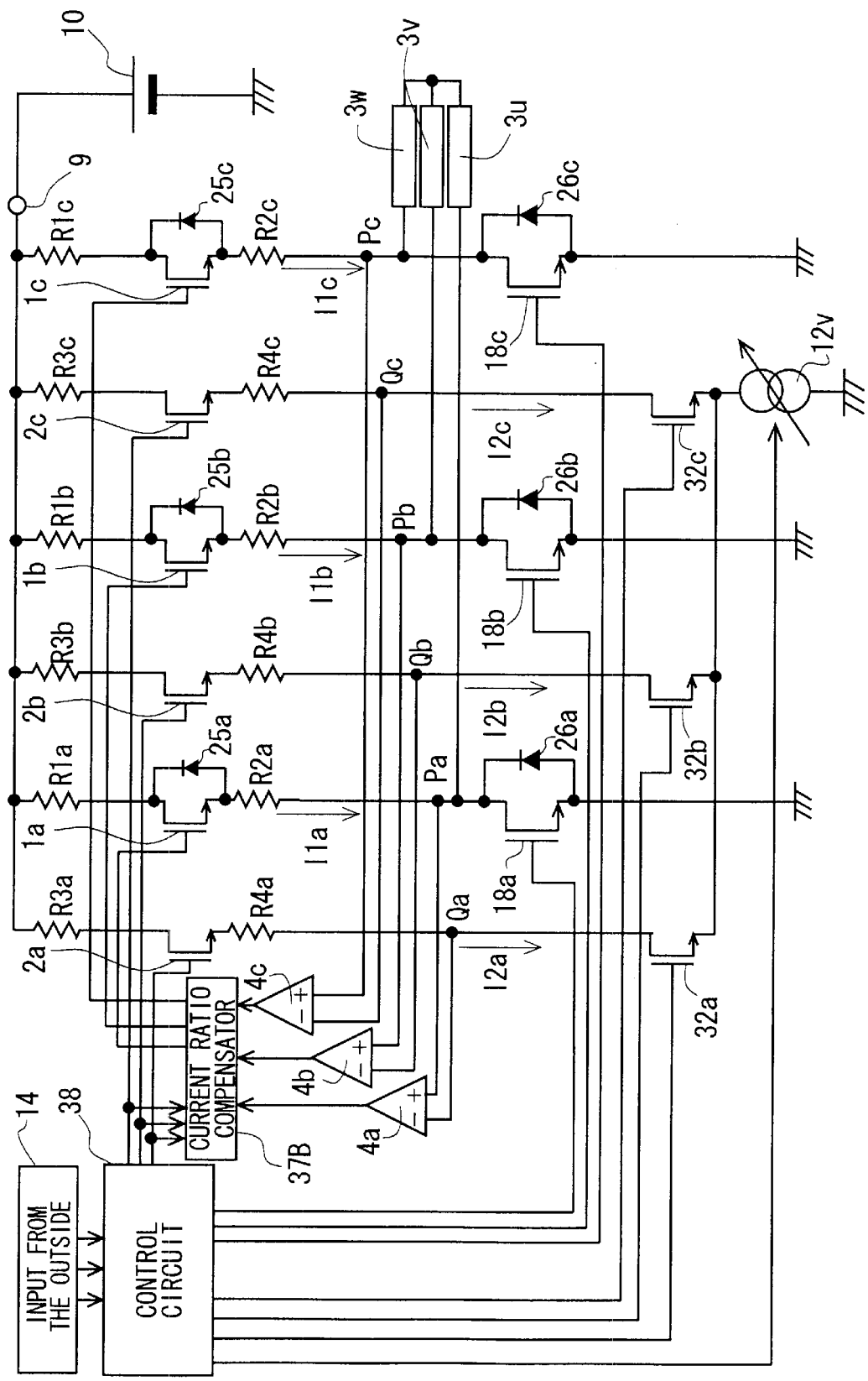
FIG. 10C is a circuit diagram of a power control device according to the eighteenth embodiment of the present invention.

FIG. 10C is a circuit diagram according to the eighteenth embodiment of the present invention. In FIG. 10C, the same reference signs as FIG. 10A represent the same components as FIG. 10A, and the descriptions of the sixteenth embodiment are cited to the description of the same components as FIG. 10A.

The eighteenth embodiment changes the equivalent impedance between the drains and the sources of the output transistors, thereby making a bridge of the same configuration as the sixteenth embodiment keep the balance. The operation other than that described above and the effects of the output control are exactly the same as the sixteenth embodiment.

<<Nineteenth Embodiment>>

Figure 10D:
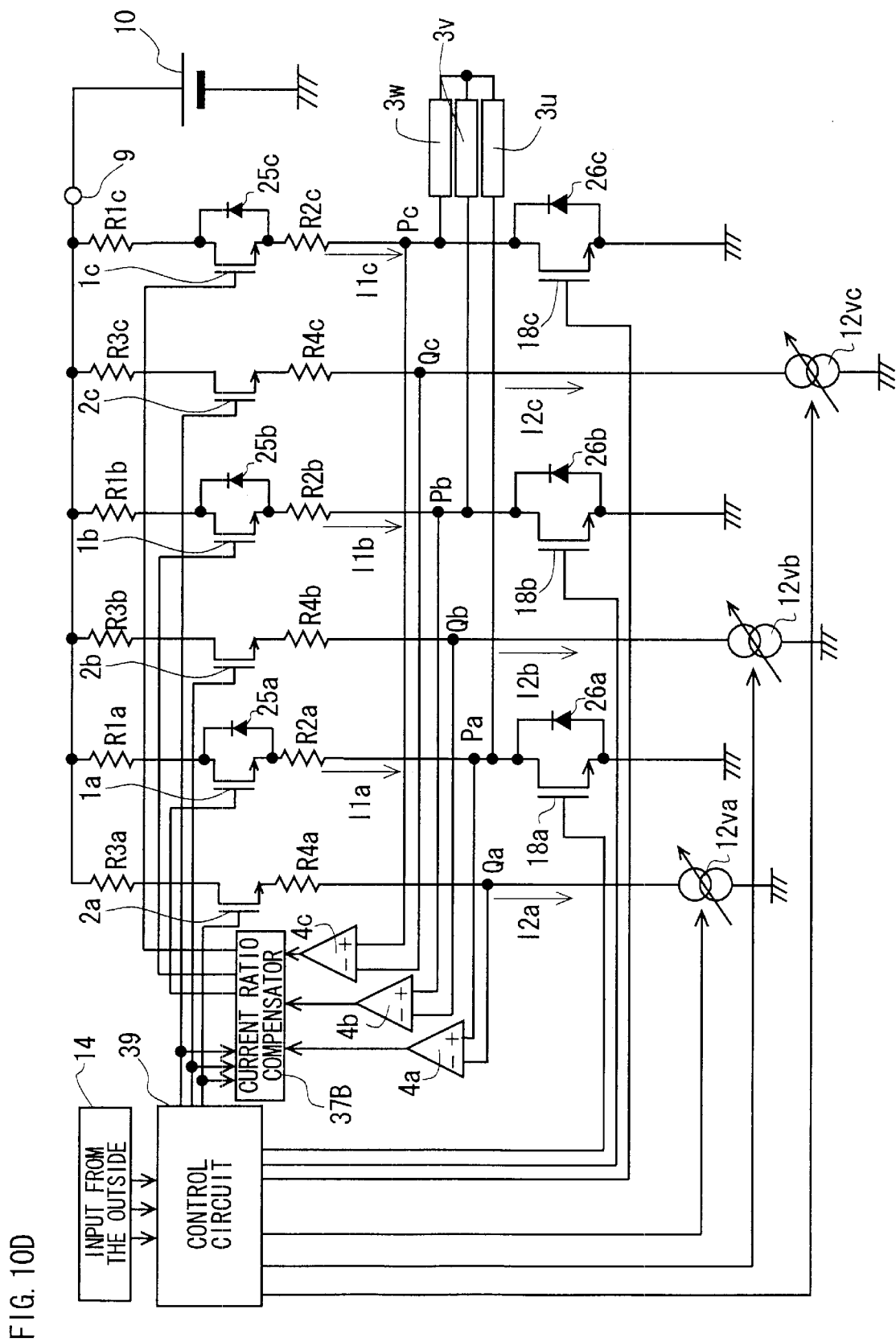
FIG. 10D is a circuit diagram of a power control device according to the nineteenth embodiment of the present invention.

FIG. 10D is a circuit diagram according to the nineteenth embodiment of the present invention. In FIG. 10D, the same reference signs as FIG. 10B represent the same components as FIG. 10B, and the descriptions of the seventeenth embodiment are cited to the description of the same components as FIG. 10B.

The nineteenth embodiment changes the equivalent impedance between the drains and the sources of the output transistors, thereby making a bridge of the same configuration as the seventeenth embodiment keep the balance. The operation other than that described above and the effects of the output control are exactly the same as the seventeenth embodiment.

As can be seen from the above embodiments, two pairs of the configuration of the fifth embodiment make up the eighth embodiment and three pairs thereof make up the fourteenth embodiment. Increasing the number of the configurations of the fifth embodiment in that manner would be easy for those skilled in the art. In particular, it is also possible to expand the mode of the present invention so as to be available as a driver of four- or more multi-phase motor in the same way as the fourteenth to the nineteenth embodiments can be available as a driver of three-phase motor.

<<Twentieth Embodiment>>

Figure 11:
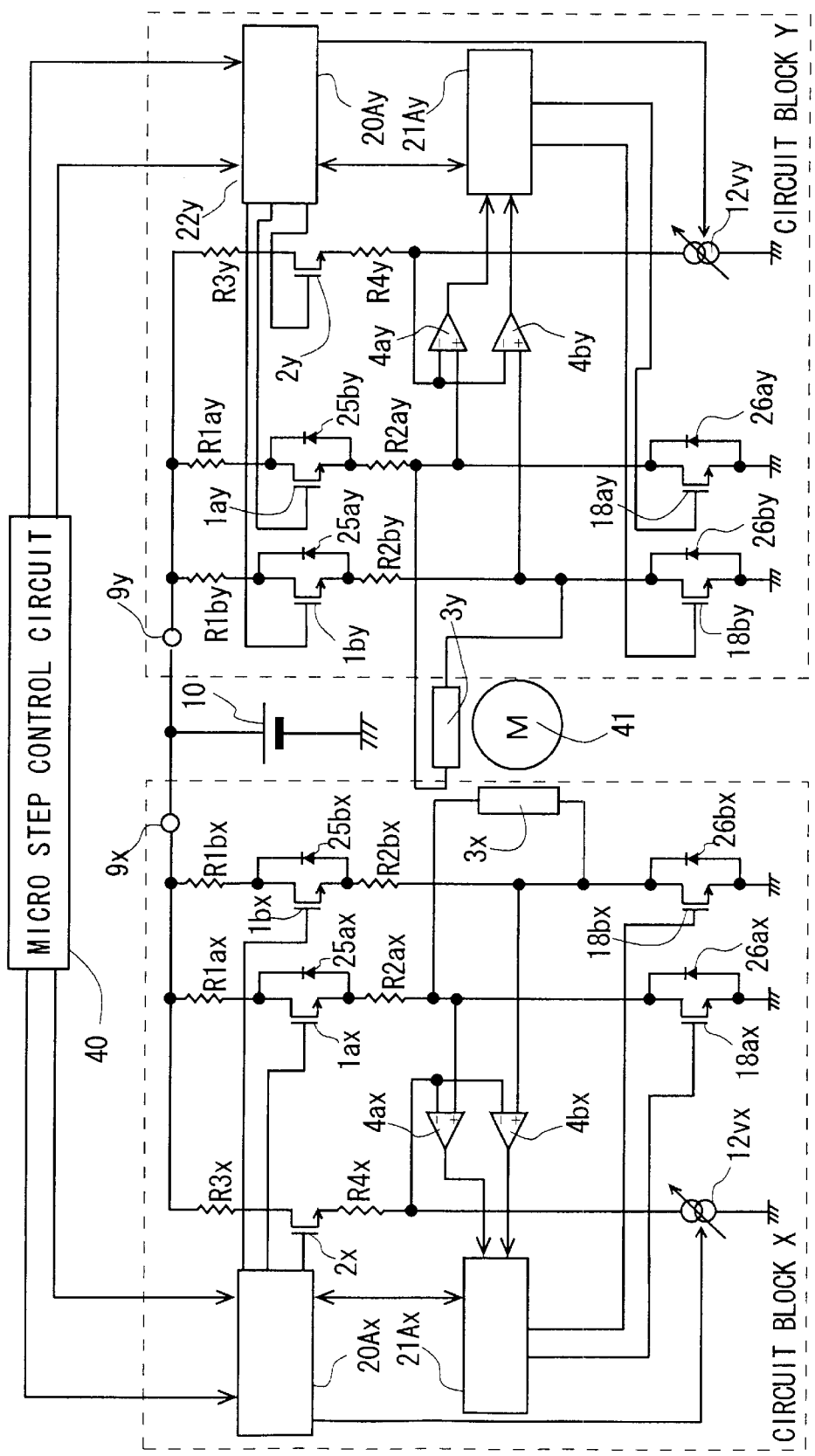
FIG. 11 is a circuit diagram of a power control device according to the twentieth embodiment of the present invention.

FIG. 11 is a circuit diagram according to the twentieth embodiment of the present invention.

The twentieth embodiment forms a micro stepper driver by controlling two circuits each having the same arrangement as the eighth embodiment with a micro step control circuit 40. In FIG. 11, the circuit blocks X and Y each surrounded by broken lines correspond to the circuit of the eighth embodiment. In the circuit blocks X and Y, the same components as FIG. 7A are represented by the same reference signs as FIG. 7A attached "x" or "y" showing the circuit block to which the components belong, and the descriptions of the eighth embodiment are cited to that of the components.

Loads 3x and 3y are, for example, stator windings for driving a rotor 41 of motor. The micro step control circuit 40 sets the control target values of the current sources 12vx and 12vy so as to change them with mutually out-of-phase sinusoidal micro steps. In addition, the micro step control circuit 40 corresponding to the outside 14 in the eighth embodiment controls the control circuits and the switches (FIG. 7A) in the circuit blocks. Thereby, currents flowing through the loads 3x and 3y are controlled so as to vary with time in accordance with the respective control target values of the current sources 12vx and 12vy. Since the circuit blocks can provide the control of the respective loads 3x and 3y in exactly the same manner as the eighth embodiment, the descriptions of the eighth embodiment are cited to the description of the control.

The twentieth embodiment is a two-phase stepper driver. In addition, it could be easily understood by those skilled in the art that the twentieth embodiment is expansible as a three- or more multi-phase stepper driver by adding another circuit block to the configuration of the embodiment.

<<Twenty-first Embodiment>>

Figure 12A:
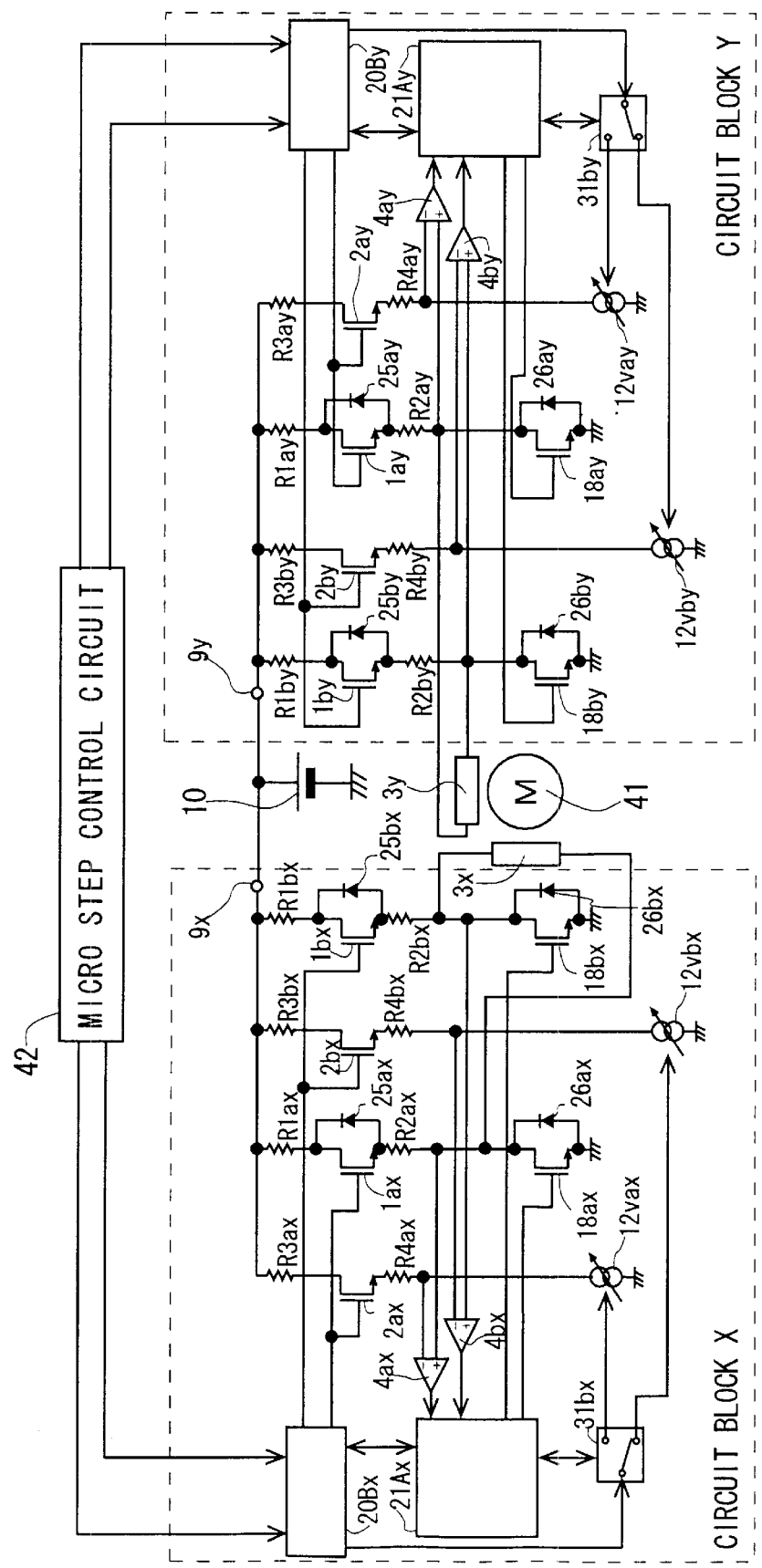
FIG. 12A is a circuit diagram of a power control device according to the twenty-first embodiment of the present invention.

FIG. 12A is a circuit diagram according to the twenty-first embodiment of the present invention.

The twenty-first embodiment forms a micro stepper driver by controlling two circuits each similar to the eleventh embodiment with a micro step control circuit 42. In FIG. 12A, the circuit blocks X and Y each surrounded by broken lines correspond to the circuit of the eleventh embodiment. In the circuit blocks X and Y, the same components as FIG. 8A are represented by the same reference signs as FIG. 8A attached "x" or "y" showing the circuit block to which the components belong, and the descriptions of the eleventh embodiment are cited to the components. In addition, the same components as FIG. 11 are represented by the same reference signs as FIG. 11, and the descriptions of the twentieth embodiment are cited to the components.

The micro step control circuit 42 sets the control target values of the current sources 12vax, 12vbx, 12vay and 12vby so as to change them with mutually out-of-phase sinusoidal micro steps. In addition, the micro step control circuit 42 corresponding the outside 14 in the eleventh embodiment controls the control circuits and the switches (FIG. 8B) in the circuit blocks. Thereby, currents flowing through the loads 3x and 3y are controlled so as to vary with time in accordance with the respective control target values of the current sources. Since the circuit blocks can provide the control of the respective loads 3x and 3y in exactly the same manner as the eleventh embodiment, the descriptions of the eleventh embodiment are cited to the description of the control.

The twenty-first embodiment is a two-phase stepper driver. In addition, it could easily be understood by those skilled in the art that the twenty-first embodiment is expansible as a three- or more multi-phase stepper driver by adding another circuit block to the configuration of the embodiment.

<<Twenty-second Embodiment>>

Figure 12B:
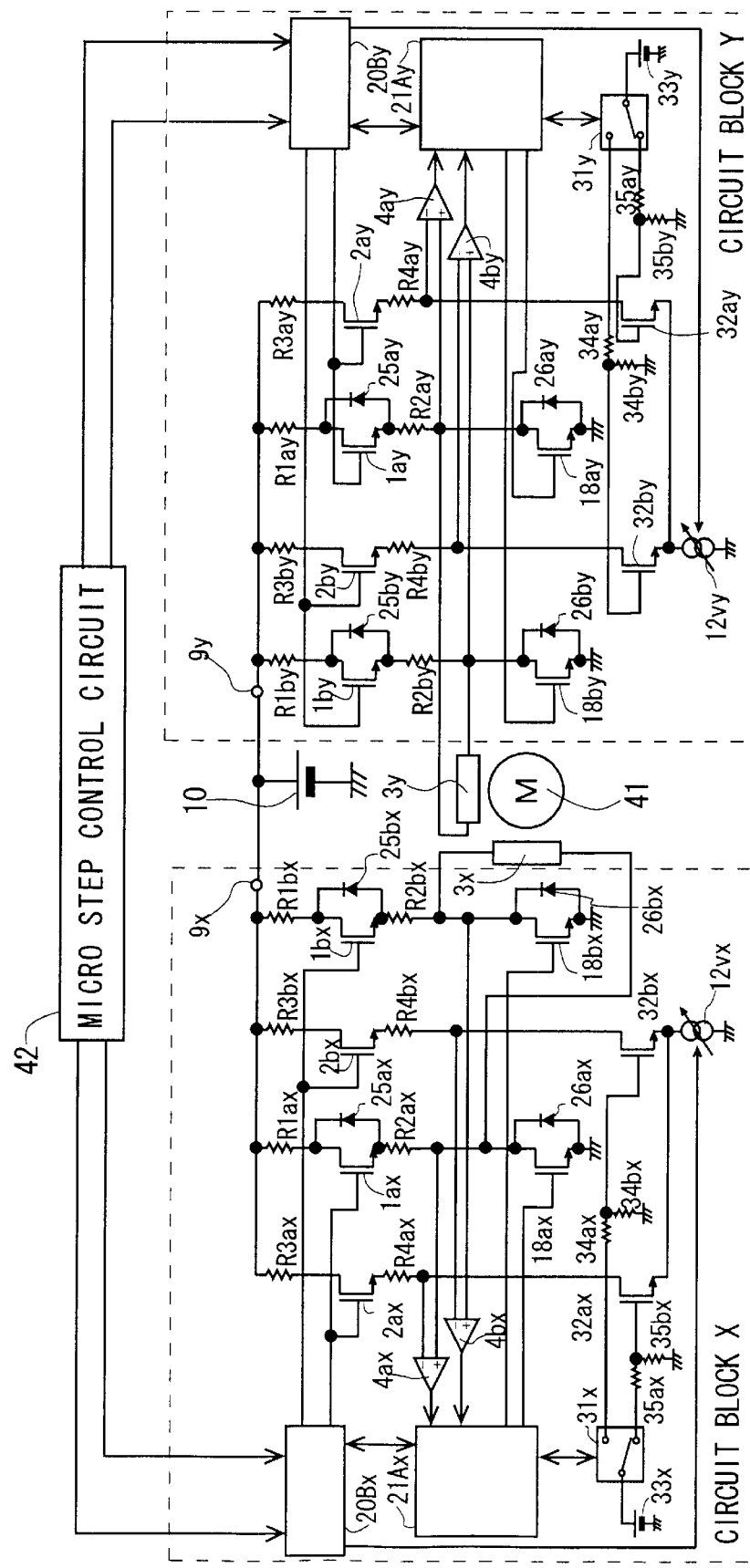
FIG. 12B is a circuit diagram of a power control device according to the twenty-second embodiment of the present invention.
Figure 13:
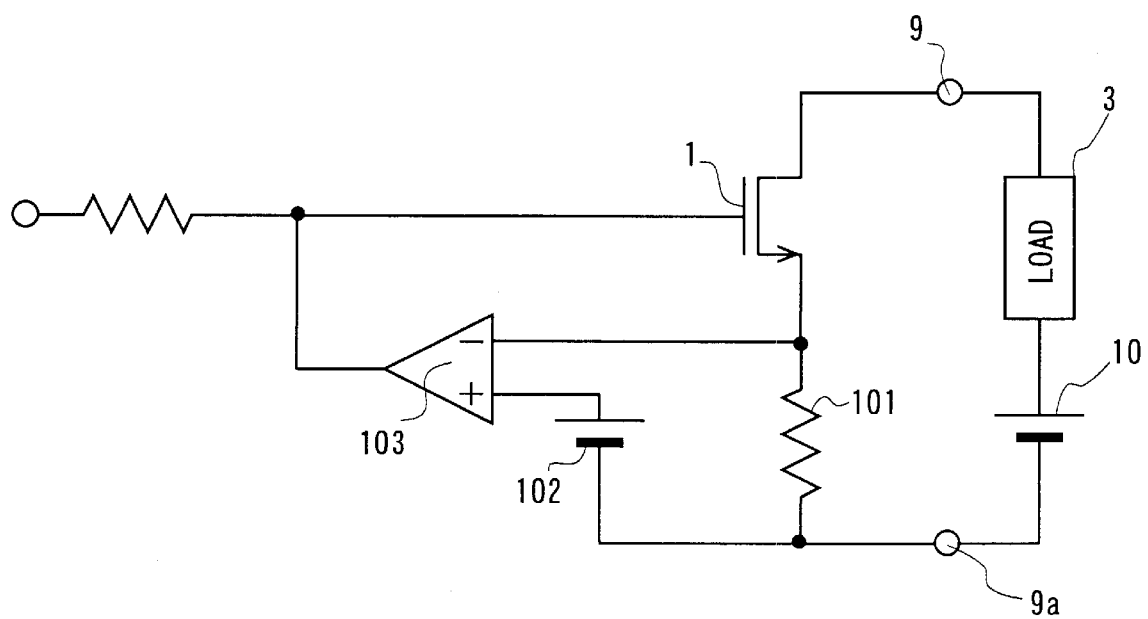
FIG. 13 is a circuit diagram of an circuit breaker according to the first conventional example.
Figure 14:
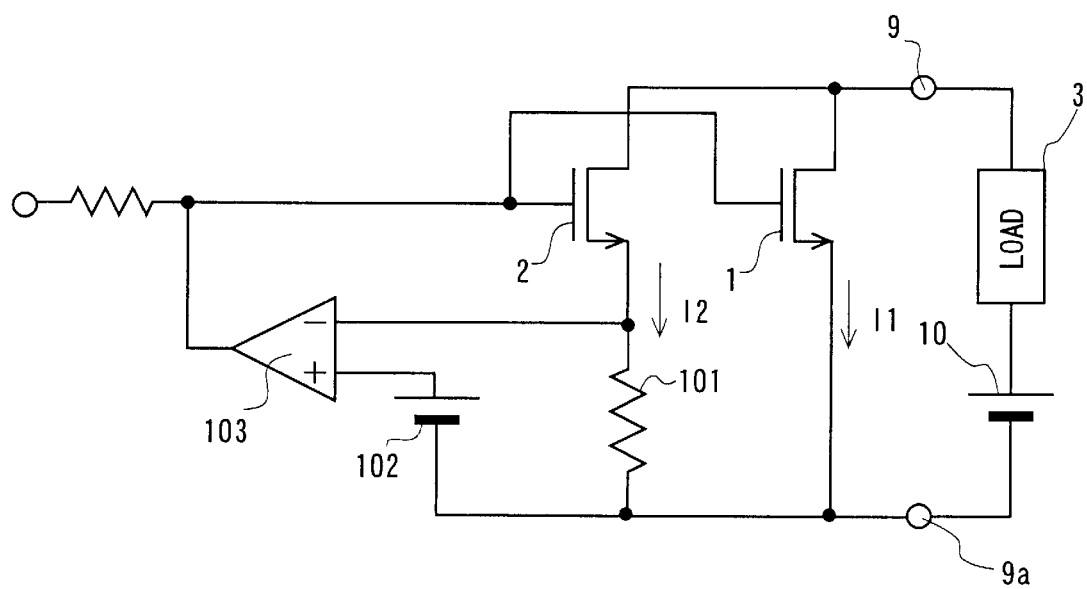
FIG. 14 is a circuit diagram of an circuit breaker according to the second conventional example.
Figure 15:
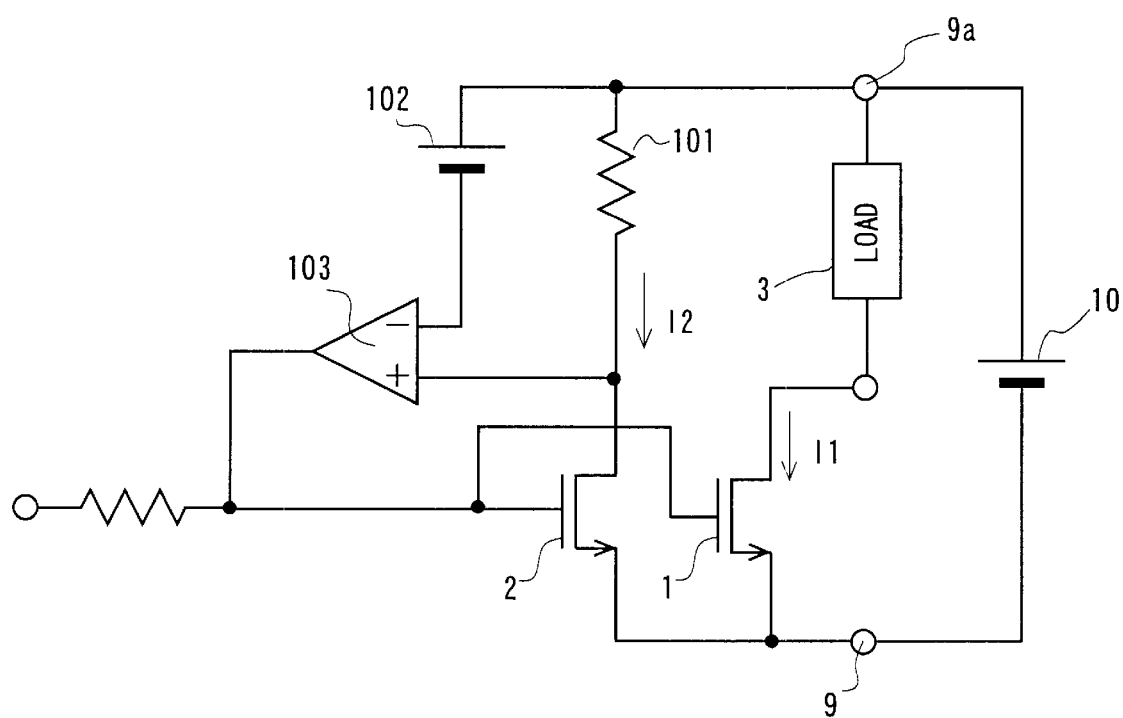
FIG. 15 is a circuit diagram of an circuit breaker according to the third conventional example.
Figure 16A:
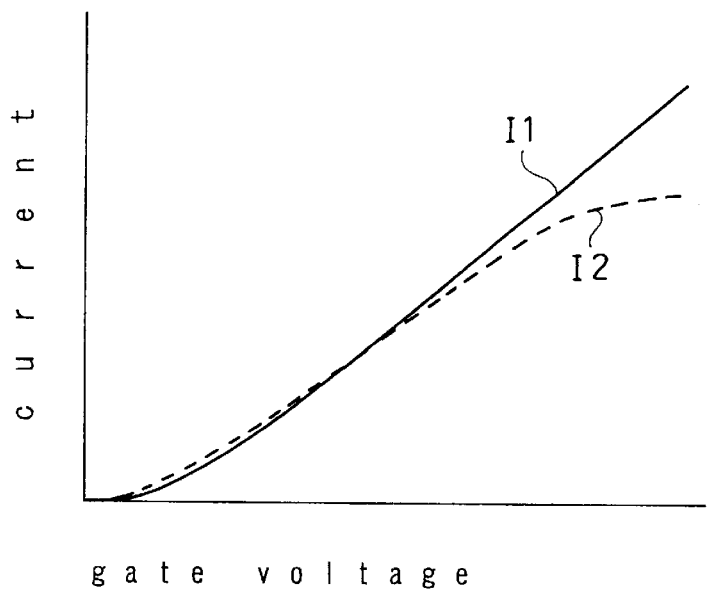
FIG. 16A is a diagram showing a graph representing the changes of the output current I1 and the adjusting current I2 with respect to the gate voltage of the output transistor 1 in the second conventional example.
Figure 16B:
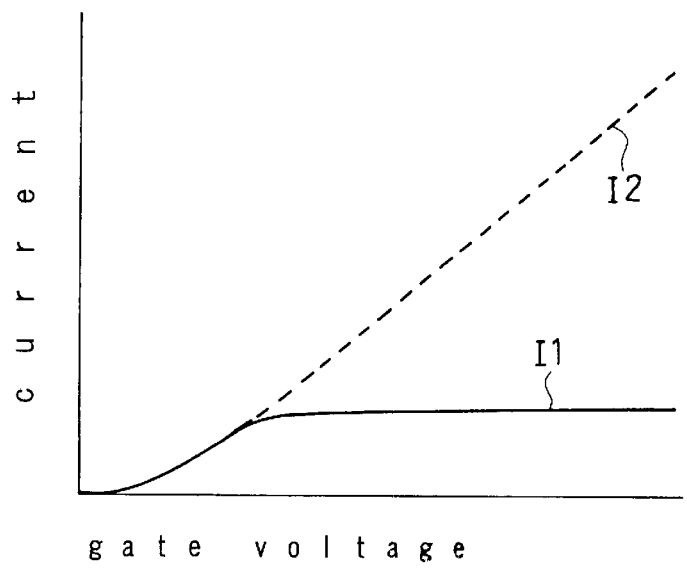
FIG. 16B is a diagram showing a graph representing the changes of the output current I1 and the adjusting current I2 with respect to the gate voltage of the output transistor 1 in the third conventional example.
Figure 1:
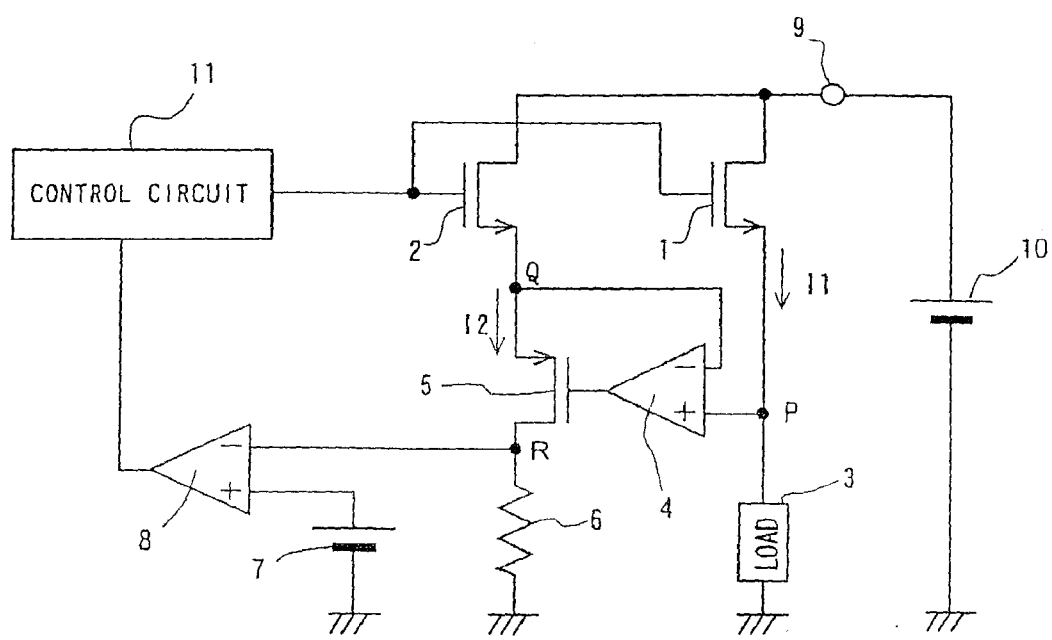
Figure 1:
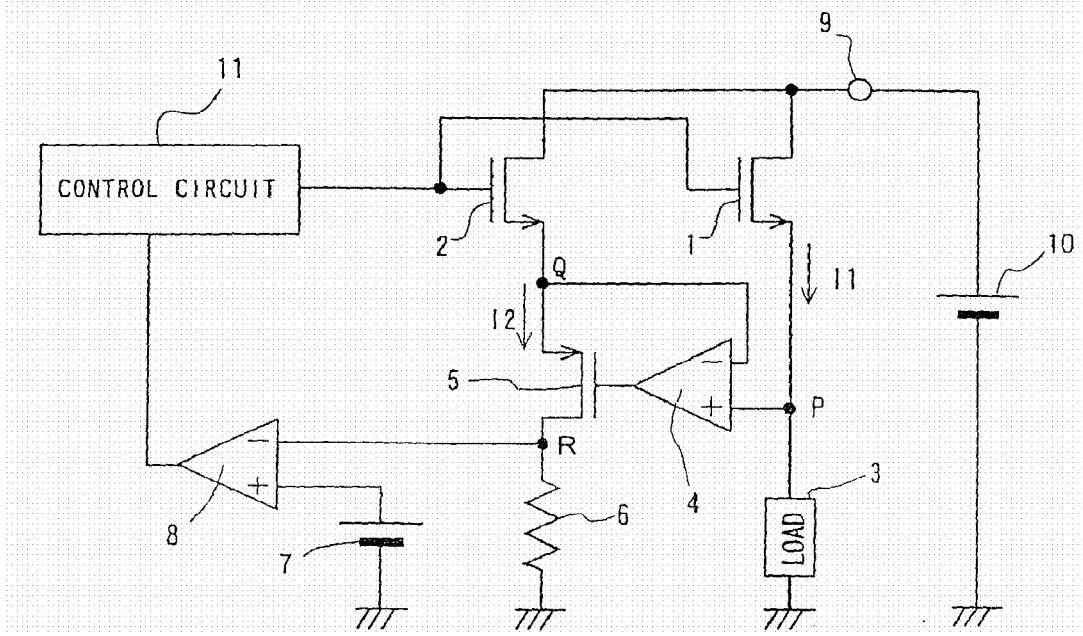

FIG. 12B is a circuit diagram according to the twenty-second embodiment of the present invention.

The twenty-second embodiment differs from the twenty-first embodiment only in the point that the circuit blocks of the twenty-first embodiment use respective common current sources 12vx and 12vy with a switching in accordance with a control signal from the micro step control circuit 42 instead of using respective two current sources. Other parts of the configuration and the operation are exactly the same as the twenty-first embodiment.

In the above-described embodiments, transistors included in the circuits are n-channel or p-channel MOSFETs. However, the present invention is not limited to that, and each of the transistors maybe replaced by the opposite channel MOSFET with the power sources and the like of the opposite polarities, thereby producing the same effects as the above-described embodiments. In addition, bipolar transistors or insulating gate bipolar transistors (IGBT) other than MOSFETs may be used, thereby producing the same effects as the above-described embodiments.

The present invention is not limited to the implementation as a power control device for driving a motor or the like as the above-described embodiments. In another way, the present invention may be applied to a linear or switching type power IC, a solenoid driver or a communication network driver.

All of the above-described embodiments can function with a higher precision than the conventional power control devices by reducing errors due to temperature change, unevenness of parameters of operational conditions and products. As a result, the outputted energy is less lost through the output control than the conventional examples. In other words, the energy efficiency of the output control device is superior to the conventional examples.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

INDUSTRIAL APPLICABILITY

A power control device according to the present invention can widen the output voltage range of the main current circuit larger than the conventional examples and hold the energy efficiency at a high level, thereby implementing a current driving system with a high precision and high reliability. Therefore, the industrial applicability of the present invention is extremely high.

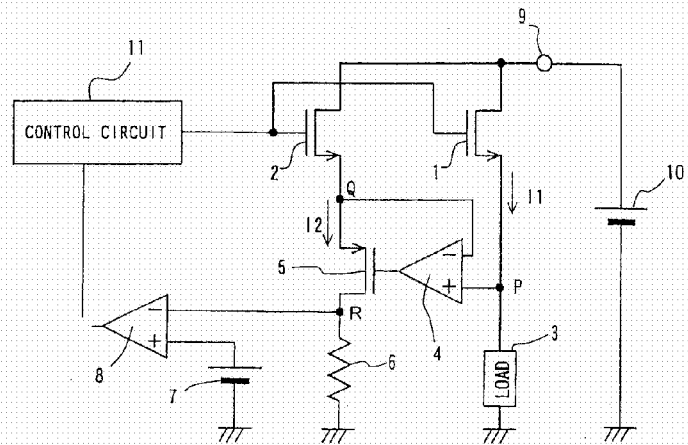

What is claimed is:

1. A power control device comprising:
    a bridge circuit consisting of a first branch, a second branch, a third branch and a fourth branch, wherein
        each of said first to fourth branches includes a first terminal and a second terminal,
        the first terminal of said first branch and the first terminal of said third branch are connected to a first power-source-connecting terminal at a substantially constant potential, the second terminal of said second branch and the second terminal of said fourth branch are connected to a second power-source-connecting terminal at a substantially constant potential,
        the second terminal of said first branch and the first terminal of said second branch are mutually connected at a first node, the second terminal of said third branch and the first terminal of said fourth branch are mutually connected at a second node,
        said second branch includes a load and a switch circuit connected in series with said load,
        said first branch includes an output circuit for driving said load,
        said third branch includes an auxiliary circuit for outputting an adjusting current adjusted to an amount smaller substantially by a predetermined ratio than an output current outputted from said output circuit in the case of applying substantially the same input voltage as that of said output circuit, and
        said fourth branch includes a current setting circuit for holding at a substantially constant level or changing quasistatically said adjusting current;
    a potential difference detector for detecting a potential difference between said first node and said second node;
    a control circuit for making said output circuit interlock with said auxiliary circuit and controlling said output circuit;
    a switch control circuit for turning on or off said switch circuits in a manner synchronized with the operation of said control circuit;
    and
    a current ratio compensator for feeding back said detected potential difference detected by said potential difference detector and controlling the equivalent impedance across said first terminal and said second terminal of one of said first to fourth branches so that said bridge circuit keep the balance, thereby holding said ratio at a substantially constant level.

2. A power control device according to claim 1, wherein said current ratio compensator provides the control of said equivalent impedance over said switch circuit.

3. A power control device according to claim 1, wherein said current ratio compensator provides the control of said equivalent impedance over said output circuit and said switch circuit.

4. A power control device comprising:
    an output network consisting of a first branch, a second branch, a third branch, a fourth branch, a fifth branch, a sixth branch and a seventh branch, wherein
        each of said first to seventh branches includes a first terminal and a second terminal,
        the first terminals of said first, said third and said fifth branches are connected to a first power-source-connecting terminal at a substantially constant potential, the second terminals of said second, said fourth and said sixth branches are connected to a second power-source-connecting terminal at a substantially constant potential, the second terminal of said first branch and the first terminal of said second branch are mutually connected at a first node, the second terminal of said third branch and the first terminal of said fourth branch are mutually connected at a second node, the second terminal of said fifth branch and the first terminal of said sixth branch are mutually connected at a third node, the first terminal and the second terminal of said seventh branch are connected to said first node and said second node, respectively,
- said seventh branch includes a load,
- said first branch includes a first output circuit for driving said load,
- said third branch includes a second output circuit for driving said load,
- each of said second and said fourth branches includes a switch circuit, and
- said fifth branch includes an auxiliary circuit for interlocking with either of said first or said second output circuits and outputting an adjusting current adjusted to an amount smaller substantially by a predetermined ratio than an output current outputted from the interlocking output circuit in the case of applying substantially the same input voltage as that of the interlocking output circuit;

a potential difference detector for detecting the potential of said first node or said second node with respect to said third node;

a control circuit for making said first and said second output circuits interlock with said auxiliary circuit in a substantially alternate order and controlling said first or said second output circuit;

a switch control circuit for turning on or off said switch circuits in a substantially alternate order in a manner synchronized with the operation of said control circuit; and a current ratio compensator for feeding back said potential difference detected by said potential difference detector and controlling the equivalent impedance across said first terminal and said second terminal of one of said first to said sixth branches, so that a bridge consisting of said first branch, a composite of said seventh branch and said fourth branch, said fifth branch, and said sixth branch, keeps the balance when an output current from said first output circuit flows through said first branch, said seventh branch and said fourth branch, and.

a bridge consisting of said third branch, a composite of said seventh branch and said second branch, said fifth branch, and said sixth branch, keeps the balance when an output current from said second output circuit flows through said third branch, said seventh branch and said second branch, thereby holding said ratio at a substantially constant level.

5. A power control device according to claim 4, wherein said sixth branch includes a current setting circuit for holding at a substantially constant level or changing quasi-statically said adjusting current.

6. A power control device according to claim 4, wherein said current ratio compensator provides the control of said equivalent impedance over said switch circuit.

7. A power control device according to claim 4, wherein said current ratio compensator provides the control of said equivalent impedance over said first or said second output circuit.

8. A power control device comprising:

an output network consisting of a first branch, a second branch, a third branch, a fourth branch, a fifth branch, a sixth branch, a seventh branch, an eighth branch and a ninth branch, wherein
- each of said first to ninth branches includes a first terminal and a second terminal,
- the first terminals of said first, said third, said fifth and said seventh branches are connected to a first power-source-connecting terminal at a substantially constant potential,
- the second terminals of said second, said fourth, said sixth and said eighth branches are connected to a second power-source-connecting terminal at a substantially constant potential,
- the second terminal of said first branch and the first terminal of said second branch are mutually connected at a first node, the second terminal of said third branch and the first terminal of said fourth branch are mutually connected at a second node, the second terminal of said fifth branch and the first terminal of said sixth branch are mutually connected at a third node, the second terminal of said seventh branch and the first terminal of said eighth branch are mutually connected at a fourth node,
- the first terminal and the second terminal of said ninth branch are connected to said first node and said second node, respectively,
- said ninth branch includes a load,
- said first branch includes a first output circuit for driving said load,
- said third branch includes a second output circuit for driving said load,
- each of said second and said fourth branches includes a switch circuit,
- said fifth branch includes a first auxiliary circuit for interlocking with said first output circuit and outputting a first adjusting current adjusted to an amount smaller substantially by a predetermined first ratio than a first output current outputted from said first output circuit in the case of applying substantially the same input voltage as that of said first output circuit, and
- said seventh branch includes a second auxiliary circuit for interlocking with said second output circuit and outputting a second adjusting current adjusted to an amount smaller substantially by a predetermined second ratio than a second output current outputted from said second output circuit in the case of applying substantially the same input voltage as that of said second output circuit;

a potential difference detector for detecting the potential of said first node with respect to said third node as a first potential difference and the potential of said second node with respect to said fourth node as a second potential difference;

a control circuit for operating in a substantially alternate order and controlling a pair of said first output circuit and said first auxiliary circuit and a pair of the second output circuit and said second auxiliary circuit;

a switch control circuit for turning on or off one of said switch circuits in a substantially alternate order in a manner synchronized with the operation of said control circuit; and a current ratio compensator for feeding back said first or said second potential difference detected by said potential difference detector and for controlling the equivalent impedance across said first terminal and said second terminal of one of said first to said eighth branches, so that a bridge consisting of said first branch, a composite of said seventh branch and said fourth branch, said fifth branch, and said sixth branch, keeps the balance, thereby holding said first ratio at a substantially constant level when said first output current flows through said first branch, said seventh branch and said fourth branch, and a bridge consisting of said third branch, a composite of said seventh branch and said second branch, said seventh branch, and said eighth branch, keeps the balance, thereby holding said second ratio at a substantially constant level when said second output current flows through said third branch, said seventh branch and said second branch.

9. A power control device according to claim 8 comprising a current setting circuit for holding at a substantially constant level or changing quasistatically said first adjusting current and said second adjusting current in said sixth branch and said eighth branch, respectively.

10. A power control device according to claim 8, wherein said current ratio compensator provides the control of said equivalent impedance over said switch circuit.

11. A power control device according to claim 8, wherein said current ratio compensator provides the control of said equivalent impedance over said first or said second output circuit.

12. A power control device comprising:

an output network consisting of a first branch, a second branch, a third branch, a fourth branch, a fifth branch, a sixth branch, a seventh branch and an eighth branch, wherein each of said first to eighth branches includes a first terminal and a second terminal, substantially constant potential, the second terminals of said second, said fourth, said sixth and said eighth branches are connected to a second power-source-connecting terminal at a substantially constant potential, the second terminal of said first branch and the first terminal of said second branch are mutually connected at a first node, the second terminal of said third branch and the first terminal of said fourth branch are mutually connected at a second node, the second terminal of said fifth branch and the first terminal of said sixth branch are mutually connected at a third node, the second terminal of said seventh branch and the first terminal of said eighth branch are mutually connected at a fourth node, three terminals of three loads in Y connection or Δ connection are connected to said first to third nodes, respectively, said first branch includes a first output circuit for driving said loads, said third branch includes a second output circuit for driving said loads, said fifth branch includes a third output circuit for driving said loads, each of said second, said fourth and said sixth branches includes a switch circuit, said seventh branch includes an auxiliary circuit for interlocking with one of said first to third output circuits and outputting an adjusting current adjusted to an amount smaller substantially by a predetermined ratio than an output current outputted from the interlocking output circuit in the case of applying substantially the same input voltage as that of the interlocking output circuit;

a potential difference detector for detecting the potential of said first node, said second node or said third node with respect to said fourth node;

a control circuit for making said first to third output circuits interlock with said auxiliary circuit in a predetermined order and controlling said first to third output circuits;

a switch control circuit for turning on or off one or two of said switch circuits in a predetermined order and combination in a manner synchronized with the operation of said control circuit; and a current ratio compensator for feeding back said potential difference detected by said potential difference detector and for controlling the equivalent impedance across said first terminal and said second terminal of one of said first to said eighth branches, so that a bridge consisting of said first branch, a composite of said loads and either or both of said fourth and said sixth branches, said seventh branch, and said eighth branch, keeps the balance when an output current from said first output circuit flows through said first branch, said loads, either or both of said fourth and said sixth branches, a bridge consisting of said third branch, a composite of said loads and either or both of said second and said sixth branches, said seventh branch, and said eighth branch, keeps the balance when an output current from said second output circuit flows through said third branch, said loads, either or both of said second and said sixth branches, and a bridge consisting of said fifth branch, a composite of said loads and either or both of said second and said fourth branches, said seventh branch, and said eighth branch, keeps the balance when an output current from said third output circuit flows through said fifth branch, said loads, either or both of said second and said fourth branches, thereby holding said ratio at a substantially constant level.

13. A power control device according to claim 12, wherein said eighth branch has a current setting circuit for holding at a substantially constant level or changing quasistatically said adjusting current.

14. A power control device according to claim 12, wherein said current ratio compensator provides the control of said equivalent impedance over said switch circuit.

15. A power control device according to claim 12, wherein said current ratio compensator provides the control of said equivalent impedance over one of said first to third output circuits.

16. A power control device comprising:

an output network consisting of a first branch, a second branch, a third branch, a fourth branch, a fifth branch, a sixth branch, a seventh branch, an eighth branch, a ninth branch, a tenth branch, an eleventh branch and a twelfth branch, wherein each of said first to twelfth branches includes a first terminal and a second terminal, the first terminals of said first, said third, said fifth, said seventh, said ninth and said eleventh branches are connected to a first power-source-connecting terminal at a substantially constant potential, the second terminals of said second, said fourth, said sixth, said eighth, said tent hand said twelfth branches are connected to a second power-source-connecting terminal at a substantially constant potential, the second terminal of said first branch and the first terminal of said second branch are mutually connected at a first node, the second terminal of said third branch and the first terminal of said fourth branch are mutually connected at a second node, the second terminal of said fifth branch and the first terminal of said sixth branch are mutually connected at a third node, the second terminal of said seventh branch and the first terminal of said eighth branch are mutually connected at a fourth node, the second terminal of said ninth branch and the first terminal of said tenth branch are mutually connected at a fifth node, the second terminal of said eleventh branch and the first terminal of said twelfth branch are mutually connected at a sixth node, three terminals of three loads in Y connection or Δ connection are connected to said first to third nodes, respectively, said first branch includes a first output circuit for driving said loads, said third branch includes a second output circuit for driving said loads, said fifth branch includes a third output circuit for driving said loads, each of said second, said fourth and said sixth branches includes a switch circuit, said seventh branch includes a first auxiliary circuit for interlocking with said first output circuit and outputting a first adjusting current adjusted to an amount smaller substantially by a predetermined first ratio than a first output current outputted from said first output circuit in the case of applying substantially the same input voltage as that of said first output circuit, said ninth branch includes a second auxiliary circuit for interlocking with said second output circuit and outputting a second adjusting current adjusted to an amount smaller substantially by a predetermined second ratio than a second output current outputted from said second output circuit in the case of applying substantially the same input voltage as that of said second output circuit, and said eleventh branch includes a third auxiliary circuit for interlocking with said third output circuit and outputting a third adjusting current adjusted to an amount smaller substantially by a predetermined third ratio than a third output current outputted from said third output circuit in the case of applying substantially the same input voltage as that of said third output circuit;

a potential difference detector for detecting the potential of said first node with respect to said fourth node as a first potential difference, the potential of said second node with respect to said fifth node as a second potential difference and the potential of said third node with respect to said sixth node as a third potential difference;

a control circuit for operating in a predetermined order and controlling a pair of said first output circuit and said first auxiliary circuit, a pair of the second output circuit and said second auxiliary circuit and a pair of the third output circuit and said third auxiliary circuit;

a switch control circuit for turning on or off one or two of said switch circuits in a predetermined order and combination in a manner synchronized with the operation of said control circuit; and a current ratio compensator for controlling the equivalent impedance across said first terminal and said second terminal of one of said first to twelfth branches, for feeding back said first potential difference detected by said potential difference detector so that a bridge consisting of said first branch, a composite of said loads and either or both of said fourth and said sixth branches, said seventh branch, and said eighth branch, keeps the balance, thereby holding said first ratio at a substantially constant level when said first output current flows through said first branch, said loads, either or both of said fourth and said sixth branches, for feeding back said second potential difference detected by said potential difference detector so that a bridge consisting of said third branch, a composite of said loads and either or both of said second and said sixth branches, said ninth branch, and said tenth branch, keeps the balance, thereby holding said second ratio at a substantially constant level when said second output current flows through said third branch, said loads, either or both of said second and said sixth branches, and for feeding back said third potential difference detected by said potential difference detector so that a bridge consisting of said fifth branch, a composite of said loads and either or both of said second and said fourth branches, said eleventh branch, and said twelfth branch, keeps the balance, thereby holding said third ratio at a substantially constant level when said third output current flows through said fifth branch, said loads, either or both of said second and said fourth branches.

17. A power control device according to claim 16 comprising a current setting circuit for holding at a substantially constant level or changing quasistatically said first adjusting current, said second adjusting current and said third adjusting current in said eighth branch, said tenth branch and said twelfth branch, respectively.

18. A power control device according to claim 16, wherein said current ratio compensator provides the control of said equivalent impedance over said switch circuit.

19. A power control device according to claim 16, wherein said current ratio compensator provides the control of said equivalent impedance over one of said first to third output circuits.

20. A power control device comprising:
at least two output control circuits each of which is a power control device according to claim 9; and
a micro-step control circuit for controlling said adjusting currents in said output control circuits, thereby controlling currents flowing through said respective loads.

21. A power control device according to one of claims 1, 4, 8, 12, and 16, wherein a main resistance in the periphery of said output circuit and an auxiliary resistance in the periphery of said auxiliary circuit interlocking with said output circuit are adapted to satisfy a substantial proportionality between said output current from said output circuit and said adjusting current from said auxiliary circuit.

22. A power control device according to claim 21, wherein said main resistance is connected in series with said output circuit and said auxiliary resistance is connected in series with said auxiliary circuit and has a resistance value substantially equal to the resistance value of said main resistance multiplied by the inverse of the proportional coefficient of said proportionality.

* * * * *

UNITED STATES PATENT AND TRADEMARK OFFICE
CERTIFICATE OF CORRECTION

PATENT NO. : 6,424,131 B1
DATED : July 23, 2002
INVENTOR(S) : Yasunori Yamamoto et al.

It is certified that error appears in the above-identified patent and that said Letters Patent is hereby corrected as shown below:

The title page should be deleted to be replaced with the attached title page.

The drawings sheet consisting of Fig. 1 should be added as shown on the attached page.

Column 1,
Line 28, please delete "16", and insert therefor -- 103 --.

Column 3,
Line 22, after "1", please insert -- -- (space).

Column 14,
Lines 33 and 37, please delete "parts", and insert therefor -- circuits --.
Line 39, please delete "circuit", and insert therefor -- device --.
Line 41, please delete "parts", and insert therefor -- circuits --.
Line 41, please delete "circuit" and insert therefor -- device --.
Lines 43 and 47, please delete "parts", and insert therefor -- circuits --.

Column 16,
Line 61, please delete "film", and insert therefor -- semiconductor --.

Column 21,
Lines 12 and 31, please delete "3", and insert therefor -- 3A --.
Line 44, please delete "19", and insert therefor -- 17 --.

Column 22,
Line 5, please delete "1", and insert therefor -- Il --.

Column 23,
Lines 10 and 56, please delete "19", and insert therefor -- 17 --.

UNITED STATES PATENT AND TRADEMARK OFFICE
CERTIFICATE OF CORRECTION

PATENT NO.    : 6,424,131 B1
DATED         : July 23, 2002
INVENTOR(S)   : Yasunori Yamamoto et al.

It is certified that error appears in the above-identified patent and that said Letters Patent is hereby corrected as shown below:

Column 24,
Line 2, please delete "19", and insert therefor -- 17 --.
Lines 60 and 63, please delete "pairs", and insert therefor -- groups --.

Column 25,
Line 3, please delete "film", and insert therefor -- semiconductor --.

Column 27,
Line 8, please delete "19", and insert therefor -- 17 --.

Column 30,
Line 24, please delete "18b", and insert therefor -- 18a --.
Line 25, please delete "1a", and insert therefor -- 2a --.

Column 31,
Lines 25 and 29, please delete "pairs", and insert therefor -- groups --.

Column 34,
Line 31, please delete "switch control circuit", and insert therefor -- current ratio compensator --.
Lines 50-51, please delete "the composite of".

Column 37,
Line 7, please delete "pairs", and insert therefor -- groups --.

Column 38,
Line 5, please delete "pairs", and insert therefor -- groups --.

UNITED STATES PATENT AND TRADEMARK OFFICE
CERTIFICATE OF CORRECTION

PATENT NO.    : 6,424,131 B1
DATED         : July 23, 2002
INVENTOR(S)   : Yasunori Yamamoto et al.

It is certified that error appears in the above-identified patent and that said Letters Patent is hereby corrected as shown below:

<u>Column 43,</u>
Line 37, after "," (comma), please insert therefor -- the first terminals of said first, said third, said fifth and said seventh branches are connected to a first power-source-connecting terminal at a --.

Signed and Sealed this

Twenty-second Day of April, 2003

JAMES E. ROGAN
*Director of the United States Patent and Trademark Office*

(12) United States Patent
Yamamoto et al.

(10) Patent No.: US 6,424,131 B1
(45) Date of Patent: Jul. 23, 2002

(54) OUTPUT CONTROLLER

(75) Inventors: Yasunori Yamamoto, Hirakata; Shinji Tanaka, Ibaraki; Minoru Miyake, Kyoto, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/762,890

(22) PCT Filed: Jun. 15, 2000

(86) PCT No.: PCT/JP00/03931
§ 371 (c)(1),
(2), (4) Date: Feb. 13, 2001

(87) PCT Pub. No.: WO00/79682
PCT Pub. Date: Dec. 28, 2000

(30) Foreign Application Priority Data

Jun. 18, 1999 (JP) .............................................. 11-172071

(51) Int. Cl.[7] ................................................ G05F 1/40
(52) U.S. Cl. ....................................... 323/282; 323/316
(58) Field of Search ................................. 323/282, 284, 323/351, 285, 273, 312, 316, 277; 327/538, 540

(56) References Cited

U.S. PATENT DOCUMENTS

| 4,327,320 A | * | 4/1982 | Oguey et al. ................ 323/313 |
| 5,077,595 A | | 12/1991 | Fukunaga |
| 5,296,735 A | | 3/1994 | Fukunaga |
| 5,532,918 A | * | 7/1996 | Mayrand et al. .............. 363/89 |
| 5,550,462 A | * | 8/1996 | Nakajima .................... 323/277 |
| 5,786,970 A | * | 7/1998 | Nao et al. .................... 361/18 |
| 5,831,471 A | * | 11/1998 | Nakajima et al. ............. 327/540 |
| 5,894,236 A | * | 4/1999 | Mizoguchi et al. ........... 327/108 |

FOREIGN PATENT DOCUMENTS

| JP | 01227520 | 9/1989 |
| JP | 03262209 | 11/1991 |
| JP | 04134271 | 5/1992 |
| JP | 04211200 | 8/1992 |
| JP | 05291918 | 11/1993 |
| JP | 08111524 | 4/1996 |

OTHER PUBLICATIONS

WO 96/12346, A Protected Switch, Published Apr. 1996.

* cited by examiner

Primary Examiner—Adolf Deneke Berhane
(74) Attorney, Agent, or Firm—Pearne & Gordon LLP

(57) ABSTRACT

The object of the present invention is, in a power control device including an auxiliary circuit that is connected in parallel to an output circuit and controls an adjusting current smaller by a substantially constant ratio than an output current, to control the ratio of the output current to the adjusting current at a constant level by controlling the output circuit and the auxiliary circuit so that the potentials of the corresponding terminals agree with each other. As a means for attaining the object, the power control device comprises a bridge of four branches including an output circuit, an auxiliary circuit, a load, and either of a current detector or a current setting circuit. The power control device detects the potential difference between the terminals of the output circuit and the corresponding terminals of the auxiliary circuit and feeds back the potential difference to one of the four branches of the bridge and changes the equivalent impedance of the branch, thereby controlling the bridge to keep the balance.

22 Claims, 27 Drawing Sheets

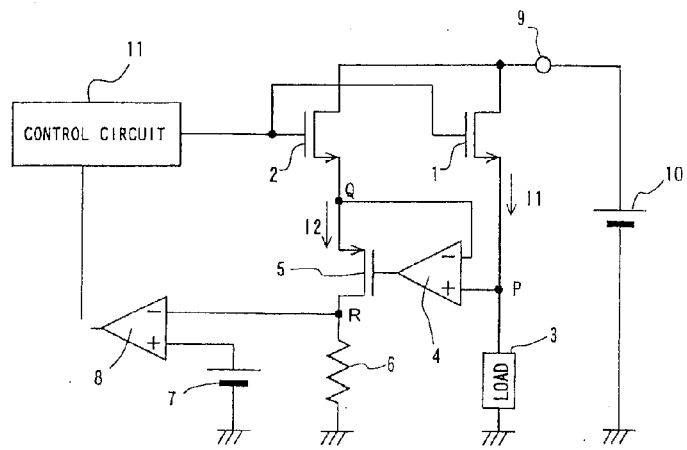

UNITED STATES PATENT AND TRADEMARK OFFICE
CERTIFICATE OF CORRECTION

PATENT NO. : 6,424,131 B1
DATED : July 23, 2002
INVENTOR(S) : Yasunori Yamamoto et al.

It is certified that error appears in the above-identified patent and that said Letters Patent is hereby corrected as shown below:

The title page should be deleted to be replaced with the attached title page.

The drawings sheet consisting of Fig. 1 should be added as shown on the attached page.

Column 1,
Line 28, please delete "16", and insert therefor -- 103 --.

Column 3,
Line 22, after "1", please insert -- -- (space).

Column 14,
Lines 33 and 37, please delete "parts", and insert therefor -- circuits --.
Line 39, please delete "circuit", and insert therefor -- device --.
Line 41, please delete "parts", and insert therefor -- circuits --.
Line 41, please delete "circuit" and insert therefor -- device --.
Lines 43 and 47, please delete "parts", and insert therefor -- circuits --.

Column 16,
Line 61, please delete "film", and insert therefor -- semiconductor --.

Column 21,
Lines 12 and 31, please delete "3", and insert therefor -- 3A --.
Line 44, please delete "19", and insert therefor -- 17 --.

Column 22,
Line 5, please delete "1", and insert therefor -- Il --.

Column 23,
Lines 10 and 56, please delete "19", and insert therefor -- 17 --.

UNITED STATES PATENT AND TRADEMARK OFFICE
CERTIFICATE OF CORRECTION

PATENT NO. : 6,424,131 B1
DATED : July 23, 2002
INVENTOR(S) : Yasunori Yamamoto et al.

It is certified that error appears in the above-identified patent and that said Letters Patent is hereby corrected as shown below:

Column 24,
Line 2, please delete "19", and insert therefor -- 17 --.
Lines 60 and 63, please delete "pairs", and insert therefor -- groups --.

Column 25,
Line 3, please delete "film", and insert therefor -- semiconductor --.

Column 27,
Line 8, please delete "19", and insert therefor -- 17 --.

Column 30,
Line 24, please delete "18b", and insert therefor -- 18a --.
Line 25, please delete "1a", and insert therefor -- 2a --.

Column 31,
Lines 25 and 29, please delete "pairs", and insert therefor -- groups --.

Column 34,
Line 31, please delete "switch control circuit", and insert therefor -- current ratio compensator --.
Lines 50-51, please delete "the composite of".

Column 38,
Line 7, please delete "pairs", and insert therefor -- groups --.
Line 5, please delete "pairs", and insert therefor -- groups --.

UNITED STATES PATENT AND TRADEMARK OFFICE
CERTIFICATE OF CORRECTION

PATENT NO. : 6,424,131 B1
DATED : July 23, 2002
INVENTOR(S) : Yasunori Yamamoto et al.

It is certified that error appears in the above-identified patent and that said Letters Patent is hereby corrected as shown below:

<u>Column 43,</u>
Line 37, after "," (comma), please insert therefor -- the first terminals of said first, said third, said fifth and said seventh branches are connected to a first power-source-connecting terminal at a --.

This certificate supersedes Certificate of Correction issued April 22, 2003.

Signed and Sealed this

Second Day of March, 2004

JON W. DUDAS
*Acting Director of the United States Patent and Trademark Office*

(12) United States Patent
Yamamoto et al.

(10) Patent No.: US 6,424,131 B1
(45) Date of Patent: Jul. 23, 2002

(54) OUTPUT CONTROLLER

(75) Inventors: Yasunori Yamamoto, Hirakata; Shinji Tanaka, Ibaraki; Minoru Miyake, Kyoto, all of (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/762,890

(22) PCT Filed: Jun. 15, 2000

(86) PCT No.: PCT/JP00/03931
§ 371 (c)(1),
(2), (4) Date: Feb. 13, 2001

(87) PCT Pub. No.: WO00/79682
PCT Pub. Date: Dec. 28, 2000

(30) Foreign Application Priority Data

Jun. 18, 1999 (JP) .......................................... 11-172071

(51) Int. Cl.[7] .................................................. G05F 1/40
(52) U.S. Cl. ...................................... 323/282; 323/316
(58) Field of Search ................................. 323/282, 284, 323/351, 285, 273, 312, 316, 277; 327/538, 540

(56) References Cited

U.S. PATENT DOCUMENTS

| | | | | |
|---|---|---|---|---|
| 4,327,320 A | * | 4/1982 | Oguey et al. | ............... 323/313 |
| 5,077,595 A | | 12/1991 | Fukunaga | |
| 5,296,735 A | | 3/1994 | Fukunaga | |
| 5,532,918 A | * | 7/1996 | Mayrand et al. | ............. 363/89 |
| 5,550,462 A | * | 8/1996 | Nakajima | ................. 323/277 |
| 5,786,970 A | * | 7/1998 | Nao et al. | ................... 361/18 |
| 5,831,471 A | * | 11/1998 | Nakajima et al. | ........... 327/540 |
| 5,894,236 A | * | 4/1999 | Mizoguchi et al. | ......... 327/108 |

FOREIGN PATENT DOCUMENTS

| | | |
|---|---|---|
| JP | 01227520 | 9/1989 |
| JP | 03262209 | 11/1991 |
| JP | 04134271 | 5/1992 |
| JP | 04211200 | 8/1992 |
| JP | 05291918 | 11/1993 |
| JP | 08111524 | 4/1996 |

OTHER PUBLICATIONS

WO 96/12346, A Protected Switch, Published Apr. 1996.

\* cited by examiner

*Primary Examiner*—Adolf Deneke Berhane
(74) *Attorney, Agent, or Firm*—Pearne & Gordon LLP

(57) ABSTRACT

The object of the present invention is, in a power control device including an auxiliary circuit that is connected in parallel to an output circuit and controls an adjusting current smaller by a substantially constant ratio than an output current, to control the ratio of the output current to the adjusting current at a constant level by controlling the output circuit and the auxiliary circuit so that the potentials of the corresponding terminals agree with each other. As a means for attaining the object, the power control device comprises a bridge of four branches including an output circuit, an auxiliary circuit, a load, and either of a current detector or a current setting circuit. The power control device detects the potential difference between the terminals of the output circuit and the corresponding terminals of the auxiliary circuit and feeds back the potential difference to one of the four branches of the bridge and changes the equivalent impedance of the branch, thereby controlling the bridge to keep the balance.

22 Claims, 27 Drawing Sheets